US012811364B2

(12) United States Patent
Hasman et al.

(10) Patent No.: US 12,811,364 B2
(45) Date of Patent: Nov. 24, 2026

(54) METHOD AND SYSTEM FOR GENERATING COHERENT LIGHT HAVING TWO SPIN MODES

(71) Applicant: Technion Research & Development Foundation Limited, Haifa (IL)

(72) Inventors: Erez Hasman, Haifa (IL); Kexiu Rong, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 663 days.

(21) Appl. No.: 18/226,894

(22) Filed: Jul. 27, 2023

(65) Prior Publication Data

US 2024/0039246 A1 Feb. 1, 2024

Related U.S. Application Data

(60) Provisional application No. 63/392,531, filed on Jul. 27, 2022.

(51) Int. Cl.

| | |
|---|---|
| ***H01S 5/11*** | (2021.01) |
| ***H01S 5/10*** | (2021.01) |
| ***H01S 5/18*** | (2021.01) |
| ***H01S 5/185*** | (2021.01) |
| ***H01S 5/30*** | (2006.01) |

(52) U.S. Cl.
CPC .............. *H01S 5/11* (2021.01); *H01S 5/1042* (2013.01); *H01S 5/185* (2021.01); *H01S 5/30* (2013.01); *H01S 5/18* (2013.01)

(58) Field of Classification Search
CPC . H01S 5/1042; H01S 5/11; H01S 5/18; H01S 5/185; H01S 5/30
See application file for complete search history.

(56) References Cited

U.S. PATENT DOCUMENTS

| | | | | |
|---|---|---|---|---|
| 2008/0219307 | A1* | 9/2008 | Birkedal | H01S 5/183 372/44.01 |
| 2018/0026422 | A1* | 1/2018 | Cronin | C01G 39/06 252/510 |
| 2018/0358779 | A1* | 12/2018 | Hwang | H01S 5/0206 |
| 2019/0013648 | A1* | 1/2019 | Heo | H01S 5/0424 |
| 2019/0229498 | A1* | 7/2019 | Gwo | F02M 35/104 |
| 2020/0303890 | A1* | 9/2020 | Kim | H01S 5/4062 |
| 2022/0236262 | A1* | 7/2022 | Kim | G01N 21/4788 |
| 2025/0007246 | A1* | 1/2025 | Kreiner | H01S 5/18394 |

OTHER PUBLICATIONS

Berry "Quantal Phase Factors Accompanying Adiabatic Changes", Proceedings of the Royal Society of London A: Mathematical, Physical and Engineering Sciences, 392(1802): 45-57, Mar. 8, 1984.

(Continued)

*Primary Examiner* — James A Menefee

(57) ABSTRACT

A surface-emitting light source system for generating coherent light having two spin modes comprises a two-dimensional material exhibiting a direct band gap. The two-dimensional material is coupled to a planar heterostructure cavity having an inversion asymmetric core region at least partially surrounded by an inversion symmetric cladding region.

19 Claims, 33 Drawing Sheets
(29 of 33 Drawing Sheet(s) Filed in Color)

(56) References Cited

OTHER PUBLICATIONS

Bomzon et al. "Space-Variant Pancharatnam-Berry Phase Optical Elements With Computer-Generated Subwavelength Gratings", Optical Letters, 27(13): 1141-1143, Jul. 1, 2002.
Chen et al. "Valley-Contrasting Physics in All-Dielectric Photonic Crystals: Orbital Angular Momentum and Topological Propagation", Physical Review B, 96(2): 020202-1-020202-5, Jul. 26, 2017.
Cohen et al. "Growth-Etch Metal-Organic Chemical Vapor Deposition Approach of WS2 Atomic Layers", ACS Nano, 15(1): 526-538, Published Online Dec. 24, 2020.
Dahan et al. "Geometric Doppler Effect: Spin-Split Dispersion of Thermal Radiation", Physical Review Letters, 105(13): 136402-1-136402-5, Published Online Sep. 21, 2010.
Fan et al. "Analysis of Guided Resonances in Photonic Crystal Slabs", Physical Review B, 65(23): 235112-1-235112-8, Jun. 7, 2002.
Frischwasser et al. "Rashba-Like Spin Degeneracy Breaking in Coupled Thermal Antenna Lattices", Optics Express, 19(23): 23475-23482, Nov. 7, 2011.
Ge et al. "Laterally Confined Photonic Crystal Surface Emitting Laser Incorporating Monolayer Tungsten Disulfide", NPJ 2D Materials and Applications, 3: 16-1-16-5, Published Online Apr. 15, 2019.
Gong et al. "Nanoscale Chiral Valley-Photon Interface Through Optical Spin-Orbit Coupling", Science, 359(6374): 443-447, Jan. 26, 2018.
Gorodetski et al. "Plasmonic Aharonov-Bohm Effect: Optical Spin as the Magnetic Flux Parameter", Physical Review B, 82(12): 125433-1-125433-4, Sep. 17, 2010.
Ishikaza et al. "Giant Rashba-Type Spin Splitting in Bulk BiTeI", Nature Materials, 10(7): 521-526, Jun. 19, 2011.
Jha et al. "Spontaneous Exciton Valley Coherence in Transition Metal Dichalcogenide Monolayers Interfaced With an Anisotropic Metasurface", Physical Review Letters, 121(11): 116102-1-116102-7, Sep. 14, 2018.
Kodigala et al. "Lasing Action From Photonic Bound States in Continuum", Nature, 541(7636): 196-199, Jan. 11, 2017.
Koshelev et al. "Asymmetric Metasurfaces With High-Q Resonances Governed by Bound States in the Continuum", Physical Review Letters, 121(19): 193903-1-193903-6, Nov. 9, 2018.
Lindemann et al. "Ultrafast Spin-Lasers", Nature, 568(7751): 212-215, Published Online Apr. 3, 2019.
Liu et al. "Circularly Polarized States Spawning From Bound States in the Continuum", Physical Review Letters, 123(11): 116104-1-116104-6, Sep. 13, 2019.
Liu et al. "Room Temperature Nanocavity Laser With Interlayer Excitons in 2D Heterostructures", Science Advances, 5(4): eaav4506-1-eaav4506-6, Apr. 26, 2019.
Lohof et al. "Prospects and Limitations of Transition Metal Dichalcogenide Laser Gain Materials", Nano Letters, 19(1): 210-217, Published Online Dec. 13, 2018.
Ma et al. "All-Si Valley-Hall Photonic Topological Insulator", New Journal of Physics, 18(2): 025012-1-025012-9, Feb. 10, 2016.
Martin-Regalado et al. "Polarization Properties of Vertical-Cavity Surface-Emitting Lasers", IEEE Journal of Quantum Electronics, 33(5): 765-783, May 1997.
Ning "What Is Laser Threshold?", IEEE Journal of Selected Topics in Quantum Electronics, 19(4): 1503604-1-1503604-4, Published Online May 13, 2013.
Noguchi et al. "Direct Mapping of Spin and Orbital Entangled Wave Functions Under Interband Spin-Orbit Coupling of Giant Rashba Spin-Split Surface States", Physical Review B, 95(4): 041111-1-041111-6, Published Online Jan. 15, 2017.
Paik et al. "Interlayer Exciton Laser of Extended Spatial Coherence in Atomically Thin Heterostructures", Nature, 576(7785): 80-84, Published Online Nov. 25, 2019.
Rong et al. "Photonic Rashba Effect From Quantum Emitters Mediated by a Berry—Phase Defective Photonic Crystal", Nature Nanotechnology, 15(11): 927-933, Published Online Aug. 24, 2020.
Schweika et al. "Approaching the Ground State of the Kagomé Antiferromagnet", Physical Review Letters, 98(6): 067201-1-067201-4, Published Online Feb. 7, 2007.
Shitrit et al. "Spin-Optical Metamaterial Route to Spin-Controlled Photonics", Science, 340(6133): 724-726, May 10, 2013.
Stav et al. "Quantum Entanglement of the Spin and Orbital Angular Momentum of Photons Using Metamaterials", Science, 361(6407): 1101-1104, Sep. 14, 2018.
Sun et al. "Separation of Valley Excitons in a MoS2 Monolayer Using a Subwavelength Asymmetric Groove Array", Nature Photonics, 13(3): 180-184, Feb. 11, 2019.
Tokman et al. "Valley Entanglement of Excitons in Monolayers of Transition-Metal Dichalcogenides", Physical Review B, 92(7): 075409-1-075409-11, Aug. 7, 2015.
Wu et al. "Monolayer Semiconductor Nanocavity Lasers With Ultralow Thresholds", Nature, 520(7545): 69-72, Published Online Mar. 16, 2015.
Xiao et al. "Coupled Spin and Valley Physics in Monolayers of MoS2 and Other Group-VI Dichalcogenides", Physical Review Letters, 108(19): 196802-1-196802-5, Published Onlinc May 7, 2012.
Ye et al. "Monolayer Excitonic Laser", Nature Photonics, 9(11): 733-737, Oct. 19, 2015.
Yin et al. "Observation of Topologically Enabled Unidirectional Guided Resonances", Nature, 580(7804): 467-471, Published Online Apr. 22, 2020.
Zambon et al. "Optically Controlling the Emission Chirality of Microlasers", Nature Photonics, 13(4): 283-288, Mar. 2019.
Zhen et al. "Topological Nature of Optical Bound States in the Continuum", Physical Review Letters, 113(25): 257401-1-257401-6, Published Online Dec. 18, 2014.

* cited by examiner

FIG. 7D
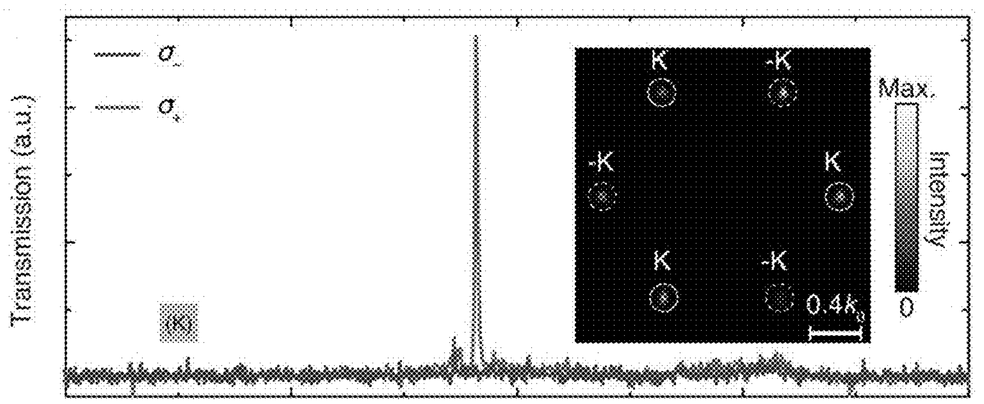
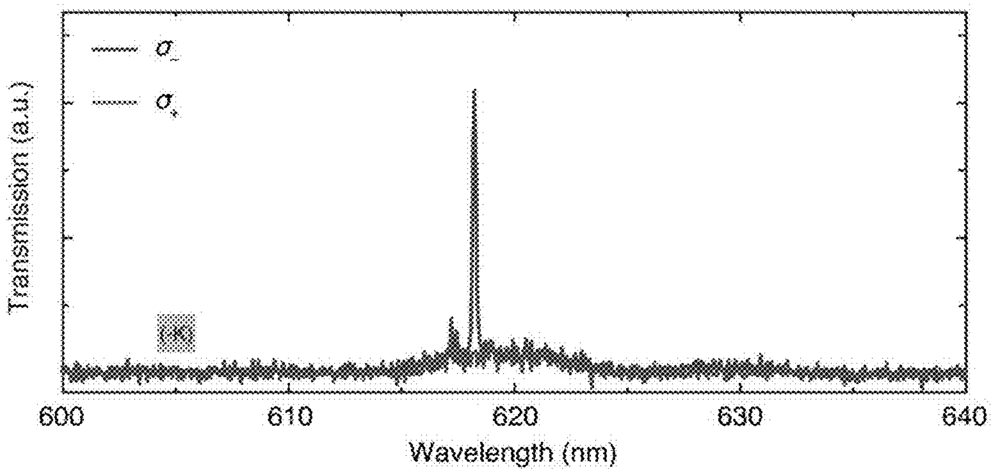
FIG. 7E

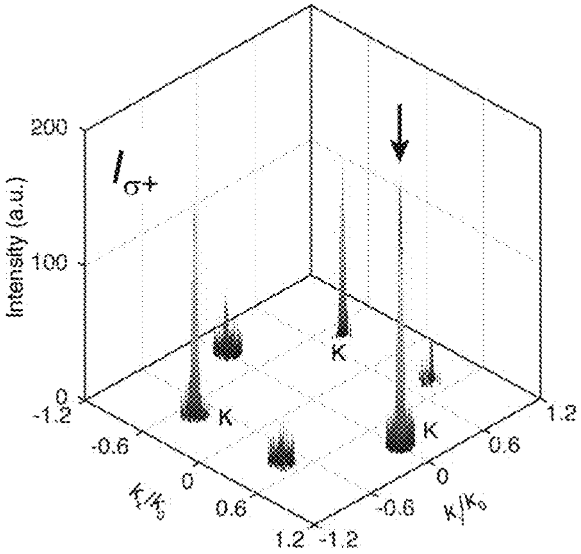
FIG. 8A
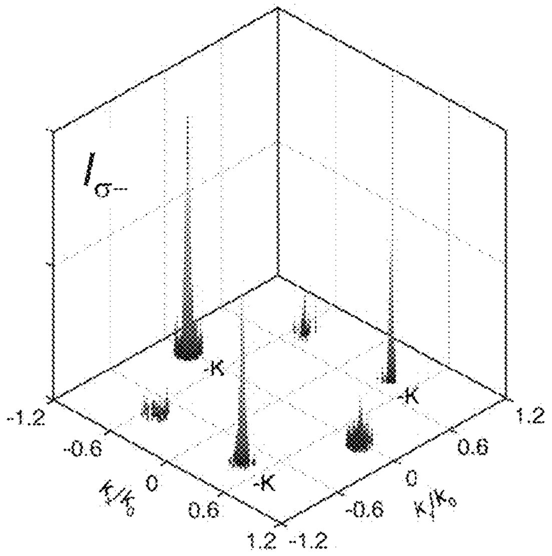
FIG. 8B
FIG. 8C
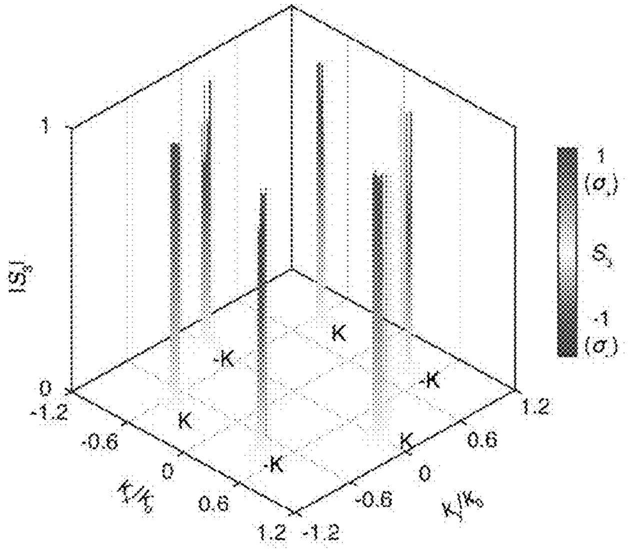

FIG. 15A
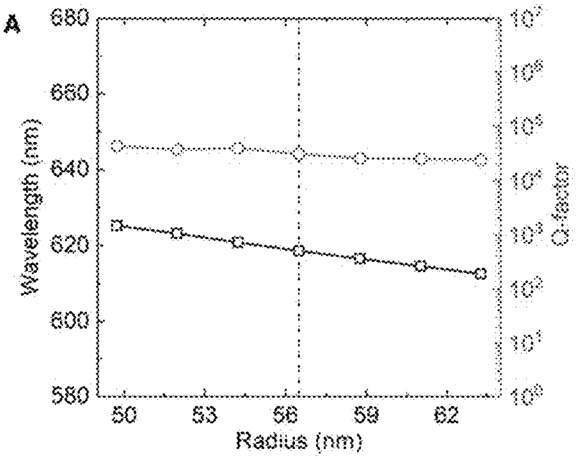
FIG. 15B
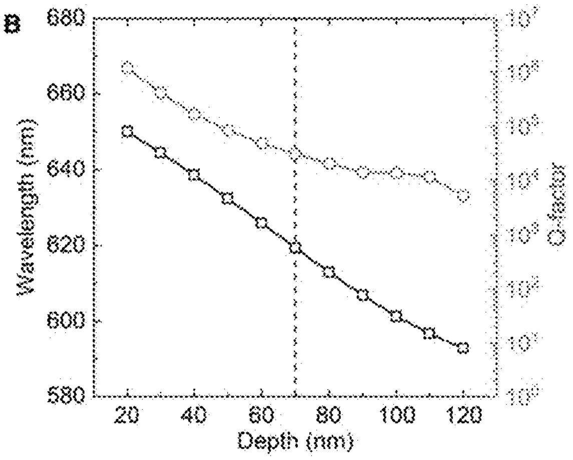
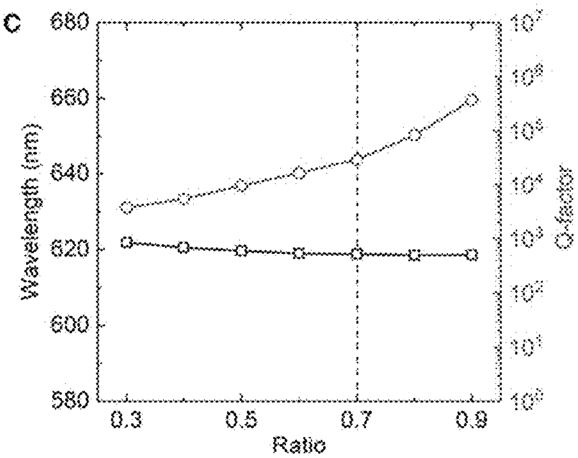
FIG. 15C
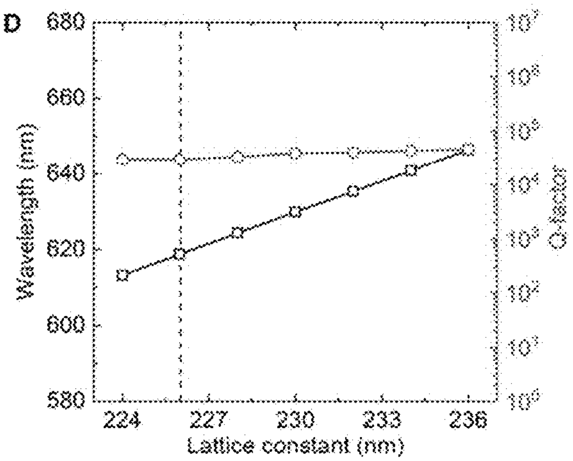
FIG. 15D

METHOD AND SYSTEM FOR GENERATING COHERENT LIGHT HAVING TWO SPIN MODES

RELATED APPLICATION(S)

This application claims the benefit of priority under 35 USC § 119(e) of U.S. Provisional Patent Application No. 63/392,531 filed on Jul. 27, 2022, the contents of which are all incorporated by reference as if fully set forth herein in their entirety.

FIELD AND BACKGROUND OF THE INVENTION

The present invention, in some embodiments thereof, relates to light sources and, more particularly, but not exclusively, to a method and system for generating coherent light having two spin modes.

Light sources are indispensable components of optical systems. Thus far, various light sources of distinct statistical properties, such as super-Poissonian thermal sources, Poissonian laser sources, and sub-Poissonian quantum sources, have been investigated to cover extensive applications from classical to quantum realms.

The Rashba effect is an effect in which electronic spin bands in a crystal are split in a momentum-dependent manner, due to spin-orbit interaction and asymmetry of the crystal potential. The Rashba effect has been demonstrated and utilized in electronic systems, such as magnetic memory devices, spin transistors, and magnetoresistive elements. The photonic Rashba effect is manifested as a spin-split dispersion in momentum space. The photonic Rashba effect has been demonstrated in inversion asymmetric metamaterials (1) and in heated grating structures (11).

Additional background art includes Gong, et al., Science 359, 443-447 (2018), Sun et al., Separation of valley excitons in a MoS2 monolayer using a subwavelength asymmetric groove array. Nat. Photonics 13, 180-184 (2019), and Rong, et al. Nat. Nanotechnol. 15, 927-933 (2020).

SUMMARY OF THE INVENTION

According to some embodiments of the invention the present invention there is provided a surface-emitting light source system for generating coherent light having two spin modes. The system comprises a two-dimensional material exhibiting a direct band gap, and being coupled to a planar heterostructure cavity having an inversion asymmetric core region at least partially surrounded by an inversion symmetric cladding region.

According to some embodiments of the invention the two-dimensional material is coupled to both the core and the cladding regions According to some embodiments of the invention the core region and the cladding region have identical atomic lattice structure, wherein at least the one of the regions (e.g., the core region) comprises structural elements arranged to induce a respective symmetry property (e.g., to induce inversion symmetry breaking in the core region).

According to some embodiments of the invention the inversion asymmetric core region comprises anisotropic nanoholes serving as the structural elements, and wherein an orientation of the nanoholes is selected to induce inversion symmetry breaking in the core region.

According to some embodiments of the invention the inversion asymmetric core region comprises anisotropic nanoholes, and wherein an orientation of the nanoholes is selected to induce inversion symmetry breaking in the core region.

According to some embodiments of the invention the heterostructure cavity has a shape of a polygon.

According to some embodiments of the invention a largest side of the polygon has a length of from about 1 micron to about 100 microns.

According to some embodiments of the invention the polygon is an equiangular polygon.

According to some embodiments of the invention a thickness of the heterostructure cavity is from about 10 to about 1000 nm.

According to some embodiments of the invention the heterostructure cavity is made of a material exhibiting symmetry-protected photonic bound states in the continuum.

According to some embodiments of the invention the heterostructure cavity comprises silicon nitride.

According to some embodiments of the invention the heterostructure cavity has a Kagome lattice.

According to some embodiments of the invention the two-dimensional material is a monolayer of a transition metal dichalcogenide (TMD).

According to some embodiments of the invention the TMD comprises at least one of molybdenum disulfide, tungsten disulfide, molybdenum diselenide, tungsten diselenide, and molybdenum ditelluride.

According to an aspect of some embodiments of the present invention there is provided a communication system which comprises the coherent light generating system as delineated above and optionally and preferably as further detailed below.

According to an aspect of some embodiments of the present invention there is provided a quantum teleportation system which comprises the coherent light generating system as delineated above and optionally and preferably as further detailed below.

According to an aspect of some embodiments of the present invention there is provided a quantum cryptography system which comprises the coherent light generating system as delineated above and optionally and preferably as further detailed below.

According to an aspect of some embodiments of the present invention there is provided a quantum computer which comprises the coherent light generating system as delineated above and optionally and preferably as further detailed below.

According to an aspect of some embodiments of the present invention there is provided a material inspection system which comprises the coherent light generating system as delineated above and optionally and preferably as further detailed below. For example, the material inspection system can use a specific spin mode of the generated coherent light to determine a chirality of a substance.

According to an aspect of some embodiments of the present invention there is provided a method of generating coherent light having two spin modes. The method comprises directing a pump optical beam to the system as delineated above and optionally and preferably as further detailed below. The pump optical beam has a central wavelength within an absorption spectrum of the two-dimensional material, there by generating the coherent light.

According to some embodiments of the invention the method comprises filtering out one of the spin modes.

According to some embodiments of the invention the method comprises polarizing the pump optical beam prior to the directing.

According to an aspect of some embodiments of the present invention there is provided a method suitable of fabricating a surface-emitting light source system. The method comprises growing a cavity material on a substrate; forming a cladding region and a core region in the grown cavity material; and applying a two-dimensional material to the cavity material.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a schematic illustration showing a side view of a surface-emitting light source system for generating coherent light having two spin modes, according to some embodiments of the present invention.

FIG. 2 is a schematic illustration showing a top view of a planar heterostructure cavity, according to some embodiments of the present invention.

FIG. 3 is a flowchart diagram of a method suitable for generating coherent light having two spin modes according to some embodiments of the present invention.

FIG. 4 is a flowchart diagram of a method suitable for fabricating a system for generating coherent light having two spin modes, according to some embodiments of the present invention.

Figure 5A:
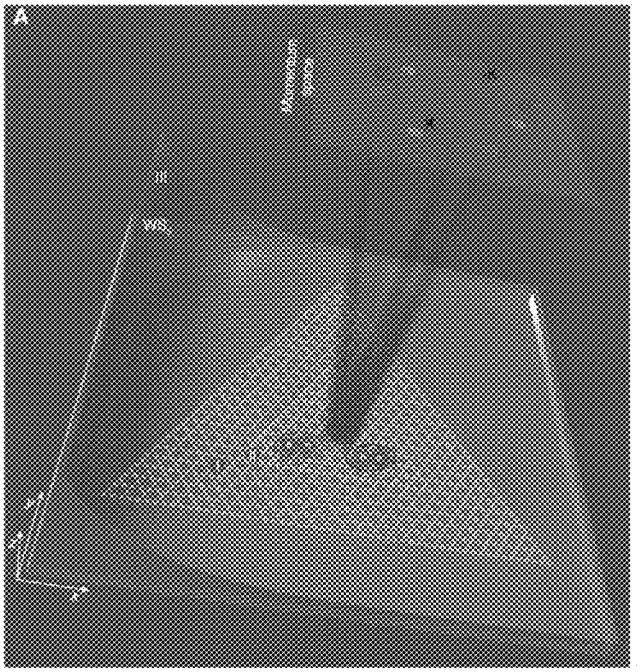
Figure 5B:
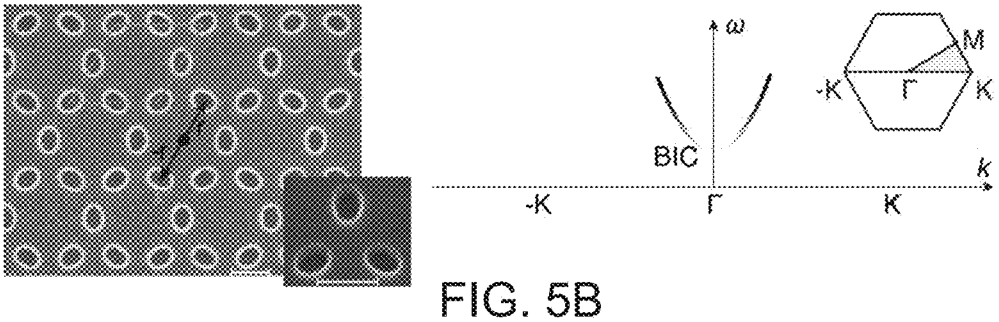
Figure 5C:
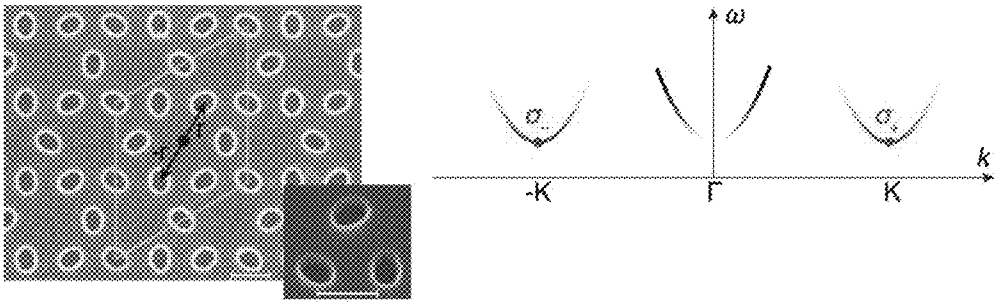
Figure 5D:
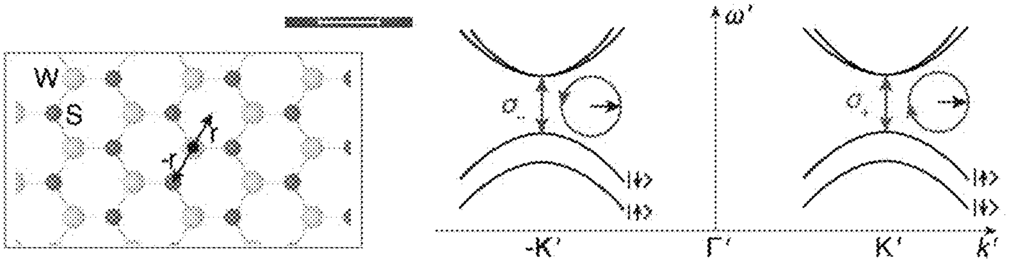
Figure 5E:
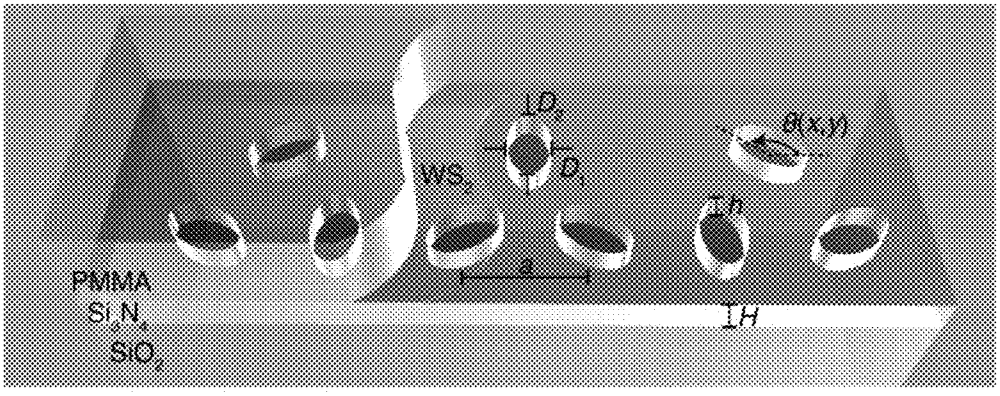

FIGS. 5A-E are schematic illustrations of a spin-valley Rashba monolayer laser, obtained in experiments performed according to some embodiments of the present invention. FIG. 5A shows a schematic architecture of a spin-optical monolayer laser. A heterostructure is constructed by interfacing an IaS (core, orange region II) and an IS (cladding, green region I) Kagome lattice to form the spin-valley microcavity. This microcavity enables a selective lateral confinement of the spin-valley modes inside the core for high-Q spin-valley resonant mode, whereby spin-polarized ±K lasing spots can be achieved from the valley excitons (e-h pairs) in an incorporated $WS_2$ monolayer (colorful region III). FIGS. 5B-D show spin-valley generation in an IaS Kagome lattice and valley-contrasting optical selection rules in a $WS_2$ monolayer. The left panel of FIG. 5B is a top-view SEM image for part of an IS Kagome lattice. Inset shows a tilted-view SEM image of the constituting elliptical nanoholes. The green rhombus represents one unit cell of the lattice, and the two anti-parallel black arrows indicate an inversion transformation ($r \rightarrow -r$). Scale bars are 200 nm. The right panel of FIG. 5B shows a schematic band structure of an IS Kagome lattice. Only the spin-degenerate parabolic band hosting a Γ-BIC is presented. The inset in the right panel of FIG. 5B shows the first Brillouin zone of the IS Kagome lattice labelled with high symmetric points. FIG. 5C shows the corresponding SEM images and schematic band structure after breaking the IS of the Kagome lattice shown in FIG. 5B. Due to the emergent photonic Rashba effect, the spin-degenerate band hosting the Γ-BIC splits into two opposite spin-polarized branches, in which the ±K spin-valley modes are highlighted by red and blue dots, respectively. The left panel of FIG. 5D is a top-view schematic of the atomic structure for a $WS_2$ monolayer. The right panel of FIG. 5D shows schematic electronic band structures and valley-contrasting optical selection rules for ±K' valley excitons, which can be modeled as in-plane right- and left-handed circularly polarized dipole emitters, respectively. FIG. 5E illustrates structural details in one unit cell of the IaS Kagome lattice. The thickness of the $Si_3N_4$ film is H=120 nm. The short axis, major axis, and depth of the elliptical nanoholes are $D_1$=94 nm, $D_2$=135 nm (ratio $e=D_1/D_2=0.7$), and h=70 nm, respectively. The lattice constant is varied from a=226 nm to 234 nm to cover the largest gain region of the $WS_2$ monolayer (a=226 nm unless otherwise stated). The orientation angles θ(x, y) of the nanoholes are implemented according to the q=0 and $\sqrt{3}\times\sqrt{3}$ spin lattice configurations for IS and IaS structures, respectively. The supporting PMMA layer also serves as an encapsulation layer and an index-matching layer to the $SiO_2$ substrate.

Figure 6A:
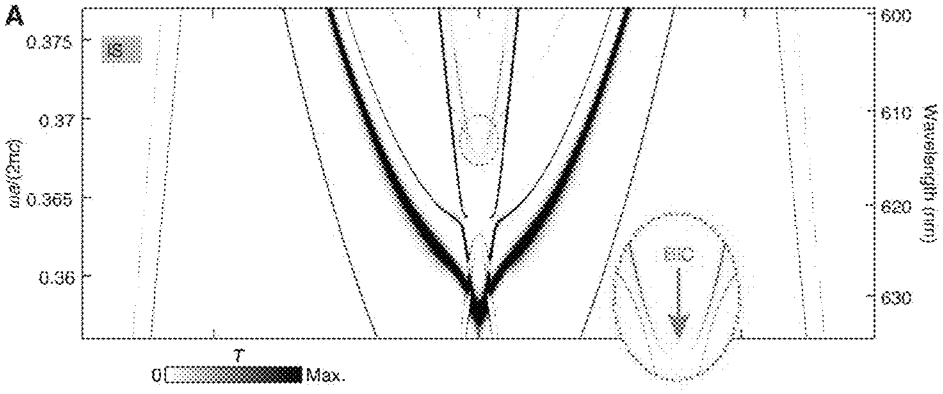
Figure 6B:
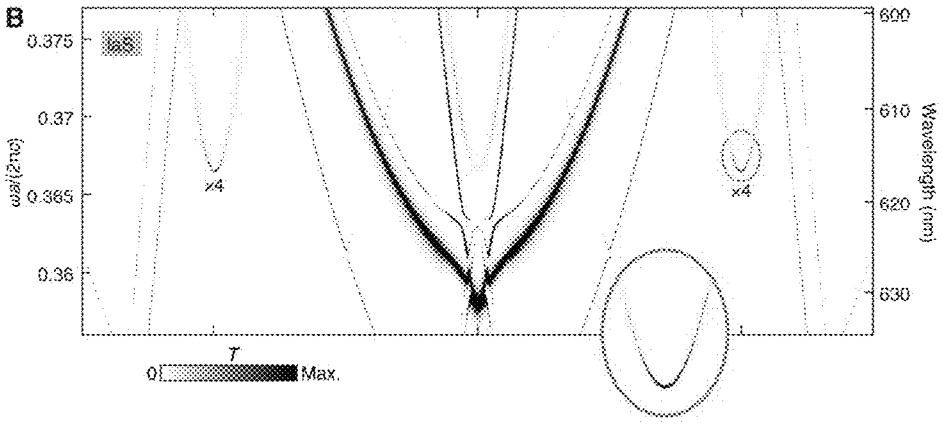
Figure 6C:
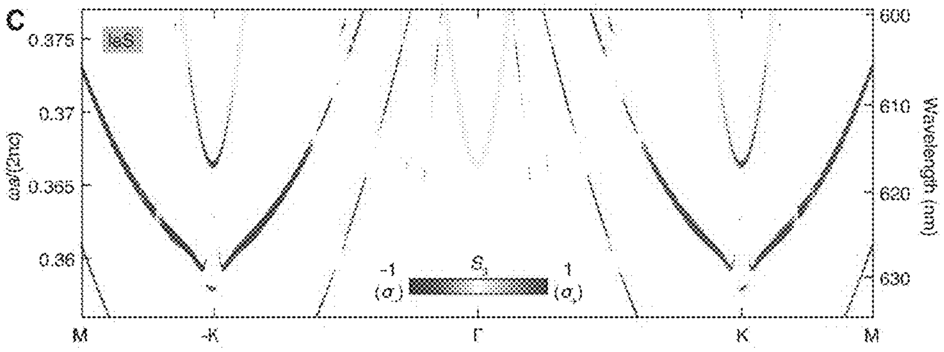
Figure 6D:
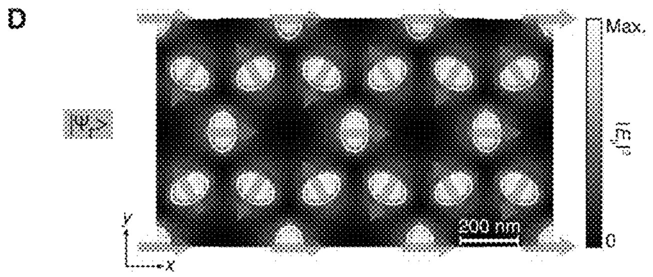
Figure 6E:
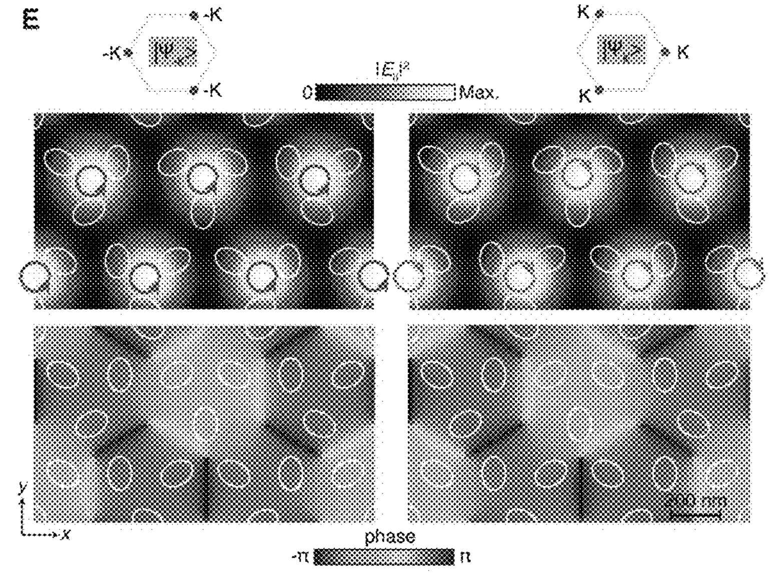
Figure 6F:
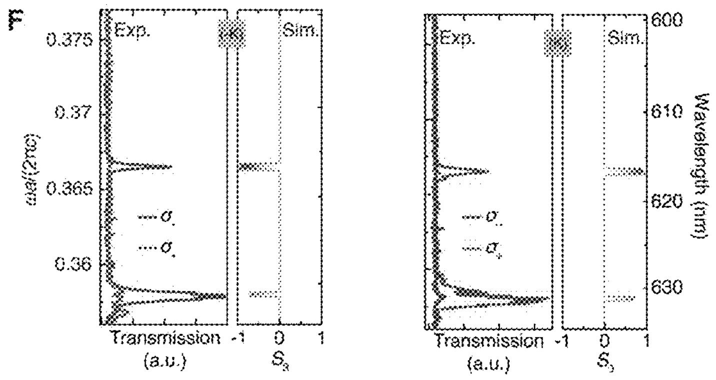

FIGS. 6A-F are schematic illustrations showing the principle of spin-valley generation via a photonic Rashba effect, according to some embodiments of the present invention. In FIGS. 6A-F, ω denotes the angular frequency, c denotes the speed of light in vacuum, and T denotes the calculated transmission of the structure. FIG. 6A shows calculated band structure for a periodic IS Kagome lattice. An orange curve is overlaid to highlight the parabolic band hosting a Γ-BIC, which is further zoomed-in for details (see the two cyan dashed regions). FIG. 6B shows calculated band structure for a periodic IaS Kagome lattice. Three orange curves are overlaid to highlight those parabolic bands hosting $|\Psi_\Gamma\rangle$, $|\Psi_{-K}\rangle$, and $|\Psi_K\rangle$, the last of which is further zoomed-in for details (see the two cyan solid regions). FIG. 6C shows calculated spin-polarized band structure for the IaS Kagome lattice shown in FIG. 6B. Due to the emergent SOI under IS breaking, the highlighted spin-degenerate parabolic band centered at Γ point splits into two opposite spin-polarized parabolic branches centered at ±K points, manifested as a photonic Rashba effect. FIG. 6D shows simulated real-space intensity distribution of in-plane electric field for $|\Psi_\Gamma\rangle$ in the periodic IS and IaS Kagome lattices. The white ellipses indicate contours of the nanoholes, and the cyan arrows indicate the major electric field vectors inside the nanoholes. FIG. 6E shows momentum-space spin distribution (top), real-space intensity distribution (middle), and real-space phase distribution (bottom) of in-plane electric field for $|\Psi_{-K}\rangle$ (left) and $|\Psi_K\rangle$ (right) in the periodic IaS Kagome lattice. Real-space spin distribution (middle) is overlaid above the intensity distribution by counter-clockwise ($\sigma_-$) and clockwise ($\sigma_+$) arrows. Intensity distributions in FIGS. 6D and 6E were extracted from the midplane of the $Si_3N_4$ film. FIG. 6F shows measured spin-resolved transmission spectra at ±K points for the IaS Kagome lattice (left part of each panel). The extracted $S_3$ distributions at ±K points from 6C are also displayed for comparison (right part of each panel).

Figure 7A:
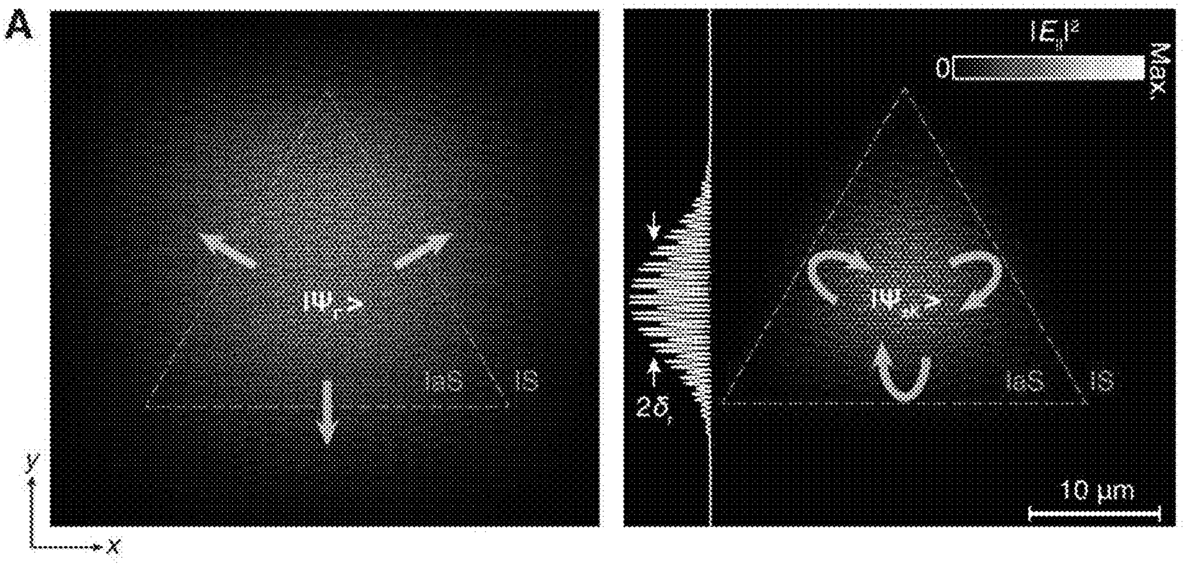
Figure 7B:
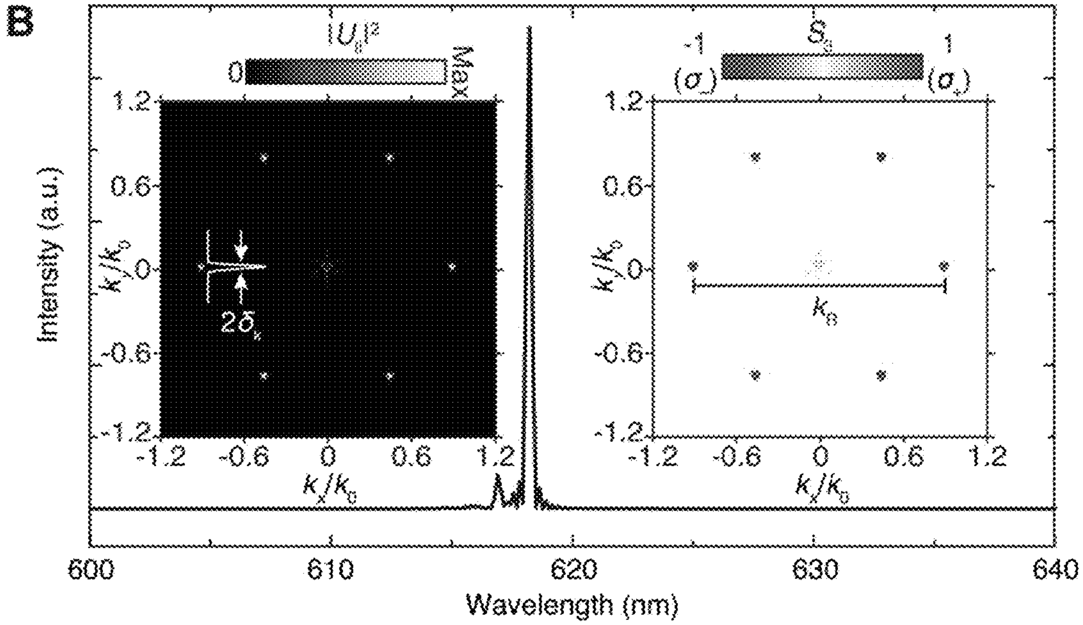
Figure 7C:
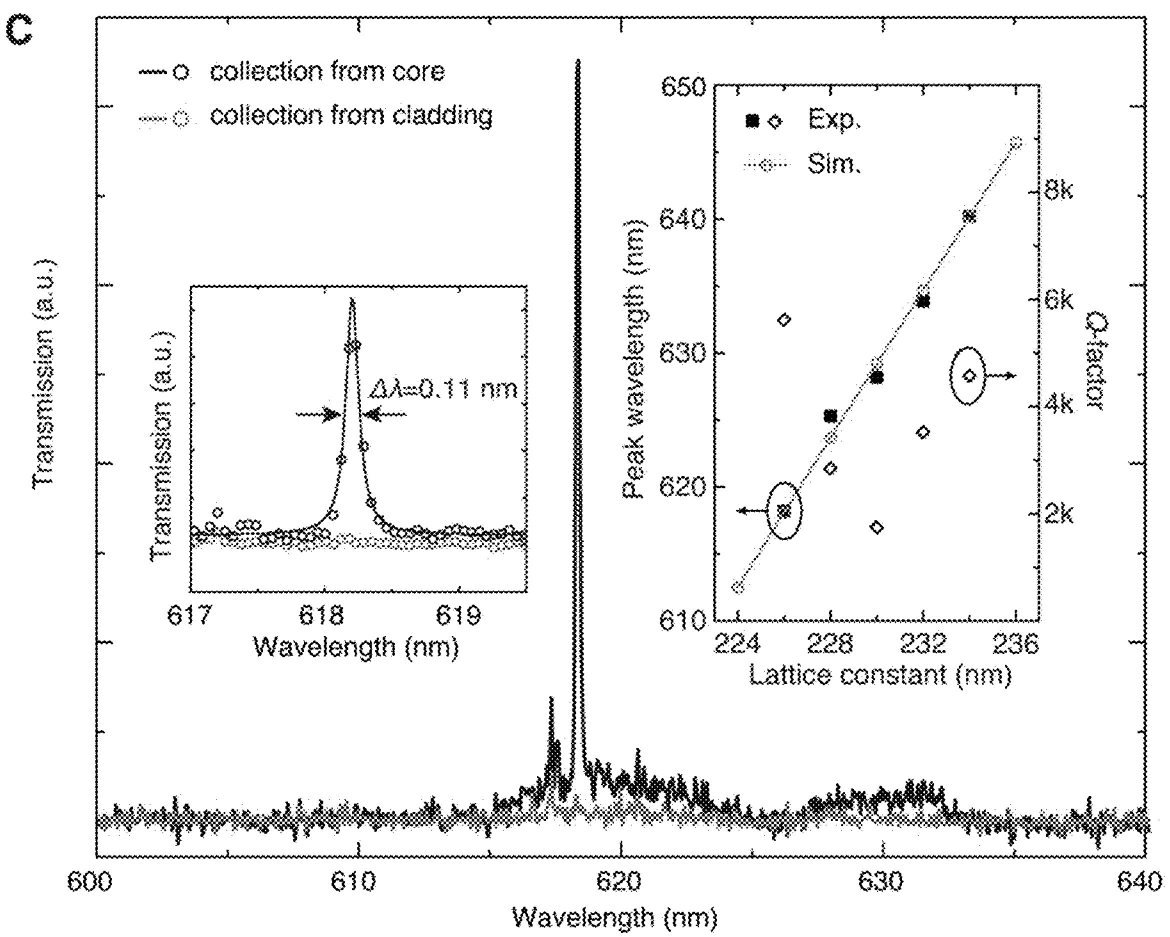

FIGS. 7A-E show spin-valley optical microcavities, in case in which no optical gain is provided by the incorporated monolayer, as obtained in experiments performed according to some embodiments of the present invention. These optical microcavities are referred to below as "cold" optical microcavities. FIG. 7A shows simulated selective lateral mode confinement in a heterostructure microcavity by interfacing an IaS (core) and an IS (cladding) Kagome lattice. $|\Psi_\Gamma\rangle$ undergoes lateral leakage (left), while $|\Psi_{\pm K}\rangle$ are laterally confined in the core for spin-valley resonant modes (right). The inset in FIG. 7A shows an extracted intensity profile (across the cavity center) of the spin-valley resonant mode along the y direction, whose envelope can be fitted by a Gaussian function with a standard deviation $\delta_r$=4.3 μm. The side length of the triangular core is about 27.5 μm, and an optically thick (about 12 μm) cladding is used to avoid light penetration loss. FIG. 7B shows calculated resonant spectrum of the spin-valley microcavity. The insets in FIG. 7B show simulated momentum-space intensity (left) and $S_3$ (right) distributions of in-plane electric field for the spin-valley resonant mode. $k_0$ (=2π/λ) is the free-space wavenumber of the mode (λ=618.2 nm). The white curve shows the intensity profile (across the spot center) of one spot along the $k_y$ direction, which can be fitted by a Gaussian function with a standard deviation $\delta_k$=0.014 $k_0$. A product of the simulated standard deviations for the spin-valley resonant mode in momentum space and in real space satisfies a relationship: $\delta_k \cdot \delta_r$=0.61. FIG. 7C measured cross-polarized transmission spectra from core or cladding of the spin-valley microcavity. The left inset highlights the spectral region around the resonant peak, which is fitted by a Lorentz function with a linewidth Δλ=0.11 nm. The right inset shows the measured peak wavelengths and Q-factors for spin-valley resonant modes in microcavities with different lattice constants, in which the simulated peak wavelengths are also displayed for comparison. FIGS. 7D and 7E shows measured spin-resolved transmission spectra of three filtered K (FIG. 7D) or −K (FIG. 7E) spots from a spin-valley microcavity. The inset in FIG. 7D shows the measured momentum-space intensity distribution of the spin-valley resonant mode, in which home-built filtering pinholes (diameters of ~0.21 $k_0$) for three K or −K spots are indicated by solid and dashed circles, respectively. A high numerical aperture (NA=1.42) oil-immersion objective was used for collection.

Figure 8D:
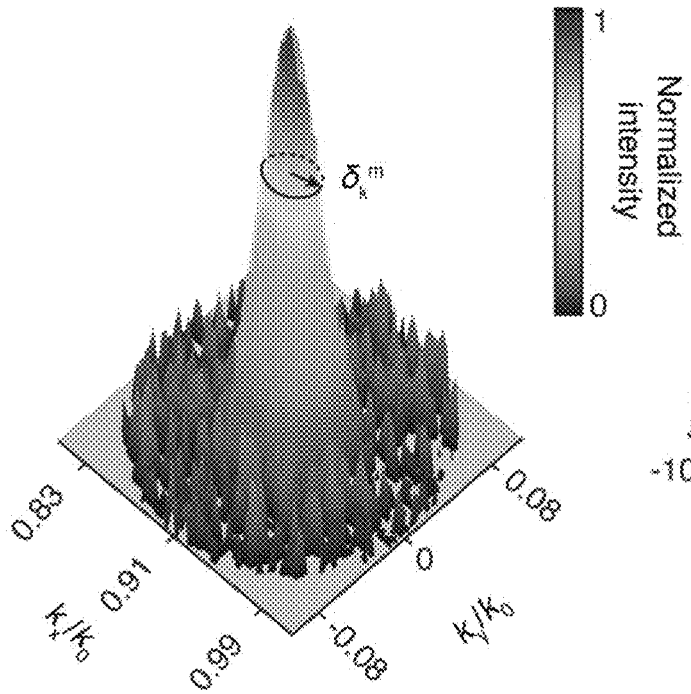
Figure 8E:
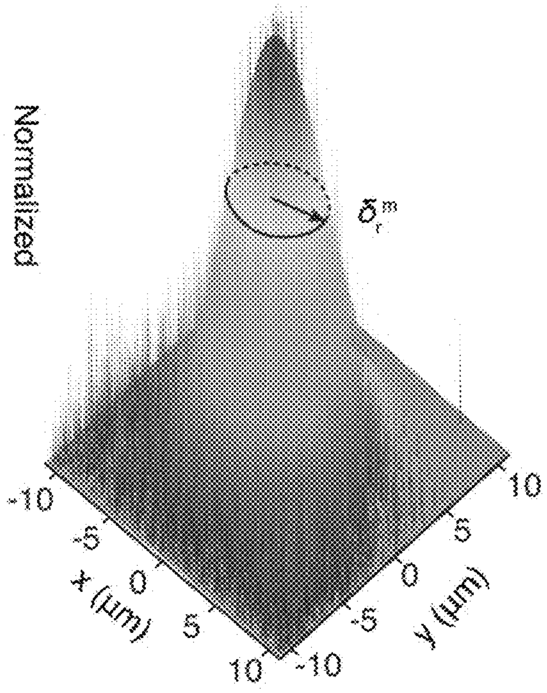

FIGS. 8A-G show characteristics of spin-valley Rashba monolayer lasing, obtained in experiments performed according to some embodiments of the present invention. FIGS. 8A and 8B show measured spin-discriminated emission intensity distributions $I_{\sigma+}$ (FIG. 8A) and $I_{\sigma-}$ (FIG. 8B) in momentum space. A home-built spatial filter with six pinholes (diameters of about 0.21 $k_0$) at ±K points was used to enhance the experimental signal-to-noise ratio. FIG. 8C shows calculated $S_3$ distribution in momentum space based on the measured spin-dependent intensity distributions in FIG. 8A. FIGS. 8D and 8E show measured momentum-space (FIG. 8D) and real-space (FIG. 8E) emission intensity distributions for the spin-valley resonant mode. The momentum-space intensity distribution corresponds to the emission spot indicated by a black arrow in FIG. 8A. The two intensity distributions are fitted with two-dimensional Gaussian functions to obtain the standard deviations in momentum space $$(\delta_k^m = 0.015k0)$$

and in real space $$(\delta_r^m = 3.6\ \mu\text{m}).$$

Figure 8F:
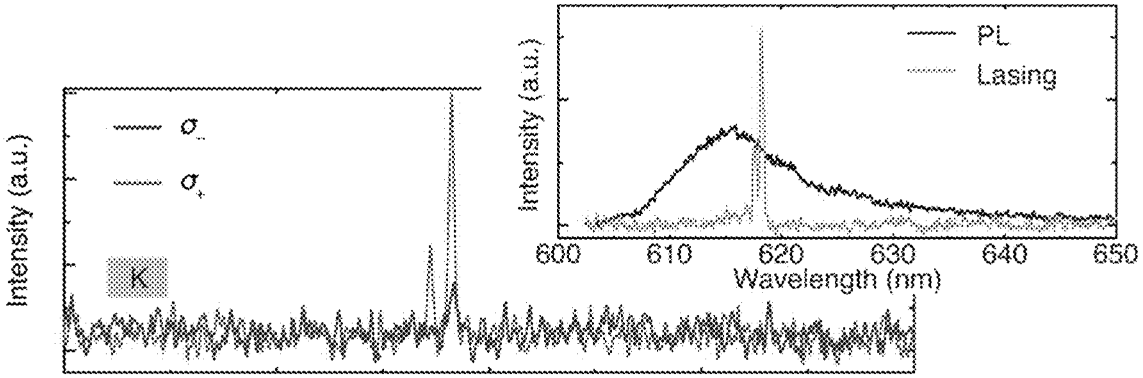
Figure 8G:
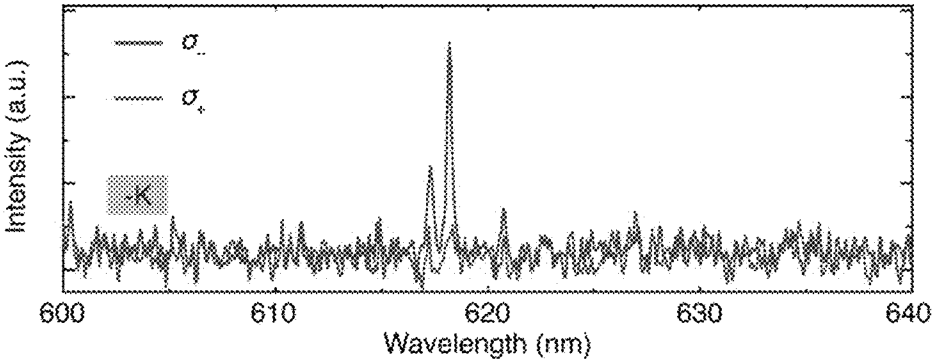

FIGS. 8F and 8G show measured spin-discriminated emission spectra of three filtered K (FIG. 8F) or −K (FIG. 8G) spots. The inset in FIG. 8F shows measured emission spectra of the $WS_2$ monolayer inside (orange) and outside (black) the spin-valley microcavity. The pump fluence for all the measurements in FIGS. 8A-G was P=3.6 kW/cm$^2$ (or pump power of 1000 μW).

Figure 9A:
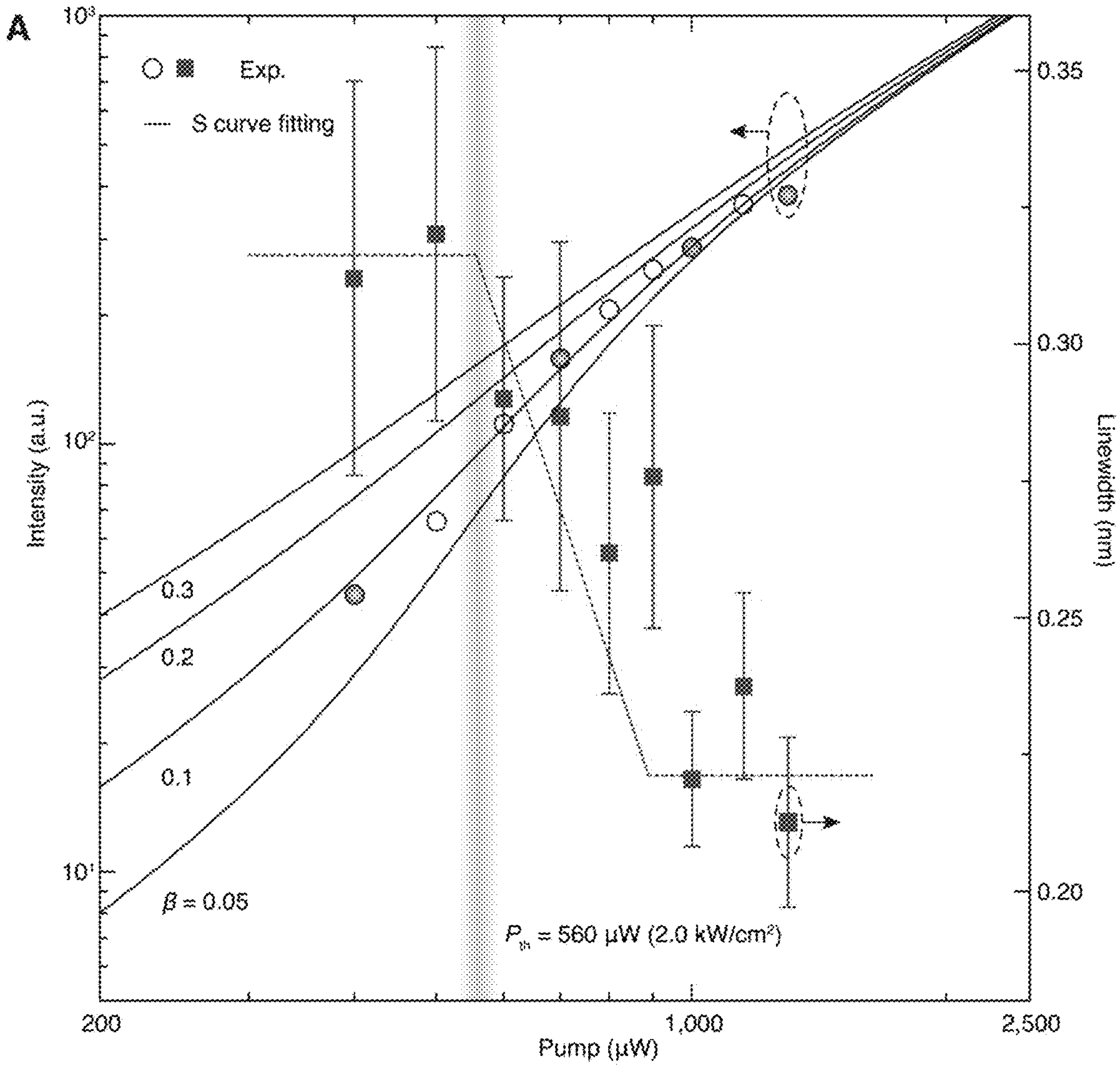
Figure 9B:
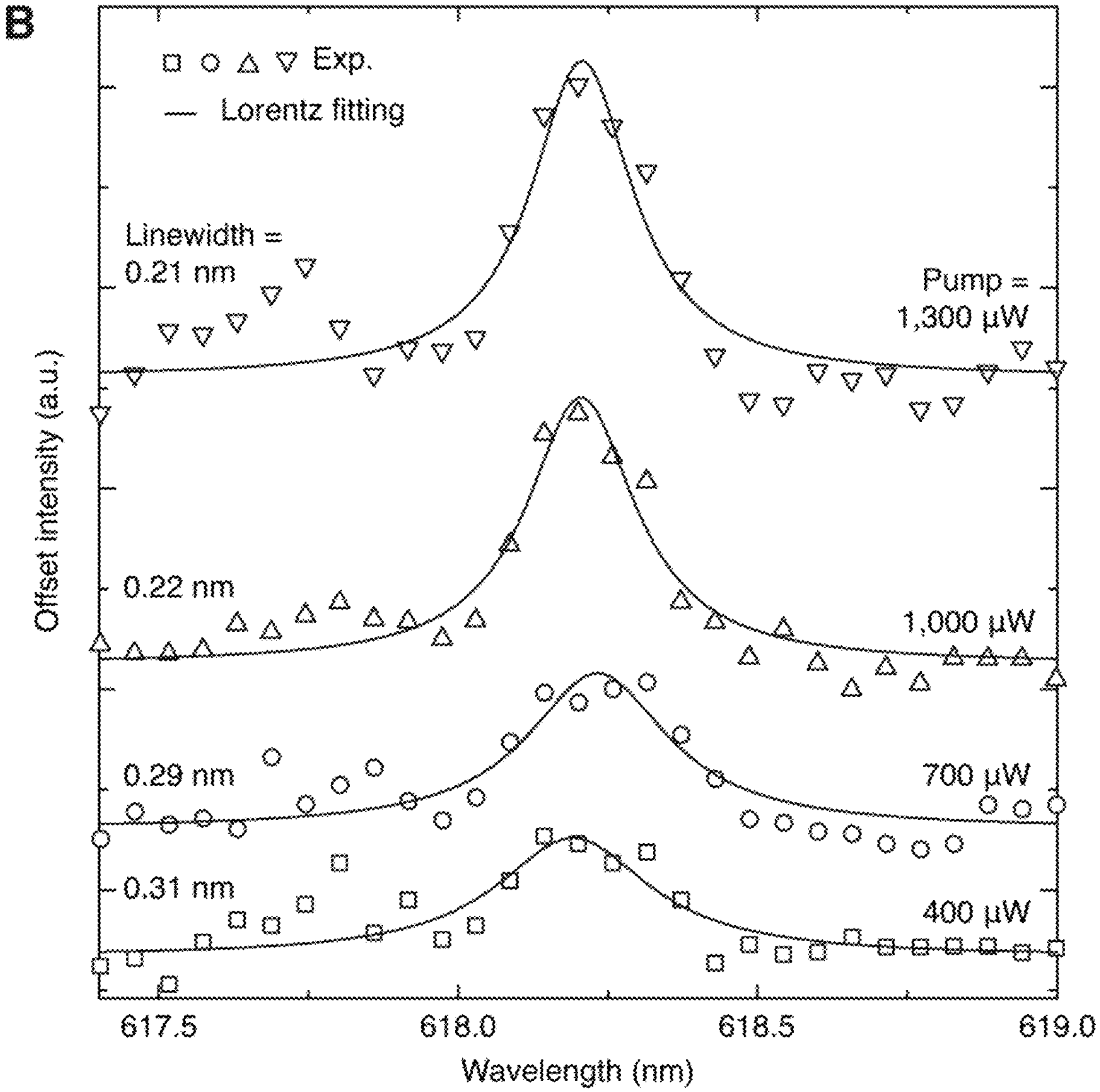
Figure 9C:
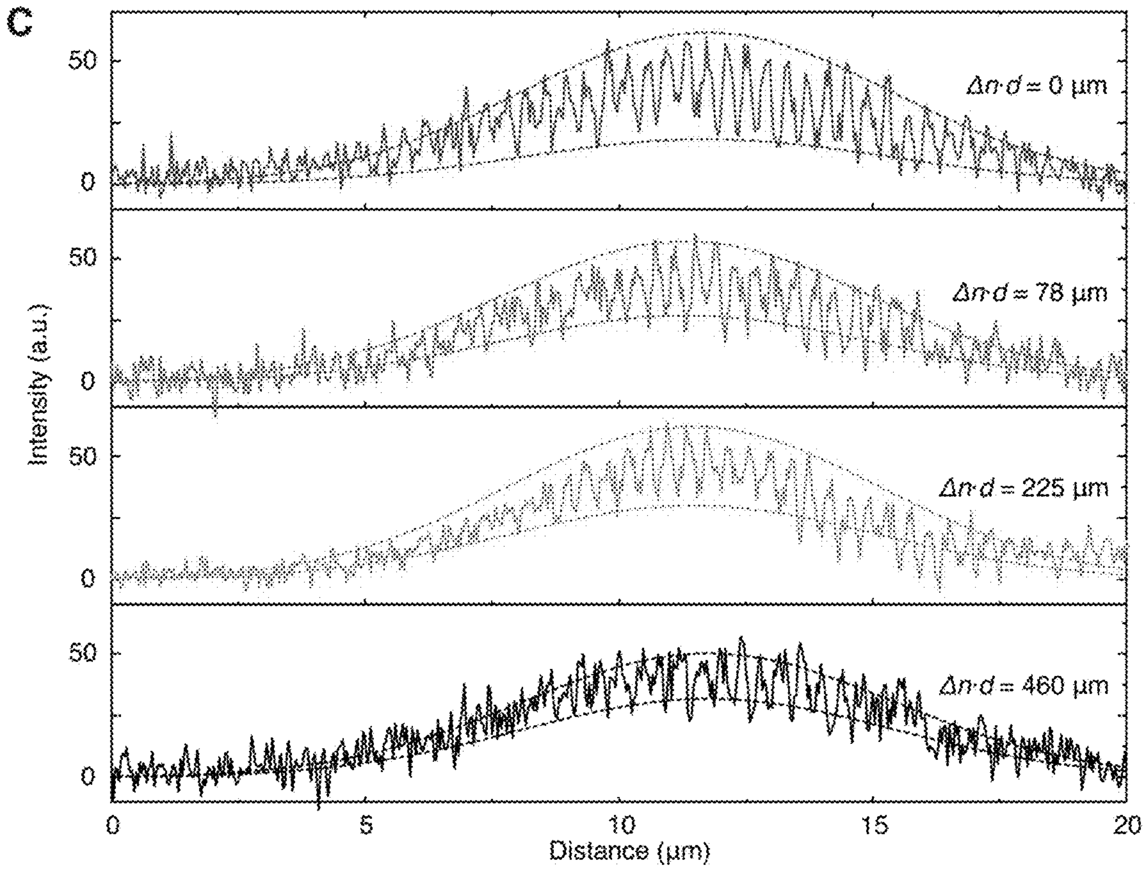
Figure 9D:
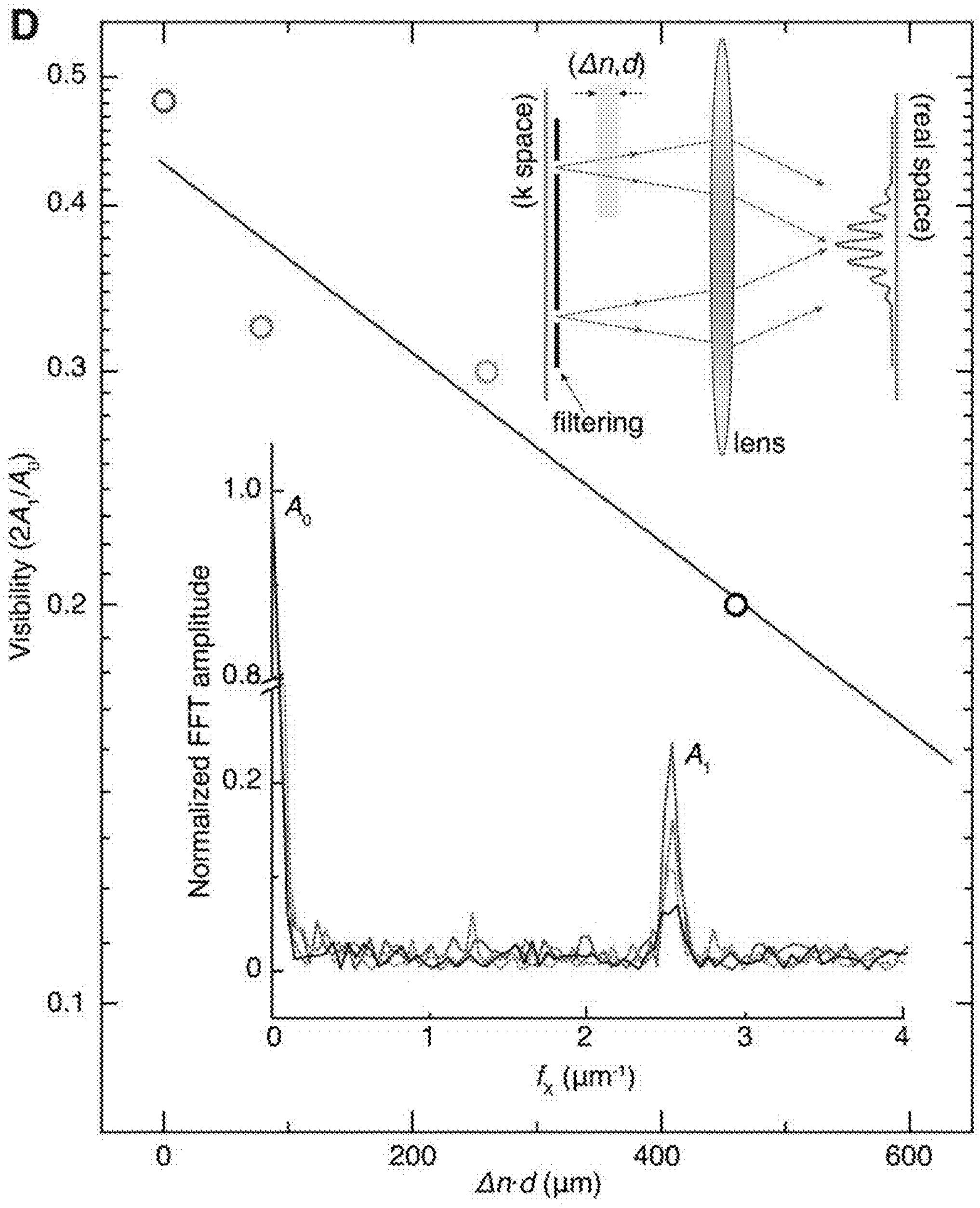

FIGS. 9A-D show verification of room-temperature Rashba monolayer lasing, as obtained in experiments performed according to some embodiments of the present invention. FIG. 9A shows measured output intensities (log-log scale) and linewidths of the dominant emission peak as a function of the pump power. The output intensities were obtained by integrating over the peak, and the linewidths are obtained by Lorentz fittings (error bars are standard errors of the fitted Lorentz widths). The black fitting curves are calculations from a laser rate equation with different β-factors, and the dashed blue lines are a guide to the eye for the linewidths. The vertical line indicates the laser threshold defined at the maximum of the first-order derivative of the optimal fitting, beyond which a clear linewidth narrowing happens. FIG. 9B shows typical spectral details (with Lorentz fittings) for several pump powers. FIG. 9C shows measured two-beam interference fringes under different time delays. Two spin-up K spots were filtered for those interference measurements. Different time delays (denoted by optical path differences of Δn·d for convenience) between the two beams were introduced by inserting glass plates of various thicknesses into one of the beam paths, as shown by the schematic in the top inset of FIG. 9D. Δn is the refractive index difference between glass and air (Δn=0.46), and d is the thickness of the glass plate. For each panel of FIG. 9C, the two dashed curves represent Gaussian fittings to the upper and lower envelops of the fringes. All the Gaussian fittings share the same standard deviation as the measured spin-valley resonant mode ($\delta_r^m$=3.6 μm), and the amplitude difference between the upper and lower fittings also hints at a decreased visibility when the time delay increases. FIG. 9D shows measured visibility values (semi-log scale for the y axis) for the interference fringes shown in FIG. 9C. The black line is a linear fitting to the decaying visibility. The top inset of FIG. 9D shows schematic of the interference setup. The bottom inset of FIG. 9D shows calculated FFT amplitudes of different spatial frequency components for interference fringes shown in FIG. 9C. Due to mirror symmetry, only amplitudes for the positive spatial frequencies are shown, and each curve shares the same time delay as the interference fringes with an identical color as in FIG. 9C. The pump fluence for the measurements in FIG. 9C and FIG. 9D is P=3.6 kW/cm$^2$ (or pump power of 1000 μW).

Figure 10A:
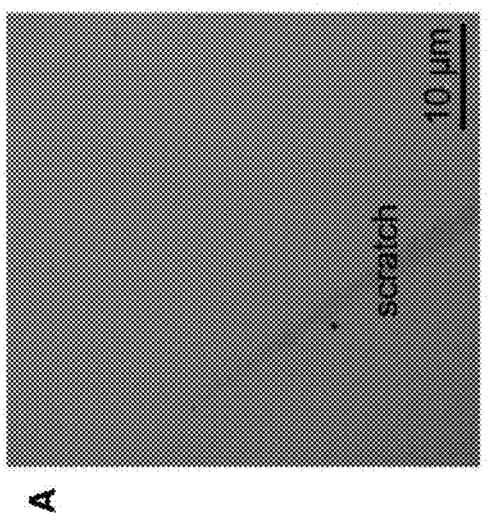
Figure 10B:
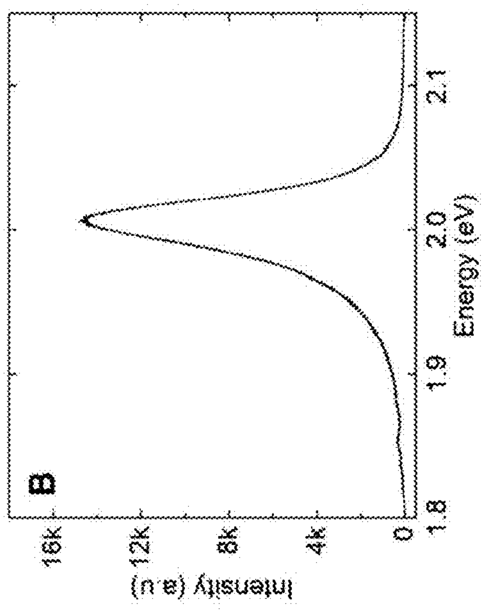
Figure 10C:
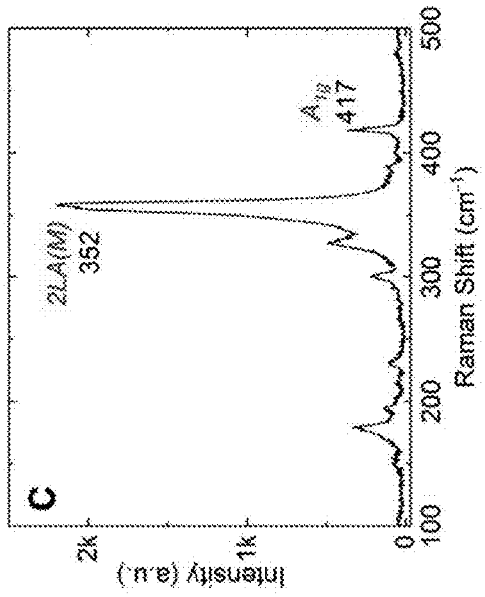
Figure 10E:
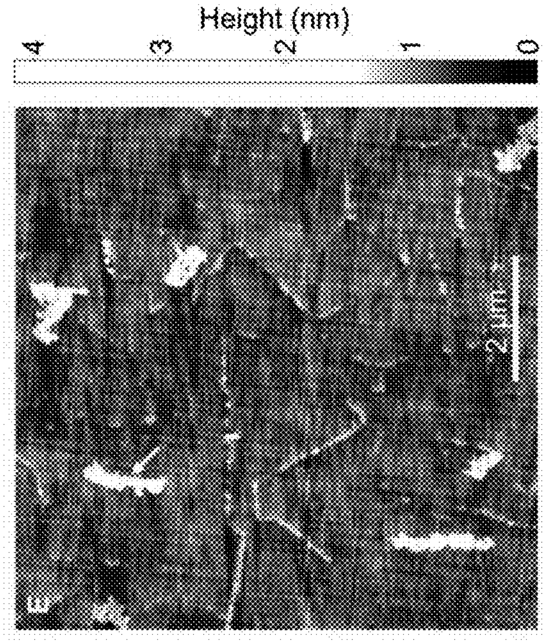
Figure 10D:
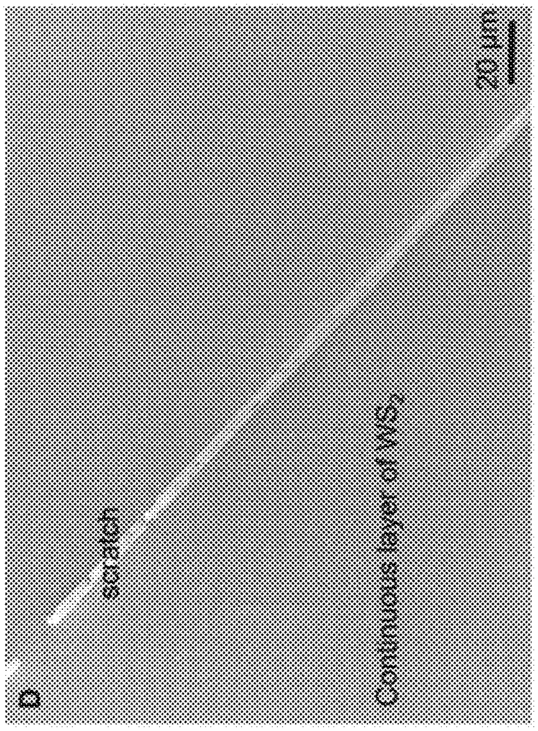

FIGS. 10A-E show typical characterizations of as-grown continuous $WS_2$ monolayers. FIG. 10A shows optical microscope image of a $WS_2$ monolayer. A scratch is intentionally produced for image contrast. FIG. 10B shows measured room-temperature photoluminescence (PL) spectrum of a $WS_2$ monolayer showing a sharp peak (about 2.0 eV) of A-exciton emission. FIG. 10C shows measured Raman spectrum of a $WS_2$ monolayer showing $A_{1g}$ and 2LA(M) modes. A large intensity ratio (greater than two) between 2LA(M) peak and $A_{1g}$ peak confirms the monolayer nature of the film. FIG. 10D is a SEM image of a $WS_2$ monolayer. A scratch is intentionally produced for image contrast. FIG. 10E shows measured AFM image of a $WS_2$ monolayer. The continuous monolayer is formed by the coalescence of individual single crystal domains. The green arrow indicates the grain boundary, while the white arrow indicates the presence of an ad-layer.

Figure 11:
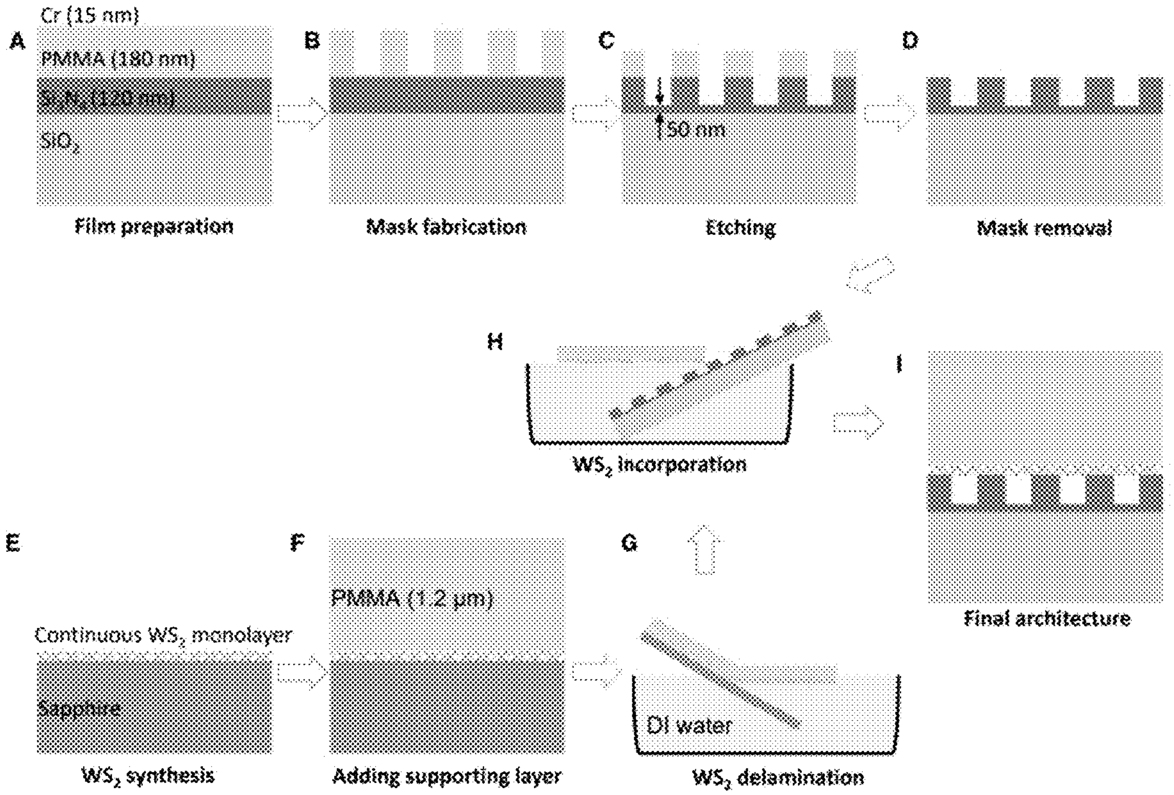

FIG. 11 is a schematic illustration of a fabrication process used in experiments performed according to some embodiments of the present invention. The illustrated include stages (A) through (I): (A) Preparation of $Si_3N_4$ and PMMA films (covered by a thin Cr conductive layer) on $SiO_2$ substrate. (B) Fabrication of PMMA mask by electron-beam lithography. (C) Etching of uncovered $Si_3N_4$ film by reactive-ion etching. (D) Removal of PMMA mask. (E) Synthesis of centimeter-scale $WS_2$ monolayer by a GE-MOCVD procedure. (F) Spin-coating PMMA supporting layer to the $WS_2$ monolayer. (G) Delamination of PMMA/$WS_2$ assembly in water. (H) Incorporation of the delaminated PMMA/$WS_2$ assembly into fabricated nanostructures. (I) Final architecture of the samples.

Figure 12A:
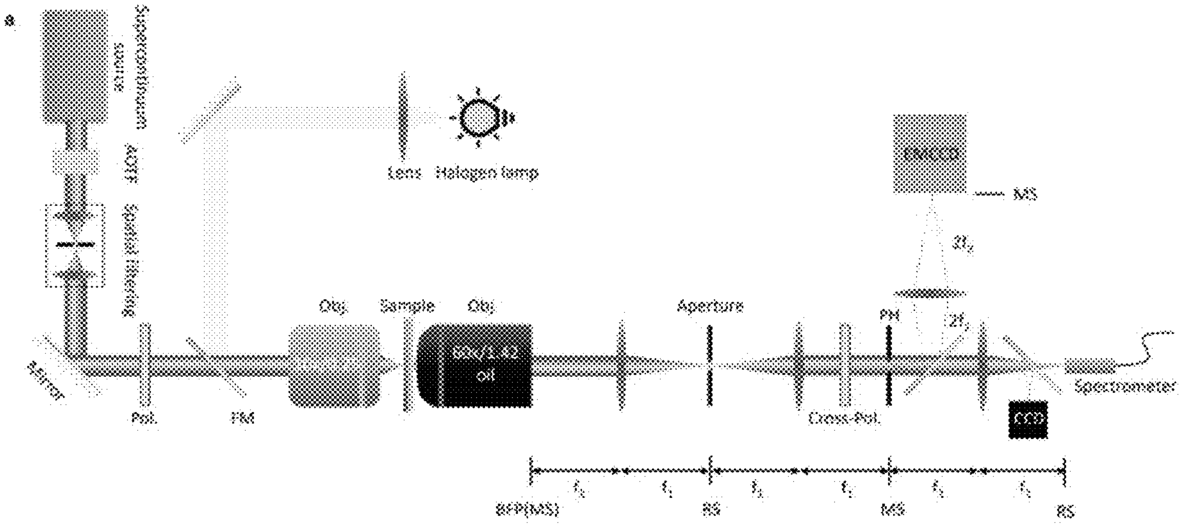
Figure 12B:
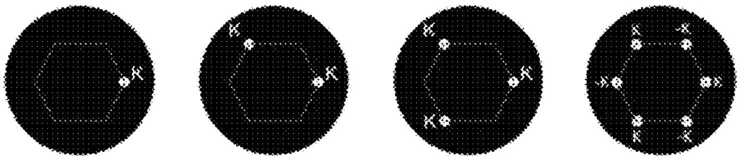

FIGS. 12A and 12B are schematic illustrations of an experimental setup for transmission and "cold" cavity measurements used in experiments performed according to some embodiments of the present invention. FIG. 12A shows schematic of the setup. Pol., linear or circular polarizer; Cross-Pol., linear or circular polarizer in a cross-polarization alignment to the previous one; FM, flip mirror; Obj., objective; BFP, back focal plane; MS, momentum space; RS, real space; PH, pinhole. The focal lengths are $f_1$=10 cm and $f_2$=5 cm. By using the halogen lamp as an illumination source and the CCD as an imaging device, an alternative microscope system (via flip mirrors) can be achieved for sample imaging. FIG. 12B shows schematics of home-made pinholes for ±K spots filtering in momentum space. The diameters of individual pinholes are approximately 0.21 $k_0$ (~two times the full extension of ±K spots to avoid unwanted diffraction), which were fabricated on a black aluminum foil for different purposes, including single K (−K) spot selection, two K (−K) spots selection, three K (−K) spots selection, and all ±K spots selection (from left to right).

Figure 13:
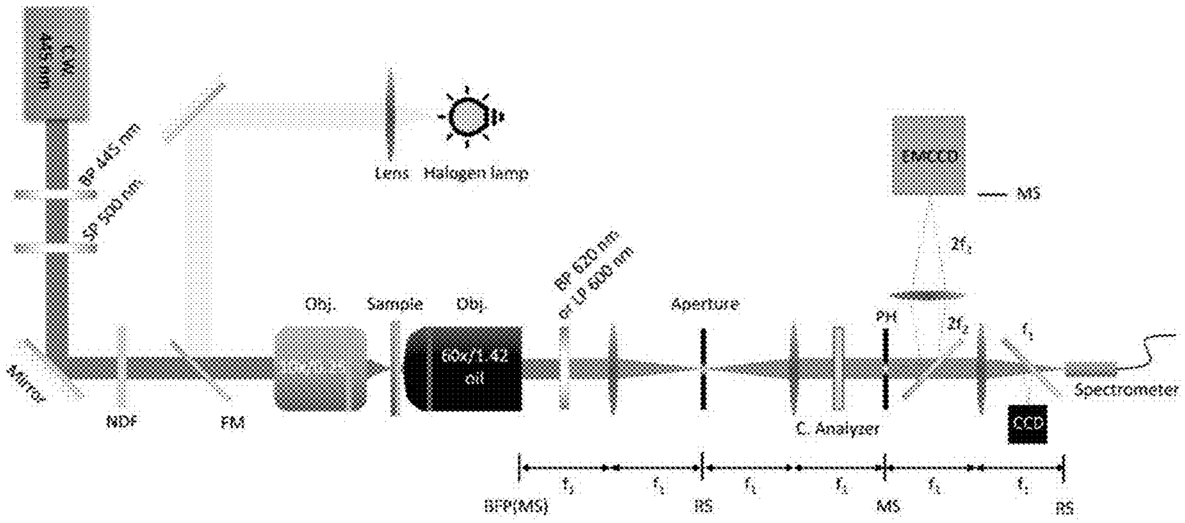

FIG. 13 is a schematic illustration of an experimental setup for Rashba monolayer lasing measurements used in experiments performed according to some embodiments of the present invention. C.W., continuous-wave laser; BP, bandpass filter; SP, short-pass filter; NDF, variable neutral density filter; LP, long-pass filter; C. Analyzer, circular analyzer. For more details, refer to FIG. 12A, above.

Figure 14:
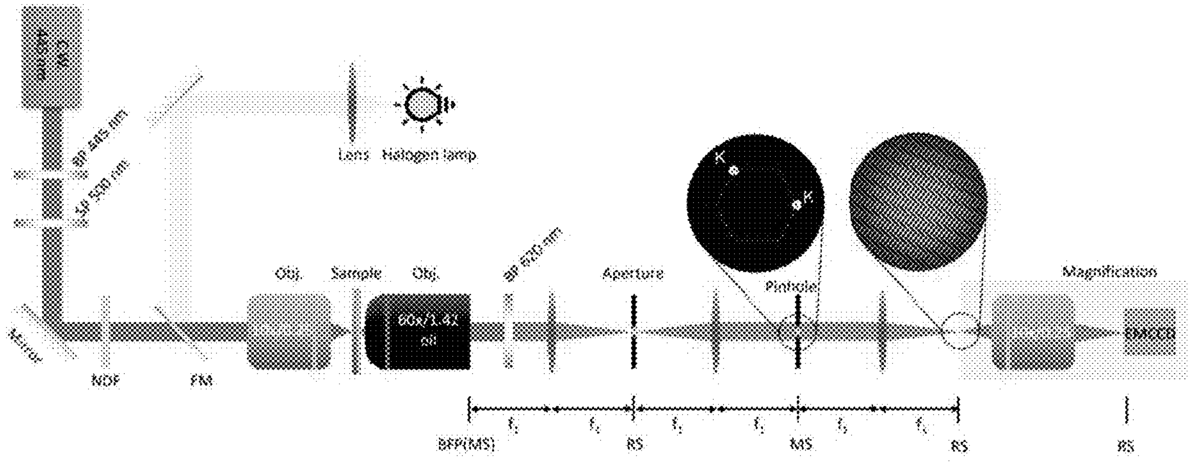

FIG. 14 is a schematic illustration of an experimental setup for two-beam interference measurements used in experiments performed according to some embodiments of the present invention. Compared to FIG. 13, above, a magnification unit was built to zoom in the real-space interference fringes, which were achieved by spatial filtering using a two-point pinhole in momentum space.

FIGS. 15A-D show robustness of spin-valley modes under various structural parameters, as obtained in experiments performed according to some embodiments of the present invention. Simulated wavelengths and Q-factors for the spin-valley modes under various radii (FIG. 15A), short/major axis ratios (FIG. 15B), depths (FIG. 15C), and lattice constants (FIG. 15D) of the periodic IaS Kagome lattice are shown. The dashed lines indicate the selected structural parameters, i.e., radius of R =56.3 nm, short/major axis ratio of e=0.7, depth of h=70 nm, and lattice constant of a=226 nm. When one parameter is changed, the other three parameters are fixed at the selected values. The short and major axes of the elliptical nanoholes are determined by $D_1=2R\sqrt{e}$ and $D_2=2R/\sqrt{e}$, respectively (that is, the area of individual nanoholes is maintained when the ratio is varied).

Figure 16B:
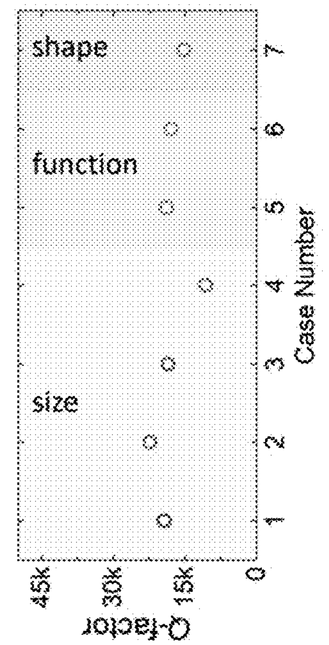
Figure 16C:
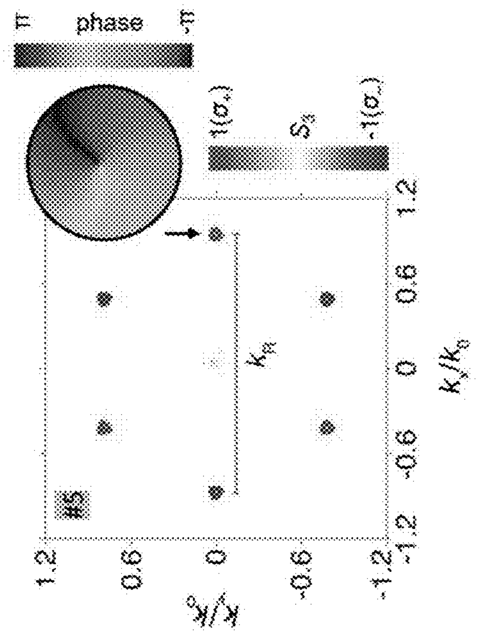
Figure 16A:
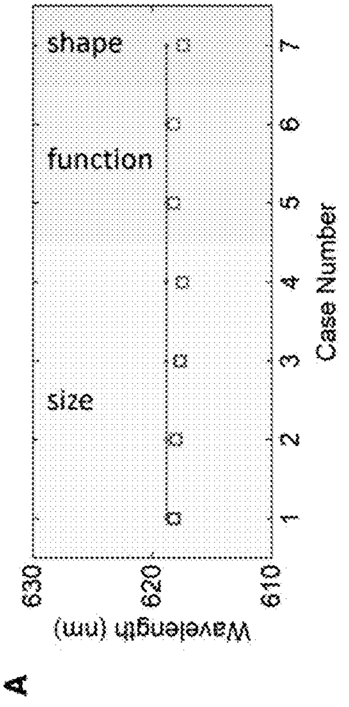
Figure 16D:
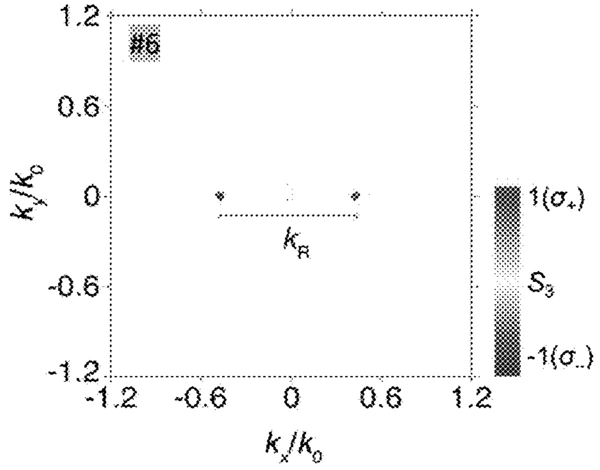
Figure 16E:
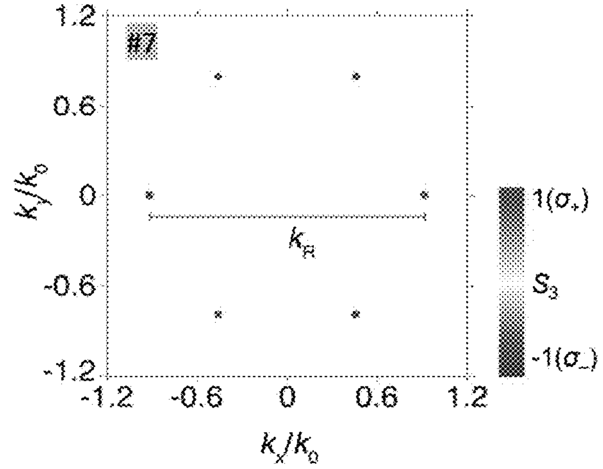
Figure 16F:
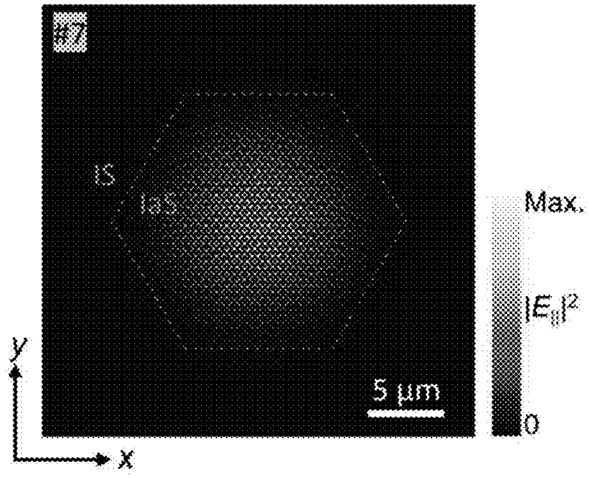

FIGS. 16A-F show manifestations of topological protection features in spin-valley microcavities, as obtained in experiments performed according to some embodiments of the present invention. FIGS. 16A and 16B show simulated wavelengths (FIG. 16A) and Q-factors (FIG. 16B) for the spin-valley resonant modes in heterostructure microcavities with different sizes, functionalities, and shapes. As a reference, the horizontal line denotes the wavelength of the corresponding spin-valley modes. Cases 1-4: Triangular microcavities designed for ±K beams, with a core side length of 27.5 μm, 22.0 μm, 16.7 μm, and 11.3 μm, respectively; Case 5: Triangular microcavity designed for ±K orbital angular momentum beams (topological charge of one), with a core side length of 27.5 μm; Case 6: Triangular microcavity designed for beam steering, with a core side length of 27.5 μm; Case 7: Hexagonal microcavity designed for ±K beams, with a core side length of 9.6 μm. (FIG. 16C-E shows simulated momentum-space $S_3$ distributions for case 5 (FIG. 16C), and 6 (FIG. 16D). The inset of FIG. 16C shows the phase singularity at one K point indicated by a black arrow. FIGS. 16E and 16F show simulated real-space intensity distribution (FIG. 16F) and momentum-space $S_3$ distribution (FIG. 16E) for case 7.

Figure 17B:
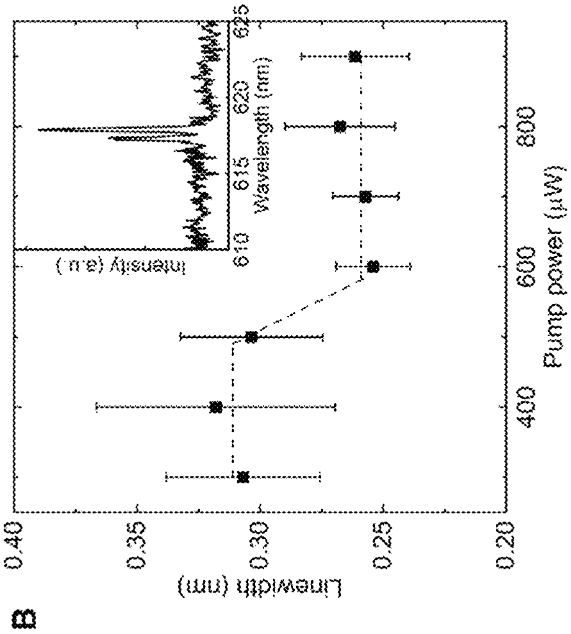
Figure 17A:
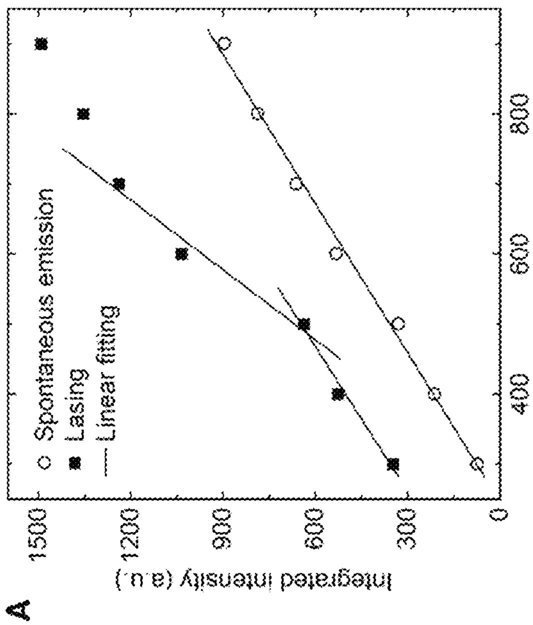
Figure 17C:
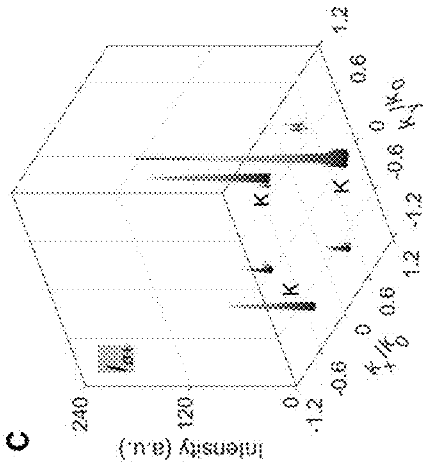
Figure 17D:
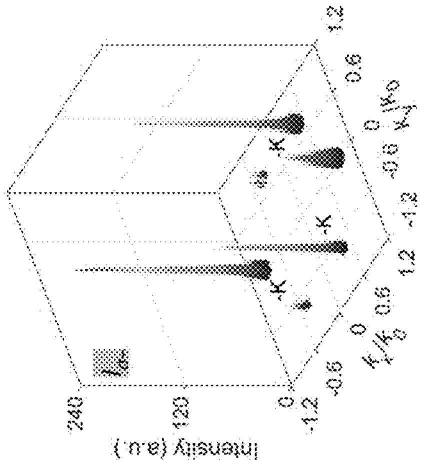
Figure 17E:
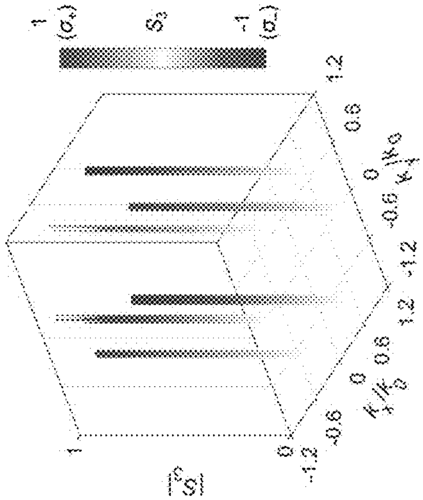

FIGS. 17A-E show Rashba monolayer lasing from a hexagonal spin-valley microcavity, as obtained in experiments performed according to some embodiments of the present invention. FIG. 17A shows measured light-light curves for lasing emission from the microcavity and spontaneous emission from the background. The pump threshold of the Rashba monolayer lasing is about 1.8 kW/cm$^2$ (or power about 500 μW). FIG. 17B shows measured linewidths of the dominant peak under different pump powers. The inset shows the measured lasing spectrum at a pump power of 600 μW. FIGS. 17C-E show measured spin-dependent emission intensity distributions (FIGS. 17C and 17D) and the corresponding $S_3$ distribution (FIG. 17E) in momentum space.

Figure 18:
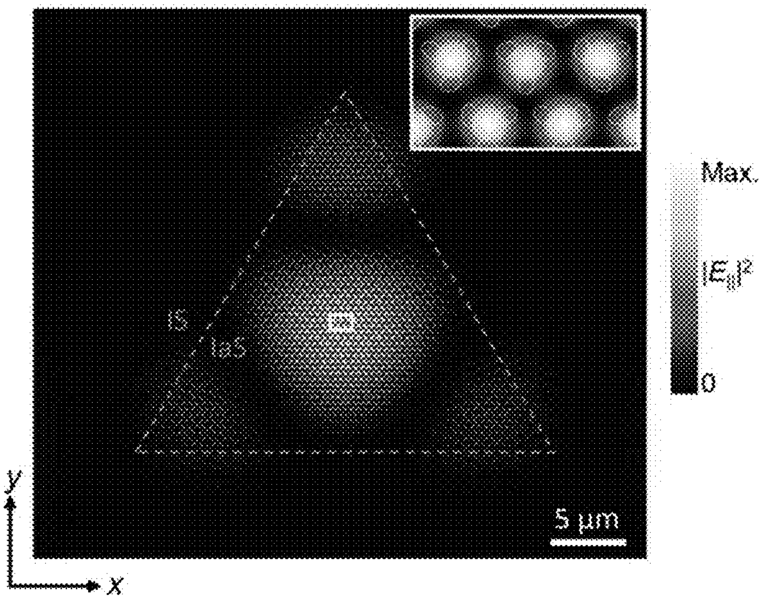

FIG. 18 shows second-order transverse mode in triangular heterostructure microcavity, as obtained in experiments performed according to some embodiments of the present invention.

Figure 19A:
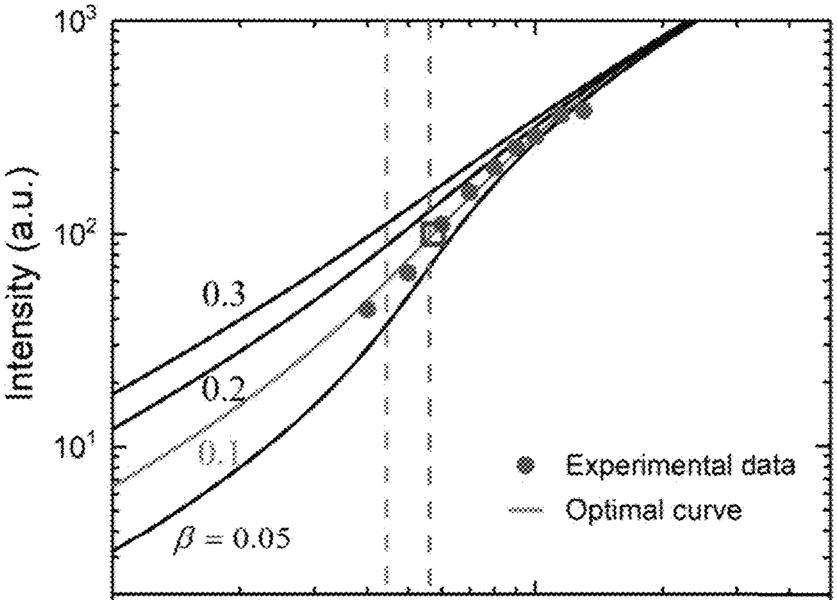
Figure 19B:
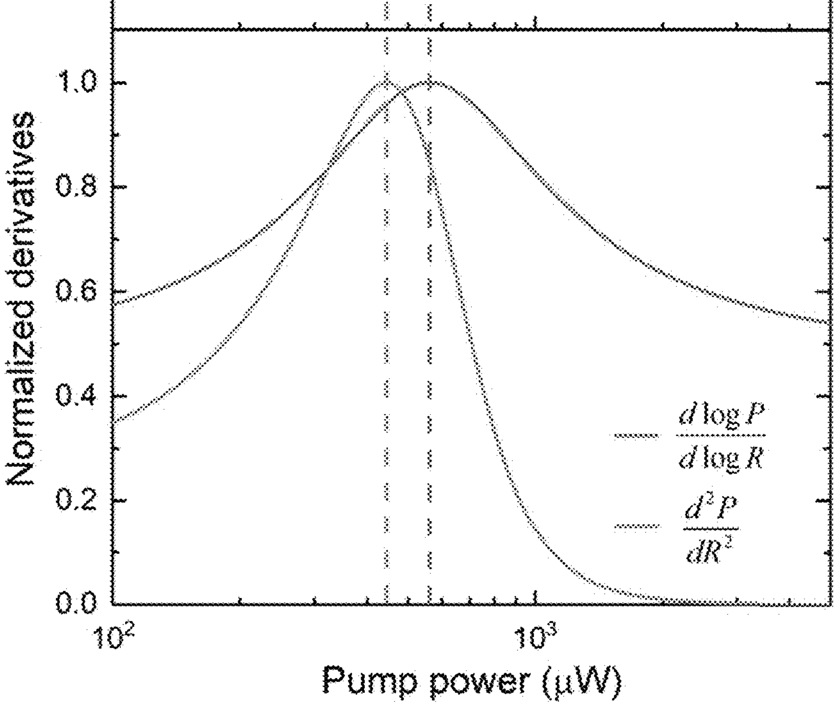
Figure 19C:
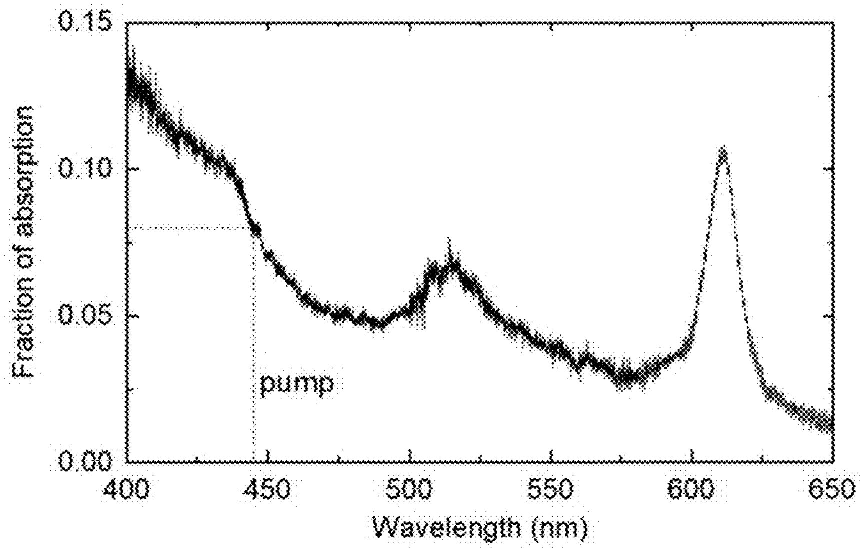
Figure 19D:
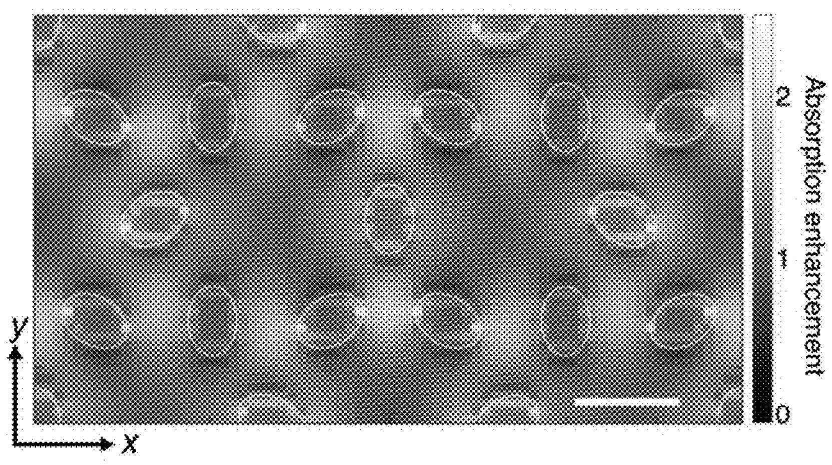

FIGS. 19A-D shows lasing threshold analysis obtained performed according to some embodiments of the present invention. FIG. 19A shows fitting curves to the experimental data with different β-factors in the laser rate equation (same as FIG. 9A). FIG. 19B shows calculated derivatives of d[log(P)]/d[log(R)] and $d^2P/dR^2$ for the optimal fitting. The threshold powers defined at the maximum of the corresponding derivative are indicated by the dashed vertical lines. As a reference, the calculated quantum threshold is shown as a blue square in FIG. 19A. FIG. 19C shows measured absorption spectrum of a $WS_2$ monolayer on a flat $Si_3N_4$ film. The absorption is defined as the fraction of incident power absorbed by the monolayer, under the excitation of a supercontinuum laser beam. FIG. 19D shows calculated absorption enhancement in one unit cell of the periodic IaS Kagome lattice (at the wavelength of 445 nm). The white ellipses indicate contours of the nanostructures. Scale bar: 200 nm.

Figure 20A:
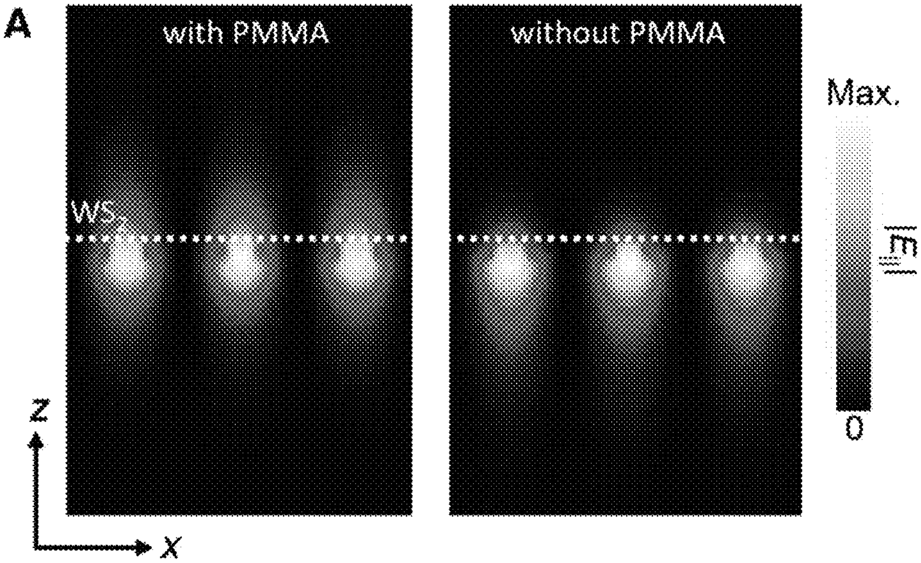
Figure 20B:
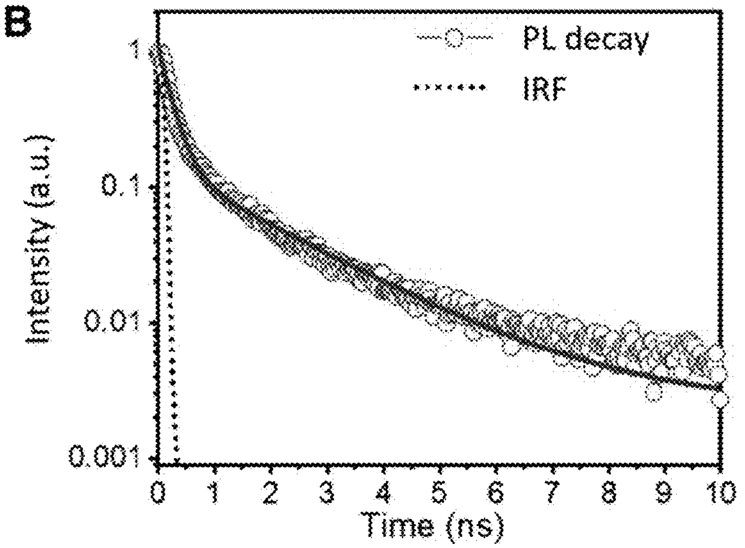

FIGS. 20A and 20B show confinement factor and spontaneous emission lifetime. FIG. 20A shows simulated electric field distributions on a x-z cross section of a periodic IaS Kagome lattice with (left) and without (right) the PMMA encapsulation layer. The dotted lines indicate the location of the incorporated $WS_2$ monolayer. FIG. 20B shows measured time-resolved PL spectrum of a $WS_2$ monolayer. The solid curve shows an exponential fitting to the measured data, and the dotted curve shows the instrument response function (IRF). The measurement was conducted at a maximum achievable pump fluence (~0.5 $kW/cm^2$) of the system.

Figures 21A, 21B, 21C:
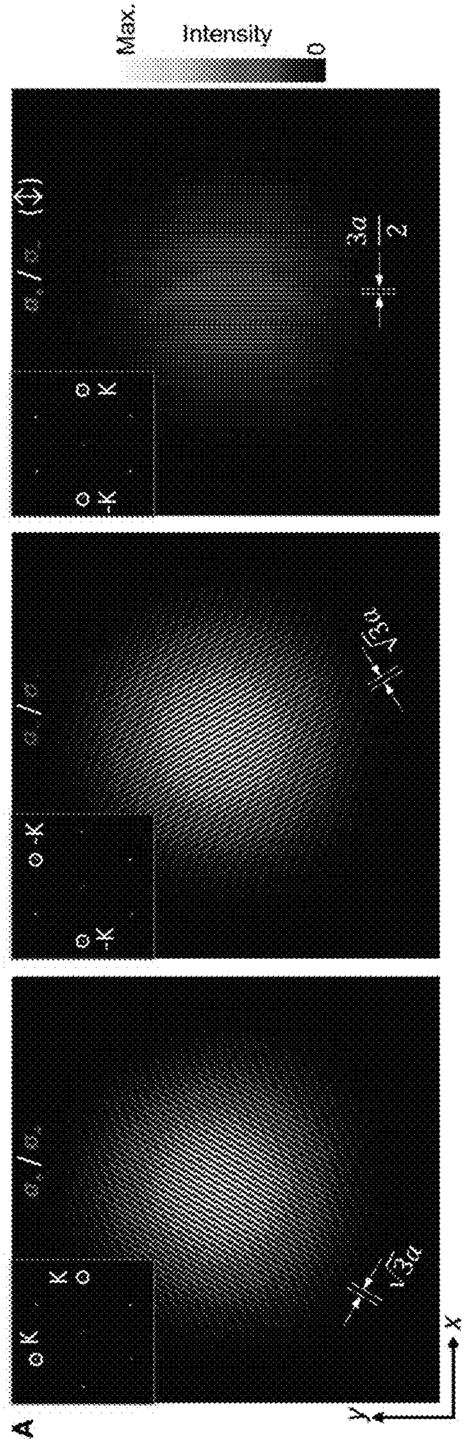
Figure 21D:
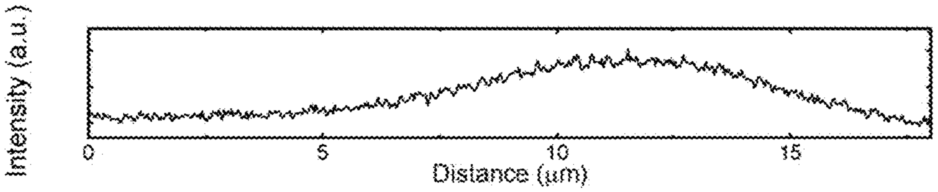
Figure 21E:
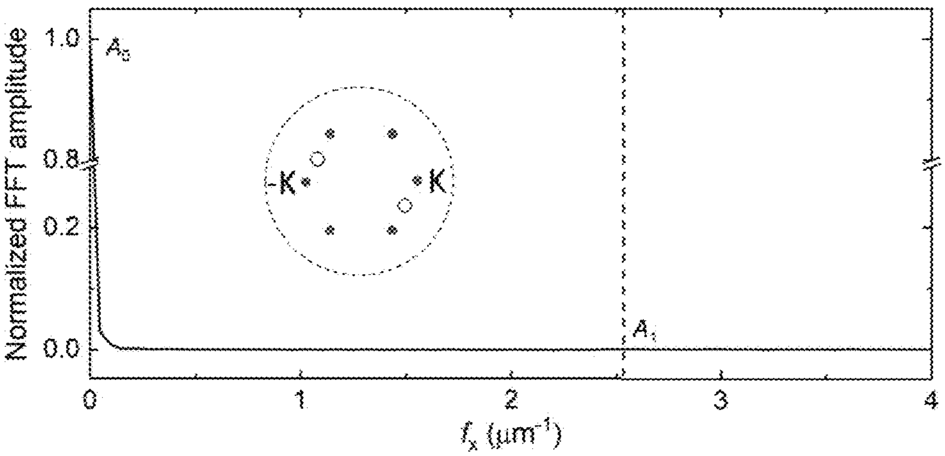
Figure 21F:
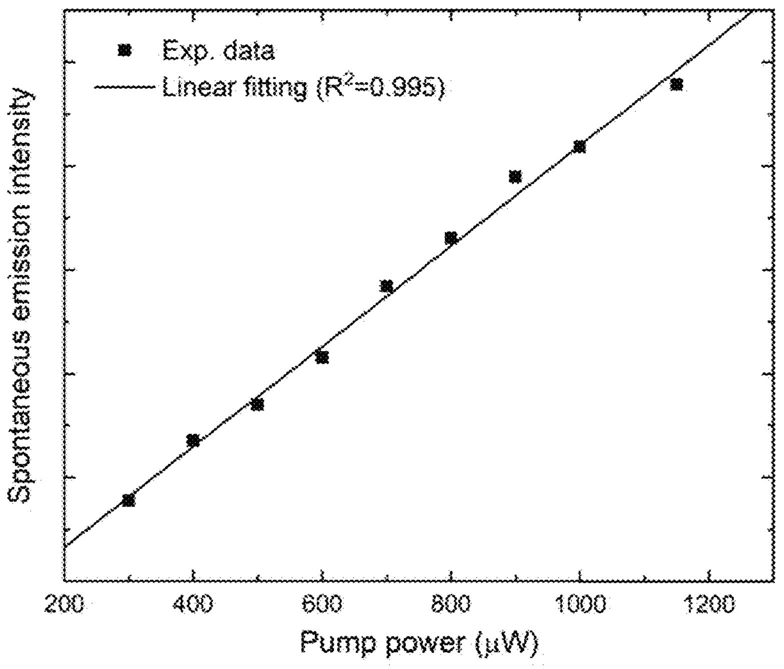

FIGS. 21A-F show interference in simulations and reference measurements, as obtained in experiments performed according to some embodiments of the present invention. FIGS. 21A-C show simulated two-beam interference fringes from two spin-up K spots (FIG. 21A), two spin-down −K spots (FIG. 21B), and one spin-up K spot and one spin-down −K spot (FIG. 21C). Only $|E_y|^2$ is shown in FIGS. 21B and 21C. The solid circles in the inset show the spatial filtering in momentum space, and an inverse Fourier transform was conducted to obtain the real-space interference fringes. The inset momentum-space intensity distributions are the same as the left inset of FIG. 7B. The periods of the fringes are provided (a=226 nm). FIG. 21D show measured two-beam interference from two background regions outside the ±K spots. FIG. 21E shows calculated FFT amplitudes of different spatial frequency components for the interference shown in the top panel. The inset shows a schematic of the locations of the two background regions (indicated by two solid circles), where only spontaneous emission exists. The measurement was conducted under the same conditions as FIG. 9C, and only the two-point filtering pinhole was moved to the background region. FIG. 21F shows measured linear light-light curve outside the ±K spots.

Figure 22:
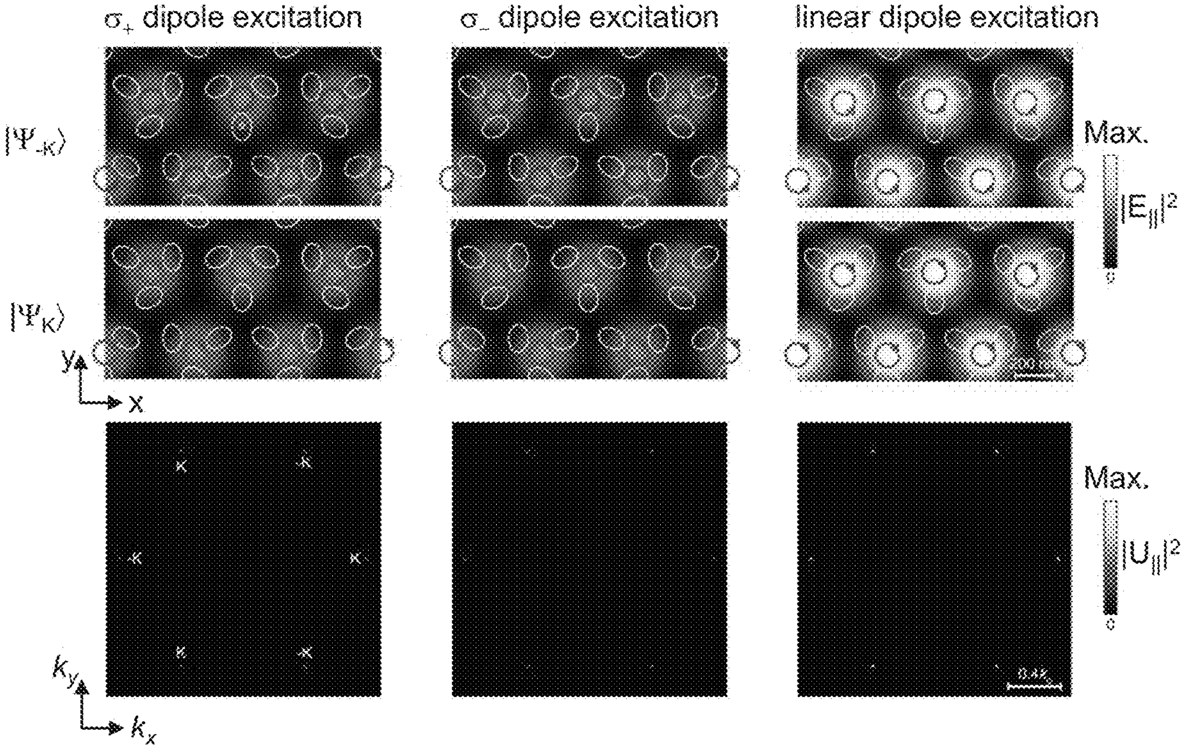

FIG. 22 shows coherent superposition of spin-valley modes. Left, middle, and right columns are results under the excitation of in-plane dipole emitters with right-handed circular polarization, left-handed circular polarization, and linear polarization, respectively. Top panels: real-space intensity distributions for $|\Psi_{-K}\rangle$; Middle panels: real-space intensity distributions for $|\Psi_K\rangle$; Bottom panels: momentum-space intensity distributions for “classical qubit mode”. The dipole emitters are placed at the center of the unit cell (indicated by a star in the top-left panel), and similar results can be observed when the dipole position is changed. The energies of the dipole emitters are maintained the same for the three cases.

DESCRIPTION OF SPECIFIC EMBODIMENTS OF THE INVENTION

The present invention, in some embodiments thereof, relates to light sources and, more particularly, but not exclusively, to a method and system for generating coherent light having two spin modes.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1:
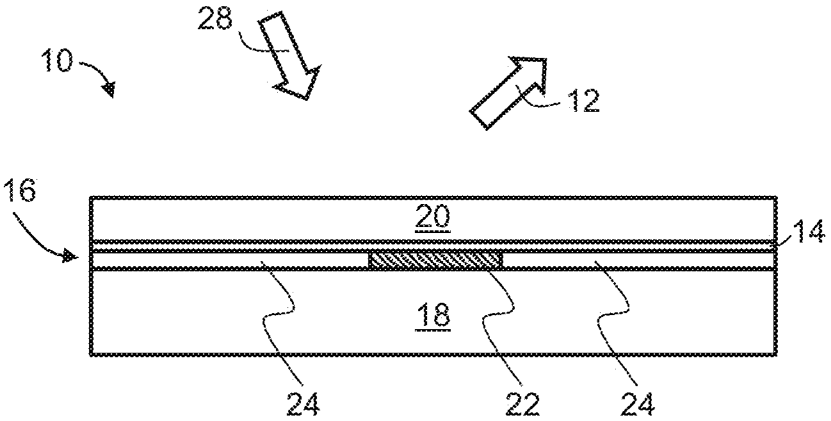

Referring now to the drawings, FIG. 1 illustrates a surface-emitting light source system 10 for generating coherent light 12 having two spin modes, according to some embodiments of the present invention. System 10 can be incorporated in any system in which it is advantage to utilize coherent light having two spin modes. Representative examples of such systems include, without limitation, communication systems, quantum teleportation systems, quantum cryptography systems, quantum computers, material inspection systems, and the like.

For example, by employing system 10 in optical communication systems, the data capacity and/or the security level of the system can be improved. Traditional optical communication relies on the polarization state of light (horizontal, vertical, or diagonal) to transmit information. Using the system of the present embodiments provides additional degrees of freedom, allowing for more information to be encoded and transmitted. This concept, also known as spin-based multiplexing, increases the number of channels available for transmitting data, leading to higher data capacity and faster data rates in optical communication systems. This can also improve security, because spin states are quantum-mechanical properties, and are therefore more resistant to eavesdropping and interception than traditional polarization-based communication.

In quantum teleportation systems, the system of the present embodiments can be used to allows the transfer of the quantum state of one photon to another distant photon without any physical transfer of the photon itself. This process relies on entangled photons, whose spin states are correlated in such a way that the state of one photon is directly connected to the state of the other, regardless of the distance between them.

In quantum cryptography, the system of the present embodiments can be used, for example, in the implementation of quantum key distribution (QKD) protocols, whereby the spin modes can be used to encode quantum information in the form of quantum bits. Generation of quantum bits is also useful in quantum computing.

In material inspection systems, the system optionally and preferably is particularly useful for the inspection of molecular chirality.

System 10 comprises a two-dimensional material 14 coupled to a planar cavity 16. In some embodiments of the present invention cavity 16 is carried by a substrate 18, and in some embodiments of the present invention system 10 comprises an encapsulation layer 20 applied on top of two-dimensional material 14, such that two-dimensional material 14 is sandwiched between cavity 16 and encapsulation layer 20.

As used herein "two-dimensional material" refers to a material having a crystal structure and a thickness of no more than one unit cell characterizing the crystal structure. A unit cell of a crystal structure is composed of an integer multiple (oftentimes denoted Z in the scientific literature) of formula units. This definition encompasses also the special case in which the integer multiple Z equals 1, in which case the unit cell of the respective crystal structure is composed of a single formula unit.

In some embodiments of the present invention the two-dimensional material 14 is a monolayer.

Two-dimensional material 14 can be of any type that exhibits a direct band gap.

A band gap of a material refers to the energy gap between the conduction band and the valence band of the material, and can be classified as "direct" or "indirect." A band gap of a material is said to be direct when the crystal momentum of a charge carrier (electron or hole) is conserved during a transition between the conduction band and the valence band. A band gap of a material is said to be indirect when the crystal momentum of a charge carrier (electron or hole) changes during a transition between the conduction band and the valence band.

In some embodiments of the present invention two-dimensional material 14 is a transition metal dichalcogenide (TMD). Representative examples of TMDs suitable for the present embodiments including, without limitation, molybdenum disulfide, tungsten disulfide, molybdenum diselenide, tungsten diselenide, and molybdenum ditelluride.

Cavity 16 is a heterostructure cavity having an inversion asymmetric core region 22 at least partially surrounded by an inversion symmetric cladding region 24. In various exemplary embodiments of the invention the two-dimensional material 14 is coupled both to the core region 22 and to the cladding region 24 of cavity 16. The thickness of cavity 16 is preferably from about 10 nm to about 500 nm, or from about 50 nm to about 500 nm, or from about 80 nm to about 500 nm, or from about 50 nm to about 250 nm, or from about nm to about 250 nm.

Figure 2:
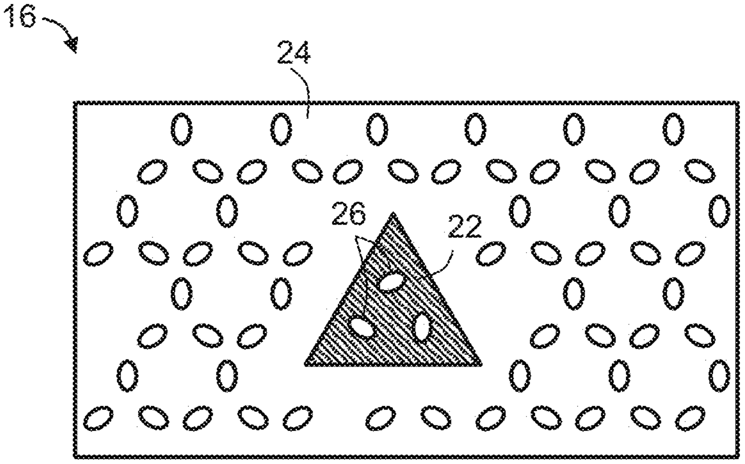

A top view of cavity 16, according to some embodiments of the present invention, is illustrated in FIG. 2. The core region 22 and the cladding region 24 have identical atomic lattice structure, wherein at least one of regions 22 and 24 comprises structural elements 26 arranged to induce the respective symmetry property. In the illustrated embodiments, the structural elements 26 are formed in both regions 22 and 24, and are arranged such as to induce an inversion symmetric property to region 24 and an inversion asymmetric property to region 26. The structural elements 26 can have any structure that is asymmetric with respect to at least one axis engaging the plane of cavity 16. For example, the structural elements 26 that are formed in core region 22 can be embodied as anisotropic nanoholes. In the representative illustration of FIG. 2, which is not to be considered as limiting, the cross section of each nanohole at the plane of cavity 16 has a shape of an ellipse, but other anisotropic shapes are also contemplated. The structural elements 26 are preferably nanometric.

As used herein, a "nanometric structural element" describes a structural element which, at any point along its perimeter in the plane engaged by the upper surface of cavity 16, has at least one in-plane diameter and, in some embodiments, at least two orthogonal in-plane diameters less than 1 micron, or less than 800 nanometers, or less than 600 nanometers, or less than 400 nanometers, or less than 200 nanometers, or less than 100 nanometers. In some embodiments of the present invention the depth of the nanometric structural element (along a direction perpendicular to the plane engaged by the upper surface of cavity 16), is also nanometric (e.g., less than 1 micron, or less than 800 nanometers, or less than 600 nanometers, or less than 400 nanometers, or less than 200 nanometers, or less than 100 nanometers).

In some embodiments, the ratio between two orthogonal in-plane diameters of the nanometric structural element (in the plane engaged by the upper surface of cavity 16) is from about 0.1 to about 0.9. For example, when nanometric structural element has the shape of an ellipse, the ratio between that short and major in-plane axes of the ellipse is from about 0.1 to about 0.9.

In some embodiments, the depth of the nanometric structural element is less than its shortest in-plane diameter.

The arrangement and/or orientation of structural elements 26 is selected to induce the respective symmetry property. For example, structural elements 26 can be arranged to form different photonic spin-like lattices, wherein the lattice formed by the structural elements 26 in region 24 is superimposable on its space-inverted version (e.g., exhibits a uniform chirality distribution), and the lattice formed by the structural elements 26 in region 22 is not superimposable on its space-inverted version (e.g., exhibits a staggered chirality distribution). The lattice constant of the lattice formed by the structural elements 26 is typically from about 100 nm to about 500 nm. Representative examples of types of lattices that structural elements 26 can form include, without limitation, Kagome lattices, square lattices, hexagonal lattices, honeycomb lattices, and Lieb lattices.

Preferably, but not necessarily, structural elements 26 are arranged to form different Kagome lattices. In these embodiments, the Kagome lattice formed by the structural elements 26 in region 24 can be characterized by a q=0 state, and the Kagome lattice formed by the structural elements 26 in region 22 can be characterized by a $q=\sqrt{3}\times\sqrt{3}$ state. More details regarding this embodiment is described in the Examples section that follows, see, for example, FIGS. 5B-D.

Cavity 16 can have any planar shape. In the illustrative example shown in FIG. 2, which is not to be considered as limiting, cavity has as a shape of a polygon (a rectangle, in the present illustration), and the core region 22 also has as a shape of a polygon (a triangle, e.g., equiangular triangle in the present illustration). A largest side of the polygon, for example, of the polygon that defines the core region 22, typically has a length of less than 100 microns, or less than 80 microns, or less than 60 microns, or less than 40 microns. Other shapes are also contemplated.

Cavity 16 can be made of a material exhibiting symmetry-protected photonic bound states in the continuum. Representative examples of cavity materials suitable for use for cavity 16 include, without limitation, a silicon-containing material, e.g., silicon (Si) and silicon nitride ($Si_3N_4$), and a gallium-based semiconductor material, e.g., gallium arsenide (GaAs) and gallium nitride (GaN).

Substrate 18 serves as a carrier substrate for cavity 16 and can be made of any suitable substrate material, including, without limitation, silicon oxide, silicon oxynitride, silicon oxycarbide, a polymer, or the like. Encapsulation layer 20 can be made of any transparent material, including, without limitation, polymethyl methacrylate (PMMA). The inventers found that encapsulation layer 20 improves the spatial overlap between the spin-valley resonant mode and the two-dimensional material 14. Encapsulation layer 20 is preferably substantially thicker (e.g., at least 2 times or at least 4 times or at least 8 times thicker) than cavity 16.

Figure 3:
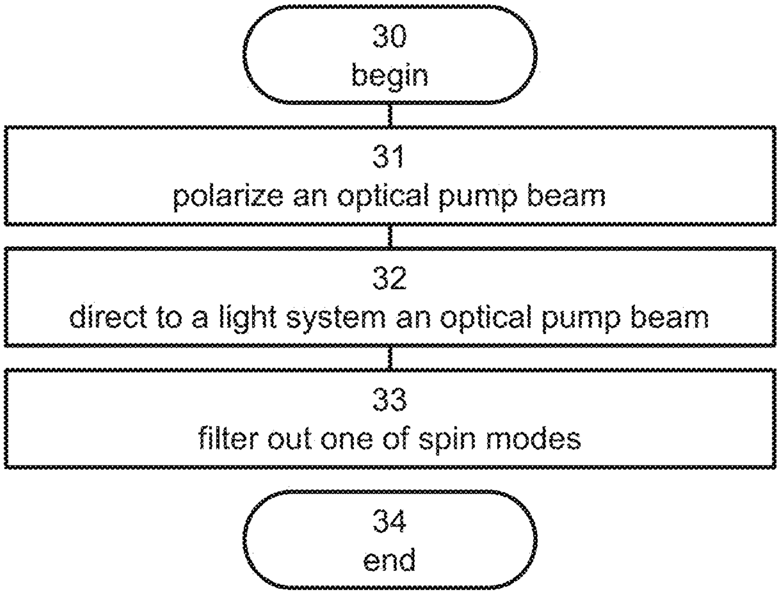

FIG. 3 is a flowchart diagram of a method suitable for generating coherent light having two spin modes according to various exemplary embodiments of the present invention.

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 30 and optionally continues to 31 at which an optical pump beam is polarized. It was found by the inventor that such polarization can be used to control the properties of the spatial coherence and/or intensity of the produced light.

The method continues to 31 at which the optical pump beam is directed to a light source system, e.g., surface-emitting light source system 10. The optical pump beam is shown in FIG. 1 at 28. When directed to system 10, optical pump beam 28 preferably has a central wavelength within the absorption spectrum of two-dimensional material 14. For example, when the two-dimensional material is tungsten disulfide, the central wavelength of pump beam 28 can be from about 450 nm to about 600 nm. The interaction of the light source system generates a coherent light beam (see beam 12 in FIG. 1). The wavelength of the generated light is centered at the central wavelength of the two-dimensional material 14. For example, when the two-dimensional material is tungsten disulfide, the wavelength of the generated light is centered at about 620 nm.

In some embodiments of the present invention the method continues to 33 at which one of the spin modes of the generated coherent light beam is filtered out. These embodiments are particularly useful when it is desired to have a coherent light beam that has a defined single spin mode, for example, for the purpose of encoding information.

The method ends at 34.

Figure 4:
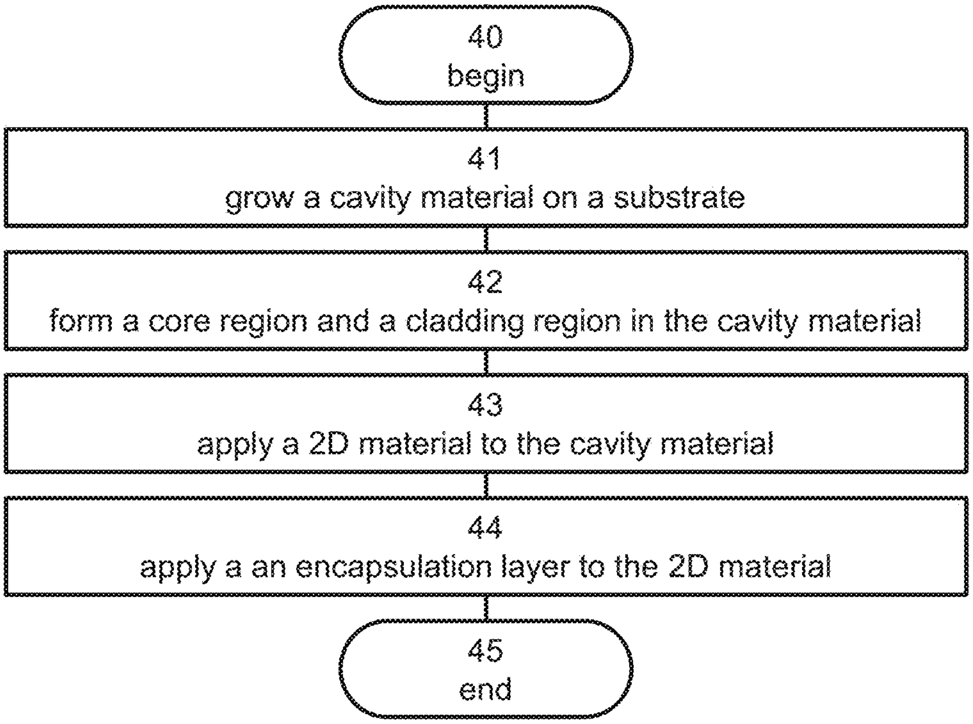

FIG. 4 is a flowchart diagram of a method suitable for fabricating a surface-emitting light source system for generating coherent light having two spin modes, according to some embodiments of the present invention. The method is suitable for fabricating surface-emitting light source system 10.

The method begins at 40 and continues to 41 at which a cavity material is grown on a substrate. The cavity material is preferably a material exhibiting symmetry-protected photonic bound states in the continuum, as further detailed hereinabove. The substrate can be made of any of the aforementioned substrate materials. The method proceeds to 42 at which a cladding region (e.g., region 24) and a core region (e.g., region 22) are formed in the grown cavity material. This is optionally and preferably performed by forming in the cavity material structural elements such as to form different photonic spin-like lattices, as further detailed hereinabove. The structural elements can be formed by lithography and etching, as further detailed in the Examples section that follows. The method continues to 43 at which a two-dimensional material (e.g., two-dimensional material 14) is applied to the cavity material. This can be done by employing a growth-etch metal-organic chemical vapor deposition procedure to synthesize the two-dimensional material and then employing a surface-energy-assisted process to transfer the synthesized two-dimensional material to the cavity material. These processes are further detailed in the Examples section that follows. The method optionally and preferably proceeds to 44 at which an encapsulation layer (e.g., layer 20) is applied on top of two-dimensional material. This can be done by employing a coating technique, such as, but not limited to, spin-coating or the like.

The method ends at 45.

As used herein the term "about" refers to ±10%

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Direct-bandgap transition metal dichalcogenide monolayers are appealing candidates to construct atomic-scale spin-optical light sources owing to their unique valley-contrasting optical selection rules. This Example reports on a spin-optical monolayer laser by incorporating a $WS_2$ monolayer into a heterostructure microcavity supporting high-Q spin-valley resonances. Inspired by the creation of valley pseudospins in monolayers, the spin-valley modes are generated from a photonic Rashba-type spin splitting of a bound state in the continuum, which gives rise to opposite spin-polarized ±K valleys due to emergent photonic spin-orbit interaction under inversion symmetry breaking. The room-temperature Rashba monolayer laser of the present embodiments shows intrinsic spin polarizations, high spatial and temporal coherence, and inherent topological protection features. The monolayer-integrated spin-valley microcavities optionally and preferably can be used as classical and non-classical coherent spin-optical light sources exploring both electron and photon spins.

Light sources are indispensable components of optical systems. Thus far, various light sources of distinct statistical properties, such as super-Poissonian thermal sources, Poissonian laser sources, and sub-Poissonian quantum sources, have been investigated to cover extensive applications from classical to quantum realms (1-4). Accompanying the advances of light sources, miniaturization of device footprints has acquired a considerable attention in the pursuit of low energy consumption and high integration density for integrated photonics (5, 6). Specifically, miniaturized spin-optical light sources stand out due to features in ultrafast operation and all-optical controllability (7, 8), exhibiting great potentials in chiroptical studies and multidimensional optical communications. Moreover, an ultimate miniaturization of spin-optical devices down to an atomic scale offers the opportunity to interface spin-optics and spintronics for an interchange of spin information between photons and electrons in advanced optoelectronic devices. Here, the photon spin ($\sigma=\pm1$) is associated with an intrinsic angular momentum of photons, manifested as the right- ($\sigma_+$) and left-handed ($\sigma_-$) circular polarizations of light.

Spin-optical light sources can be achieved by lifting the spin degeneracy of either photonic modes or electronic transitions. This can be done by breaking a structure's spatial inversion symmetry (IS), to provide a structure that is not superimposable on its space-inverted version ($r\rightarrow -r$, r being a position vector). The introduced inversion asymmetry (IaS), together with the emergent spin-orbit interaction (SOI), results in spin-split effects in both photonic and electronic systems. For example, the photonic Rashba effect is manifested as a spin-split dispersion in momentum space, resembling a solid-state Rashba phenomenon in which the electrons' spin-degenerate parabolic bands split into dispersions with opposite spin-polarized states under IS breaking (9-11). Therein, the photonic SOI originates from a polarization evolution of light upon the Poincaré sphere, which generates spin-dependent Pancharatnam-Berry phases (or geometric phases) $\phi_g=-\sigma\theta(\xi)$ for the spin-flipped components (12, 13). The $\theta(\xi)$ stands for local orientation angles along a predefined trajectory $\xi$ in a deformed space, which can be described by a non-inertial Helmholtz equation as $(\nabla^2+k^2-2k\sigma\nabla_\xi\theta)\Psi_\sigma(r)=0$ (14). Here, $\nabla_\xi$ is the spatial gradient along trajectory $\xi$, k is the wave number, and $\Psi_\sigma(r)$ is the spin-dependent wave function. In analogy to the Schrödinger equation describing the Aharonov-Bohm effect, $-\sigma\nabla_\xi\theta$ in the Coriolis term behaves similarly as the vector potential qA (q-charge and A-vector potential) that comprises a generalized momentum $-i\hbar\nabla-qA$ (i-imaginary unit and $\hbar$-reduced Planck constant) [see Example 3, below, section 1]. As a result, a spin-split dispersion can be observed in momentum space due to the analogous spin-dependent generalized momentum, manifested as a photonic Rashba effect (with a Rashba spin splitting of $|2\sigma\nabla_\xi\theta|$).

Another typical electronic manifestation is the valley-dependent spin polarizations (or valley pseudospins) in direct-bandgap transition metal dichalcogenide (TMD) monolayers, where broken IS leads to valley-contrasting optical selection rules for interband transitions at ±K' points (FIG. 5D) (16). Here, ±K' denote corners of the first Brillouin zones for the electronic band structures, in which the energy-momentum extrema are referred to as the valleys. Consequently, TMD monolayers are attractive active materials to construct atomic-scale spin-optical light sources, in which valley excitons (excited electron-hole pairs at ±K' valleys), radiated as in-plane circularly polarized dipole emitters with opposite helicities, interact with corresponding spin-polarized modes for output. However, previous works were restricted by low-Q propagating chiral modes (with non-zero group velocities), and only incoherent (or weakly coherent) addition of valley excitons' spontaneous emission was achieved (17-19), imposing undesired limitations on applications requiring both high spatial and temporal coherence.

Recently, photonic bound states in the continuum (BICs) have provoked extensive research due to merits of extremely high Q-factors, which greatly facilitated light-matter interactions in lasing and nonlinear systems (20, 21). Albeit originally proposed in quantum mechanics (22), BICs are intrinsically a wave phenomenon in which a wave state resides inside the continuous spectrum of extended states but remains perfectly confined in space. Typical examples include the Γ-BICs stemming from a symmetry mismatch between their near-field mode profiles and the corresponding outgoing propagating modes in planar photonic crystal (PhC) slabs (23, 24). Moreover, shaping nonradiative perfect BICs into externally accessible quasi-BICs via symmetry-broken nanostructures has been widely studied for practical applications, such as the tailored chiroptical responses (25-27). However, these demonstrations were either elusive for experimental realization, or they showed an unsatisfactory trade-off between the achievable degrees of circular polarization and the Q-factors for the target modes, preventing them from the construction of coherent spin-optical light sources.

This Example reports on a spin-optical monolayer laser leveraging high-Q spin-valley modes, which are generated from a photonic Rashba effect by breaking the IS of a Kagome PhC slab supporting a Γ-BIC (FIG. 5B). The IS breaking is introduced by controlling the orientation angles of constituting anisotropic nanoholes in the planar Kagome lattice (a spin-like lattice). This leads to a photonic Rashba-type spin splitting of the Γ-BIC into opposite spin-polarized modes at ±K valleys, that is, spin-valley modes (FIG. 5C), which offer the peculiarities of boosted light-matter interaction due to zero group velocities. Moreover, spin-valley microcavities are constructed by interfacing two Kagome lattices with distinct IaS (core, supporting spin-valley modes) and IS (cladding, not supporting spin-valley modes) properties, whereby laterally confined spin-valley resonant modes are created with high Q-factors ($Q_{exp}$~5600). Consequently, coherent light emission can be achieved from valley excitons in an incorporated $WS_2$ monolayer (FIG. 5A), manifested as quasi-single-mode Rashba monolayer lasing with high spatial (diffraction-limited beams) and temporal coherence, as well as inherited topological protection properties from the spin-valley states.

Planar Kagome lattices composed of elliptical nanoholes were fabricated on a $Si_3N_4$ film using electron-beam lithography and reactive-ion etching techniques, followed by the incorporation of a highly crystalline $WS_2$ monolayer supported by a thick poly(methyl methacrylate) (PMMA) layer (FIG. 5E) [see Example 2, below]. The wafer-scale continuous $WS_2$ monolayer was synthesized by a growth-etch metal-organic chemical vapor deposition procedure (typical monolayer characterizations are provided in FIGS. 10A-E), which shows a comparable performance to the exfoliated ones (28). The Kagome lattices were selected because of their rich geometrical frustrations of spins in antiferromagnets (29), which led to highly degenerate ground states with distinct chiral spin structures, such as the two typical configurations exhibiting uniform chirality distribution (IS), a state known as the q=0 state, and staggered chirality distribution (IaS), a state known as the $q=\sqrt{3}\times\sqrt{3}$ state. Accordingly, the orientation angles θ(x, y) of the elliptical nanoholes in the Kagome lattices were implemented following these two spin lattice configurations for either IS or IaS structure, as shown by the scanning electron microscopy (SEM) images in FIGS. 5B-D.

The generation principle of the spin-valley modes via a photonic Rashba effect was first investigated in numerical simulations [see Example 2, below]. FIG. 6A depicts the calculated band structure for a periodic IS Kagome lattice, in which a transverse-electric polarized parabolic band hosting a symmetry-protected Γ-BIC is highlighted by an orange curve. The radiationless BIC ($|\Psi_\Gamma\rangle$) is identified by a missing transmission due to its inhibited coupling to the surrounding environment. Specifically, the vector field (with local linear polarizations) of $|\Psi_\Gamma\rangle$ mainly distributes in the nanoholes (FIG. 6D), and hence $|\Psi_\Gamma\rangle$ can sense a strong IS breaking when the orientation angles of the nanoholes change from the q=0 to the $q=\sqrt{3}\times\sqrt{3}$ configuration. To unveil the emergent spin-split effects under the broken IS, the band structure (FIG. 6B) and the corresponding spin-resolved band structure (FIG. 6C) for the periodic IaS Kagome lattice, were further calculated. Here, the spin information is obtained by calculating the $S_3$ component of the Stokes vector, which describes the degree of circular polarization for each band. It is shown that the spin-degenerate parabolic band hosting $|\Psi_\Gamma\rangle$ splits into three spin-down branches centered at −K points and three spin-up branches centered at K points (only a pair of ±K points can be seen here), manifested as a photonic Rashba effect. For the specific trajectory along −K-Γ-K, the gradient of the geometric phases arising from the space-variant anisotropic nanoholes leads to a Rashba spin splitting $k_R=|2\sigma\nabla_\xi\theta|=4\pi/3a$ (a, lattice constant shown in FIG. 5E), which corresponds to the specific coordinates of ±K points in the first Brillouin zone.

In particular, $|\Psi_\Gamma\rangle$ splits into one spin-down valley mode located at three −K points ($|\Psi_\Gamma\rangle$) and one spin-up valley mode located at three K points ($|\Psi_\Gamma\rangle$), whereby spin-dependent light-matter interaction can be facilitated due to their zero group velocities at the band edges. Specifically, the two spin-valley modes show inverse local spin distributions in real space (middle panels of FIG. 6E), which, in combination with the resultant opposite spin-dependent geometric phases (bottom panels of FIG. 6E), lead to their well-defined spin distributions in momentum space (top panels of FIG. 6E). Robustness analysis of the spin-valley modes under various structural parameters is provided in Example 3, below (see FIGS. 15A-D). The generated spin-valley modes were validated by measuring the transmission spectra of a fabricated IaS Kagome lattice, and the results agree well with the simulations (FIG. 6F).

The system of the present embodiments optionally and preferably comprises optical microcavities for intra-cavity mode selection and shaping. In this Example, heterostructures were constructed by interfacing an IaS (core) and an IS (cladding) Kagome lattice to form spin-valley optical microcavities (FIG. 5A). Both the core and cladding support the Γ-BIC mode $|\Psi_\Gamma\rangle$, while only the core supports the spin-valley modes $|\Psi_{\pm K}\rangle$. This mode mismatch between core (with $|\Psi_{\pm K}\rangle$) and cladding (without $|\Psi_{\pm K}\rangle$) leads to a selective lateral confinement of the spin-valley modes inside the core for high-Q resonances (Q~19 k), namely, spin-valley resonant modes (FIG. 7A). The heterostructure microcavity supports a single dominant resonance locked at the wavelength of the corresponding spin-valley modes (FIG. 7B). This locking effect remains resilient against perturbations introduced by different cavity sizes, shapes, and functionalities [see Example 3, below, section 3], evidencing the topological protection features of the spin-valley microcavities (30, 31). Note that the weak side peak (FIG. 7B) is a second-order transverse mode originated from the spin-valley modes as well (FIG. 18). As a result, the momentum space of the spin-valley resonant mode is dominated by six ±K spots, which follow an alternating spin distribution as the spin-valley modes (insets of FIG. 7B).

Experimentally, resonant modes in the spin-valley microcavities incorporated with a $WS_2$ monolayer were excited by a polarized supercontinuum laser beam, and the cross-polarized transmission spectra were collected from either core or cladding (the "cold" cavity measurements, FIG. 7C) [see Example 2, below]. Due to a good lateral confinement, a narrow resonance (λ=618.2 nm) corresponding to the spin-valley resonant mode is only observed from the core collection, in good agreement with the simulations (FIGS. 7A and 7B). The measured linewidth (half-maximum width of a Lorentz fitting) of the resonance is about Δλ=0.11 nm, which corresponds to a Q-factor of approximately Q=λ/Δλ=5600 (limited by the spectral resolution of the employed spectrometer), being much greater than that (Q~1600) of a pure IaS Kagome lattice without cladding (diameter ~160 μm, FIG. 6F). By simultaneously changing the lattice constants for core and cladding, wavelengths of the spin-valley resonant modes can be controlled to cover the emission wavelengths of the $WS_2$ monolayer, with a measured Q-factor generally being greater than 3000 (right inset of FIG. 7C). The fluctuated Q-factors are attributed to a slightly modified optical quality of the centimeter-scale $WS_2$ monolayer during the transfer process. The spin-resolved transmission spectra were measured for selectively filtered three K or −K spots, and the results simultaneously show a high spin polarization ($\sigma_\pm$) and a large Q-factor for the spin-valley resonant mode (FIGS. 7D-E).

To enable optical gain from the incorporated $WS_2$ monolayer, the core of the spin-valley microcavity was selectively pumped by a linearly polarized continuous-wave laser beam (wavelength of $\lambda_p$=445 nm and spot standard deviation of $\delta_p$≈2.6 μm), whereby both ±K' valley excitons were equally populated at room temperature [see Example 2, below].

Those excited ±K' valley excitons, which radiate as in-plane circularly polarized dipole emitters with opposite helicities, couple to the high-Q spin-valley resonant mode for optical feedback, and lasing can be realized when the achievable optical gain is higher than the system loss. In the present Example, the $WS_2$ monolayer was chosen because the gain medium owing to its relatively high gain coefficients as compared to other TMD monolayers (32), and the moderate pump spot size was adopted to match the field distribution (right panel of FIG. 7A) of the spin-valley resonant mode for a higher modal gain.

Under a high pump fluence of about P=3.6 $kW/cm^2$ (or pump power of 1000 μW), the momentum-space emission intensity distributions of the spin-valley microcavity was first measured according to some embodiments of the present invention for two opposite spin polarizations [$I_{\sigma+}(k_{\|})$ and $I_{\sigma-}(k_{\|})$, FIGS. 8A and 8B], based on which the spin-resolved momentum space was calculated by $S_3(k_{\|})=[I_{\sigma+}(k_{\|})-I_{\sigma-}(k_{\|})]/[I_{\sigma+}(k_{\|})+I_{\sigma-}(k_{\|})]$ (FIG. 8C). Here, $k_{\|}=k_x\hat{x}+k_y\hat{y}$ ($\hat{x}$ and $\hat{y}$ are unit vectors in the corresponding directions) is the in-plane wavevector in momentum space. The sandwich structure, $Si_3N_4/WS_2$/PMMA, ensures a substantial spatial overlap between the spin-valley resonant mode and the $WS_2$ monolayer (referred to as a confinement factor, FIGS. 20A and 20B), as compared to the case without the PMMA encapsulation layer (3). This leads to an effective coupling of the excited valley excitons with the spin-valley microcavity, and highly spin-polarized directional emission spots are observed at ±K points (FIGS. 8A-C). Specifically, the measured standard deviation of the spots is approximately $$\delta_k^m = 0.015k_0, \quad \text{(FIG. 8D)}$$

or an equivalent beam divergence half-angle of 0.86° in free space, which corresponds to a spatial coherence length of the emission from the valley excitons to be $$l_{sc} = 2\pi/(2\delta_k^m)$$

=20.6 μm, a value close to the measured full extension of the spin-valley resonant mode confined in the core (FIG. 8E).

A product of the measured standard deviations for the spin-valley resonant mode in momentum space and in real space $$(\delta_r^m = 3.6\ \mu\text{m})$$

satisfies a diffraction-limited relationship:

$$\delta_k^m \cdot \delta_r^m = 0.55,$$

being close to the limit (=½) imposed by the uncertainty principle. Besides the tailored emission directionality, emission spectrum of the $WS_2$ monolayer also undergoes a remarkable modification due to the presence of the spin-valley microcavity (inset of FIG. 8F). The measured linewidth of the dominant peak is approximately Δλ=0.22 nm (limited by a compromised spectral resolution due to an increased spectrometer entrance slit width for higher light collection), which corresponds to a temporal coherence length of the emission from the valley excitons to be longer than $l_{tc}=\lambda^2/\pi\Delta\lambda$==550 μm. A high spin polarization is observed for the emergent narrow emission peak at ±K points (FIGS. 8F and 8G), consistent with the measured spin-dependent emission intensity distributions (FIG. 8C). Hence, a spin-polarized monolayer light source with characteristic features of high spatial and temporal coherence was achieved leveraging the spin-valley optical microcavity, and further evidence to corroborate its lasing nature is provided below.

To verify the monolayer lasing, the pump power was varied to control the achievable optical gain from the $WS_2$ monolayer, and the measured intensities and linewidths of the dominant emission peak are depicted in FIG. 9A (typical spectral details are provided in FIG. 9B). With the growth of the input pump power, the output emission intensity undergoes a clear nonlinear evolution (an "S shape" light-light curve) accompanied by a progressive linewidth narrowing (narrowing factor of 1.5±0.2), showing hallmark features of lasing around the threshold.

A figure of merit suitable for characterizing the threshold behavior of miniaturized lasers is the spontaneous emission factor (or β-factor) defined as the fraction of spontaneous emission coupled into a desired lasing mode, which can be evaluated by fitting the measured light-light curve using the laser rate equation (black curves in FIG. 9A) [see Example 3, below, section 5]. The optimal fitting gives a β-factor of β≈0.1 and a pump threshold of $P_{th}$=2.0 $kW/cm^2$ (or pump power of 560 μW) defined at the maximum of its first-order derivative (indicated by a vertical line in FIG. 9A), in good agreement with the quantum threshold analysis [see Example 3, below, section 5]. Similar lasing phenomena were also observed from a hexagonal heterostructure microcavity, manifesting a topological protection property against cavity shapes for the spin-valley states (FIGS. 17A-E).

In addition, two-beam interference was conducted to showcase the coherence properties of the monolayer lasing (P=3.6 $kW/cm^2$), and two diffraction-limited spots of the same spin polarization (either two spin-up K spots or two spin-down −K spots) were filtered in momentum space to interfere in real space (shown as schematic in top inset of FIG. 9D) [see Example 2, below]. To enhance the experimental signal-to-noise ratio, the intensity distributions along the direction of the emergent two-dimensional fringes was averaged, and the resultant one-dimensional interference fringes (visibility=0.48) are displayed in the top panel of FIG. 9C. Here, the visibility ($2A_1/A_0$) was calculated from the fast Fourier transform (FFT) amplitudes of the zero-order ($A_0$) and first-order ($A_1$) spatial frequency components of the fringes (pink line in bottom inset of FIG. 9D), the latter of which (fx=2.54 $\mu m^{-1}$) shows good agreement with simulated values determined by the separation angle of the two beams, that is, $1/(\sqrt{3}a)=2.56\ \mu m^{-1}$ [see Example 3, below, section 6]. As a reference, no interference fringes were observed when two different regions outside ±K spots were selected in momentum space to interfere, due to a negligible coherence of the spontaneous emission (FIGS. 21A-F).

Furthermore, the interference scheme presented herein provides a convenient way to characterize the temporal coherence of the monolayer lasing by introducing different time delays between the two beams, which were implemented by inserting glass plates of various thicknesses into one of the beam paths (top inset of FIG. 9D). The measured interference fringes for several different time delays are depicted in FIG. 9C, whereby a temporal coherence length was calculated by fitting the exponentially decaying visibility to be $l_{tc}$=602 μm (FIG. 9D), comparable to the value (~550 μm) obtained from the linewidth analysis. Note that a high Q-factor of the spin-valley resonant mode is advantageous for the observation of Rashba monolayer lasing, and no lasing was observed for cavities with relatively low Q-factors (i.e., Q<2000). It is noted that no lasing was observed when the wavelength of the spin-valley resonant mode was further away (i.e., λ>630 nm) from the exciton transition (about 615 nm) of the $WS_2$ monolayer, due to an insufficient optical gain (3).

By harnessing a high-Q spin-valley resonant mode generated from a photonic Rashba effect, the Inventors report on a spin-optical monolayer laser in a heterostructure microcavity constructed by interfacing two planar Kagome lattices with distinct spatial inversion properties. In addition to the demonstrated IaS $\sqrt{3}\times\sqrt{3}$ spin-like configuration, the system of the present embodiments can be generalized to abundant functionalities, such as beam steering, vortex generation, and holography, by implementing the desired IaS arrangements of the anisotropic nanoholes for intra-cavity mode shaping (FIGS. 16A-F).

These results demonstrate the ability of the system of the present embodiments to be used in integrated spin manipulation systems requiring high Q-factors towards an atomic scale. By controlling the structure anisotropy and the exciton spin relaxation time, an ultrafast operation of the Rashba monolayer laser can be generated. Further studying the in-plane coupling and topological transport between multiple compact spin-valley microcavities can also be conducted to increase the brightness of the Rashba monolayer laser.

In this Example, the photonic Rashba-type spin splitting of a vectorial Γ-BIC leads to a simultaneous generation of two spin-valley modes ($|\Psi_{\pm K}\rangle$) with overlapping field but opposite phase distributions in real space, which form a "classical qubit mode" due to their coherent superposition with equal amplitudes [see Example 3, below, section 7]. The Inventors anticipate a valley-controllable utilization of the Rashba monolayer laser using high-quality TMD monolayers (e.g., free of defects and encapsulated by hexagonal boron nitride) at low temperatures, by means of an imbalanced excitation of ±K' valley excitons via near-resonant circularly polarized pump beams. Inspired by the quantum entanglement achieved from an electronic Rashba effect (33), the architecture of the present embodiments combining valley pseudospins (34, 35) and high-Q spin-valley microcavities (exploring SOI of a photonic Rashba effect in the single-photon limit (4)) realizes sub-Poissonian Rashba monolayer entanglement light sources. To this end, photonic statistics methods, such as second-order coherence, can be used to provide insights into the different emission natures. The monolayer-integrated spin-valley microcavities of the present embodiments can be used as a multidimensional platform to study coherent spin-dependent phenomena in both classical (e.g., lasing, superfluorescence, nonlinearity, and polariton) and quantum (e.g., single-photon sources and entanglement sources) regimes, and can be implemented in optoelectronic devices exploiting both electron and photon spins.

Example 2

Materials and Methods

Synthesis and Characterization of $WS_2$ Monolayer

The $WS_2$ monolayers were synthesized in a 3-inch hot wall customized metal-organic chemical vapor deposition (MOCVD) furnace (CVD Equipment Corporation, Easy Tube 2000), which was equipped with separate bubblers for each MO precursor delivery. One bubbler was loaded with $W(CO)_6$ (Strem chemical, 99.9%) as a precursor for metal source, and the other bubbler was loaded with Di-tert-butyl sulfide (DTBS, sigma Aldrich, 97%) for sulfur source. Both bubblers were loaded with precursors inside a glove box under inert gas environment. Ar (99.9999%) and $H_2$ (99.9999%) were used as carrier and background gases. Prior to the growth, the c-plane sapphire (annealed at 1050° C. for 10 h) substrates were cleaned in an ultrasonicator using acetone and IPA (each for 10 min), followed by drying with a nitrogen gun. The growth of the $WS_2$ monolayers was carried out at a temperature of 850° C. (pressure of 50 torr) for 30 min, and a growth-etch MOCVD (GE-MOCVD) methodology was adopted to obtain the continuous $WS_2$ monolayers with high crystallinity (28). Typical optical microscope, SEM, and atomic force microscopy (AFM) characterization of the as-grown $WS_2$ monolayers are provided in FIGS. 10A-E. More details can be found in (28).

Sample Fabrication

To fabricate the nanostructures, a 120-nm-thick silicon nitride ($Si_3N_4$) film was first grown on a fused silica ($SiO_2$) substrate by low-pressure CVD at approximately 600° C. Prior to fabrication, the $Si_3N_4$ film was thoroughly cleaned with piranha solution and oxygen plasma. Subsequently, a 180-nm-thick poly(methyl methacrylate) (PMMA, 950A4) film serving as the positive-tone electron-beam resist was spin-coated above the $Si_3N_4$ film (baked at 180° C. for 4 min), followed by e-beam evaporation of a 15-nm-thick chromium (Cr) as the conductive layer (FIG. 11, stage A). In the following, the PMMA film was patterned by electron-beam lithography (Raith EBPG, 100 kV) and developed in MIBK/IPA (1:3) solution for 90 s, followed by IPA and water rinse for 90 s and 120 s, respectively. These steps led to the fabrication of the desired mask on the PMMA film (FIG. 11, stage B). Note that the thin Cr conductive layer was removed by a chromium etchant before the development process. To transfer the fabricated pattern on the PMMA mask to the underlying $Si_3N_4$ film, the reactive-ion etching was utilized to etch the uncovered $Si_3N_4$ film. Here, the $Si_3N_4$ etching rate was calibrated to be 19 nm/min under a fluorine-containing gas mixture ($CHF_3$:$SF_6$:$N_2$=9:4:2), and an under-etching thickness (about 50 nm) of the $Si_3N_4$ film was achieved by choosing a desired etching time (FIG. 11, stage C). At last, the PMMA mask was fully removed by organic solvents [acetone and N-Methyl-2-pyrrolidone (NMP)] and oxygen plasma (FIG. 11, stage D), resulting in pure nanostructures upon $Si_3N_4$ film for next-step $WS_2$ monolayer transfer.

To incorporate a $WS_2$ monolayer into the preceding nanostructures, a highly crystalline $WS_2$ monolayer (centimeter-scale size) was synthesized on a sapphire substrate (FIG. 11, stage E), as explained above. The $WS_2$ monolayer was transferred via a well-established surface-energy-assisted process (28). At first, a thick PMMA film (about 1.2 μm) was created by two successive spin-coating processes above the monolayer (each baked at 120° C. for 5 min), which intimately adhered to the monolayer as a supporting layer (FIG. 11, stage F). Afterwards, the PMMA/$WS_2$ assembly was delaminated from the sapphire substrate by harnessing a selective water penetration along the $WS_2$-sapphire interface, giving rise to a free-floating PMMA/$WS_2$ assembly on the water surface (FIG. 11, stage G). The centimeter-scale PMMA/$WS_2$ assembly was scooped out by the fabricated nanostructures under the naked eye (FIG. 11, stage H), resulting in the final architecture of the samples after a delicate baking process (90° C. for 30 min and 120° C. for 10 min, FIG. 11, stage I). Note that the thick PMMA film plays multiple roles in the system of the present embodiments, besides being a supporting layer to the $WS_2$ monolayer during and after the transfer process, it also serves as an index-matching layer to the $SiO_2$ substrate and an encapsulation layer to protect the $WS_2$ monolayer and to increase the confinement factor (3).

Optical Measurements and Data Analysis

Based on the procedures described in FIG. 11, samples of different purposes were fabricated, which samples include large-area (diameter about 160 μm) IaS Kagome lattices for transmission measurements and heterostructure microcavities for "cold" cavity, lasing, and two-beam interference measurements. Details about the measurement methods and the corresponding setups are provided below.

Transmission and "Cold" Cavity Measurements

To measure the transmission spectra of the IaS Kagome lattice at ±K points (FIG. 6F), a broadband laser beam from a supercontinuum source (Fianium, SC450) was focused by a long-working distance objective (Olympus SLMPlan, 10×/NA0.25) to normally illuminate the structure from the substrate side (FIG. 12A). Here, the broadband beam covering a desired wavelength range was achieved by an acousto-optic tunable filter (AOTF) followed by spatial filtering and collimation, and the spot size (covering the whole structure) of the illumination beam was controlled by varying the z location of the focusing objective. Part of the illumination beam would couple to the modes supported by the planar structures, and their forward scattered light was collected by a high-NA oil-immersion objective (Olympus PlanApo N, 60×/NA1.42) for real-space and momentum-space processing and measurements via well-placed lenses. Specifically, xy-position-adjustable home-made pinholes (FIG. 12B) were inserted at an intermediate momentum-space plane for spatial filtering, and an electron-multiplying charge-coupled device (EMCCD, Andor iXon) was used for real-time pinhole position monitoring (also for momentum-space imaging).

Alternatively, a multimode fiber-connected spectrometer (Horiba, iHR320) was used for real-space spectrum measurements, and its spectral resolution was about 0.11 nm under an entrance slit width of 100 μm. Note that the PMMA encapsulation layer (FIG. 11, stage I), which shares a close refractive index to the immersion oil (Thorlabs OILCL30, n=1.52), not only prevented a direct contact between the $WS_2$ monolayer and the immersion oil but also protected the $WS_2$ monolayer from potential isopropanol damages during the oil-cleaning procedures, and thus no performance degradation of the $WS_2$ monolayer happened during the measurements.

To suppress the directly transmitted light and highlight the scattered light from the nanostructures, the inventors employed a cross-polarized resonant scattering technique, in which the illumination beam was set to a certain polarization state and only the scattered light at its orthogonal polarization state was collected. For the spin-dependent transmission measurements at K (−K) point (FIG. 6F), a home-made single-point pinhole (leftmost panel of FIG. 12B) was employed to select one K (−K) spot in momentum space, and the illumination beam was set to $\sigma_{\mp}$ polarization to measure the $\sigma_{\pm}$ component of the transmission. Here, the incident $\sigma_{\mp}$ beams were generated by a circular polarizer (a linear polarizer followed by a quarter-wave plate), while the collected $\sigma_{\pm}$ components were discriminated by a circular analyzer (a quarter-wave plate followed by a linear polarizer).

A similar procedure was adopted to measure the "cold" cavities, except for the following changes. First, the spot size of the illumination beam was decreased to selectively cover the core of the heterostructure microcavity. Second, a stop aperture (a commercially available pinhole with a diameter of 800 μm) was inserted at an intermediate real-space plane to select only the core or cladding of the heterostructure for spectrum measurements (FIG. 7C). Besides, a home-made six-point pinhole (rightmost panel of FIG. 12B) was employed to select all ±K spots, and a y-polarized incident beam was used to illuminate the structure; that is, only the x-polarized scattered light was collected for spectrum (FIG. 7C) and imaging (inset of FIG. 7D) measurements. Moreover, a home-made three-point pinhole (third panel of FIG. 12B) was used to select the three K (−K) spots, and $\sigma_{\mp}$ beam was employed as the incidence to measure the $\sigma_{\pm}$ component of the three K (−K) spots (FIGS. 7D and 7E).

Lasing Measurements

Similar to the setup shown in FIG. 12A, a y-polarized pump beam from a continuous-wave laser (TOPTICA, 445-S) first passed through a bandpass filter and a short-pass filter to eliminate any spectral residual at the emission wavelengths of the $WS_2$ monolayer (FIG. 13). Subsequently, the spectrally filtered pump beam was focused into a desired spot size (half-maximum diameter≈6 μm by CCD imaging and Gaussian fitting) to excite the incorporated $WS_2$ monolayer from the substrate side. The generated valley excitons would interact with the modes supported by the planar structures, and the scattered emission was collected by a high-NA oil-immersion objective and spectrally filtered for real-space and momentum-space processing and measurements. Specifically, a long-pass filter (cut-off wavelength of 600 nm) was inserted when emission spectra were measured, and a bandpass filter (central wavelength of 620 nm and half-maximum bandwidth of 10 nm) was inserted when momentum-space images were captured. To increase the experimental signal-to-noise ratio (SNR), a stop aperture was used to select only the core of the heterostructure microcavity, and spatial filtering by a six-point pinhole (FIG. 8A) or three-point pinhole (FIGS. 8E-F) was used for the spin-dependent measurements, in which opposite spin-polarized emission was discriminated by a circular analyzer. Note that a uniform background (originating from both EMCCD dark counts and $WS_2$ monolayer emission without interacting with the structure (19)) was removed in the calculation of the momentum-space $S_3$ distribution (FIG. 8C).

To measure the real-space image of the spin-valley resonant mode (FIG. 8E), the EMCCD was placed at the spectrometer location and a six-point pinhole was used for the spatial filtering. A variable neutral density filter was used to change the pump power in the light-light curve measurements, where the power was measured by a photodiode power sensor (Thorlabs, PM100D and S130C) with a resolution of 100 pW (the pump fluence was calculated using the spot area from the measured half-maximum diameter). Note that the entrance slit width of the spectrometer was intentionally increased (=400 μm) to achieve a higher monolayer lasing collection, which resulted in an artificial broadening of the narrow peaks in these measurements (FIGS. 8F-G, 9A, and 9B), with a compromised spectral resolution about 0.22 nm. Also note that no PL was measured from other materials ($SiO_2$ substrate, $Si_3N_4$ film, PMMA layer, and immersion oil) under the largest pump power in the lasing measurements.

Two-Beam Interference Measurements

Compared to the lasing measurement setup shown in FIG. 13, a magnification unit in which the emergent interference fringes were magnified by an objective (Olympus SLMPlan, 10×/NA0.25) and captured by an EMCCD (shaded part of FIG. 14) was built. Specifically, the pump power was adjusted to be 3.6 kW/cm$^2$, and a two-point pinhole was utilized to select two spin-up K spots in momentum space to interfere in real space, as highlighted by the two circular parts in FIG. 14. More details about the interference scheme can be found in Section 6. To preclude the contribution from a uniform PL background in momentum space, a reference interference measurement (FIG. 21B) was conducted by moving the two-point pinhole into the background region after each lasing interference measurement, and the difference between these two measurements was regarded as the interference fringes from the Rashba monolayer lasing (FIG. 9C). Moreover, the inventors averaged the intensity distributions along the direction of the two-dimensional interference fringes to increase the experimental SNR. In the characterization of the temporal coherence length of the Rashba monolayer lasing, glass plates (n=1.46) of various thicknesses were inserted after one K spot, which led to an exponential decay of the fringe visibilities due to the introduced time delays between the two beams. Note that the non-unity transmittance (about 92%) of the glass plate has a negligible influence (<0.001 in theory) on the fringe visibility.

Numerical Simulations

The simulations were implemented using a commercial finite-difference time-domain (FDTD) solver (Lumerical FDTD Solutions). To calculate the (spin-dependent) band structures for the periodic IS and IaS Kagome lattices (FIGS. 6A-C), the Bloch boundaries were used in the x and y directions, and the perfectly matched layer (PML) boundaries were used in the z direction of the corresponding unit cells. The structural parameters were set according to the description in FIG. 5C. The refractive indices of the $SiO_2$ substrate, $Si_3N_4$ film, PMMA layer, and air were n=1.46, 1.98, 1.49, and 1.0, respectively, and no material dispersion and absorption was considered in the desired visible spectral region (610-630 nm). Each structure was successively illuminated by two broadband plane waves of $\sigma_\pm$ polarizations to calculate the spin-dependent transmission spectra ($T_{\sigma\pm}$) along high symmetric points of the first Brillouin zone. Furthermore, to obtain the transmission solely from the nanostructures, a spin-independent background ($T_{bg}$) resembling a Fabry-Perot oscillation in a uniform $Si_3N_4$ slab was subtracted from the calculated transmission spectra (23), that is, $T'_{\sigma\pm}=-(T_{\sigma\pm}-T_{bg})$. For the two band structures shown in FIGS. 6A and 6B, the transmission was defined as $T=(T'_{\sigma+}+T'_{\sigma-})/2$. For the spin-polarized band structure shown in FIG. 6C, the $S_3$ values were calculated by $S_3=(T'_{\sigma+}-T'_{\sigma-})/(T'_{\sigma+}+T'_{\sigma-})$. Because of the coherent superposition of the two spin-valley modes ($|\Psi_{\pm K}\rangle$) (see Section 7 for more details), either K or −K incidence results in the simultaneous excitation of both spin-valley modes in the near field. Fortunately, the two spin-valley modes are well-separated in momentum space, and thus the inventors conducted inverse Fourier transform to the filtered three K (−K) spots to obtain the near-field distributions for $|\Psi_K\rangle$ ($|\Psi_{\bar{K}}\rangle$) (FIG. 6E), a way similar to the "spatial filtering" the inventors did in the experiments (FIG. 13).

To simulate the spin-valley resonant modes supported by the heterostructure microcavities, the PML boundaries were applied to all the three directions, and anti-symmetric boundaries were employed in the x direction due to structure mirror symmetry. Resonant modes in the microcavities were excited by a broadband in-plane linear dipole emitter located at the cavity center, and the spectra of the resonant modes were obtained by Fourier transforming the time signals (FIG. 7B). Meanwhile, Q-factors of the desired resonant modes were obtained by fitting the decaying envelope of the time signals using a built-in analysis in FDTD. After obtaining the momentum-space electric field [$U_x(k_\parallel)$ and $U_y(k_\parallel)$] by Fourier transforming the monitored near-field electric field [$E_x(r)$ and $E_y(r)$] at the wavelength of the spin-valley resonant mode, the momentum-space $S_3$ distribution was calculated by $S_3(k_\parallel)=-2\mathrm{Im}(U_xU^*_y)/(|U_x|^2+|U_y|^2)$, in which Im( ) refers to the calculation of the imaginary part, and the asterisk denotes the complex conjugate (insets of FIG. 7B). To reveal the different lateral confinement for the Γ-BIC ($|\Psi_\Gamma\rangle$) and the spin-valley modes ($|\Psi_{\pm K}\rangle$) at the same wavelength (FIG. 7A), the momentum-space electric field was first calculated, and an inverse Fourier transform of the filtered higher-order Γ spots or ±K spots was conducted to obtain the corresponding near-field distribution.

Note that the $WS_2$ monolayer was ignored in these three-dimensional (3D) simulations due to a severely increased simulation time. The incorporation of the atomic-scale monolayer (n=5.25 (21)) mainly results in a slight red shift (about 3.5 nm) of the modes under the transparency condition (no material loss), as verified by simulated transmission spectra at ±K points. Hence, for simplicity, the simulated spectra were always red shifted by such a value in order to compare with the measurements incorporated with a $WS_2$ monolayer.

Example 3

1 Hamiltonian of Photonic Rashba Effect

The engineered Hamiltonian and artificial gauge field for the photonic Rashba effect are inspired by those in solid-state physics. In electronics, to describe the motion of a charged particle (charge of q and mass of m) in an external magnetic field B (B=∇×A with A being the vector potential), the well-established Hamiltonian is expressed as $$H = \frac{1}{2m}(\hat{p} - qA)^2. \qquad \text{(EQ. 1)}$$

Here, $\hat{p}$ is the momentum operator defined as $\hat{p}=-i\hbar\nabla$ (i-imaginary unit and $\hbar$-reduced Planck constant), and the term in the parenthesis ($\hat{p}$−qA) is referred to as a generalized momentum.

On the other hand, to describe the evolution of an electromagnetic wave in a deformed space (such as the reference frame rotation in the present Example), the derived Helmholtz equation in such a non-inertial reference frame is formulated as $(-\nabla^2+2k\sigma\nabla_\xi\theta)\Psi_\sigma(r)=k^2\Psi_\sigma(r)$ (14). Here, k is the wave number, σ is the helicity (σ=±1) of light, θ(ξ) is the local orientation angles along a predefined trajectory $\xi$ in the deformed space, $\nabla_\xi$ is the spatial gradient along trajectory $\xi$, and $\Psi_\sigma(r)$ is the spin-dependent wave function. Equivalently, this expression can be rewritten in a form similar to the Schrödinger equation $$[(-i\nabla+\sigma\nabla_\xi\theta)^2-(\nabla_\xi\theta)^2]\Psi_\sigma(r)=k^2\Psi_\sigma(r). \qquad \text{(EQ. 2)}$$

Consequently, an engineered Hamiltonian can be defined for the photonic Rashba effect as $$H_{Rashba}=(-i\nabla+\sigma\nabla_\xi\theta)^2. \qquad \text{(S3)}$$

and the term $(\nabla_\xi\theta)^2$ serves as a small correction to the Hamiltonian and manifests as a Rashba energy shift (36). Comparing Eq. S1 and Eq. S3, it can be seen that the Coriolis term $-\sigma\nabla_\xi\theta$ behaves similarly as the vector potential qA, and a spin-split dispersion (that is, the photonic Rashba effect) can be observed in momentum space due to the analogous spin-dependent generalized momentum.

Note that, due to the presence of the small correction term $(\nabla_\xi\theta)^2$, the simulated wavelengths of the spin-valley modes and the corresponding Γ-BIC mode (FIG. 6B) in the IaS Kagome lattice are slightly larger (about 1.5 nm) than that of the Γ-BIC mode (FIG. 6A) in the IS Kagome lattice. This little wavelength difference can be easily compensated (if necessary) by slightly changing the lattice constant or nanohole size in the IaS Kagome lattice, such as the simulation to show different lateral confinement for the Γ-BIC mode and the spin-valley modes (FIG. 7A).

2 Robustness of Spin-Valley Modes Under Various Structural Parameters

The high-Q spin-valley modes stably exist under various structural parameters of the periodic IaS Kagome lattice, such as different nanohole morphologies (size, ellipticity, and depth) and lattice constants (FIGS. 15A-D). To ease the fabrication, the nanohole morphologies (radius of R=56.3 nm, short/major axis ratio of e=0.7, and depth of h=70 nm) were separately optimized and fixed, and the lattice constant (from a=226 nm to 234 nm) was varied for a series of structures to cover the exciton emission peak of the $WS_2$ monolayer.

3 Topological Protection Effects

Topological Protection Features of the Spin-Valley Microcavities

Originated from the spin splitting of a topologically protected Γ-BIC mode (topological charge of two) (24), the generated spin-valley states also show certain topological protection features. Specifically, the heterostructure microcavities always support single dominant high-Q resonances locked at the wavelength of the corresponding spin-valley modes, and this locking effect remains resilient against different cavity sizes, functionalities, and shapes (FIGS. 16A-B). Consequently, besides the demonstrated diffraction-limited spin-polarized ±K beams, new functionalities can be naturally generalized by implementing desired IaS arrangements of the anisotropic nanoholes for intra-cavity mode shaping, such as the spiral and linear geometric phase distributions for orbital angular momentum beams (FIG. 16C) and beam steering (FIG. 16D), respectively. Moreover, the cavity size independence offers the possibilities to further downscale the lateral dimensions of heterostructure microcavities for more compact Rashba monolayer light sources, and the cavity shape independence makes the heterostructure microcavities suitable for different application scenarios.

Rashba Monolayer Lasing From a Hexagonal Spin-Valley Microcavity

As explained above, the high-Q spin-valley resonant modes can also be supported in heterostructure microcavities with different shapes, such as the hexagonal one (FIG. 16F). The hexagonal heterostructure microcavity covered with a $WS_2$ monolayer was fabricated in the experiment, and the inventors also verified its lasing emission by hallmark features including nonlinear light-light curve (FIG. 17A), linewidth narrowing (FIG. 17B), and well-defined spin-polarized emission spots (FIGS. 17C-E). Compared to the triangular Rashba monolayer laser (wavelength of 618.2 nm and pump threshold of 2.0 kW/cm$^2$) shown in Example 1, the hexagonal one shows a similar lasing wavelength (=617.8 nm) and a close pump threshold (=1.8 kW/cm$^2$). These results provide further experimental evidence about the topological protection property against cavity shapes for the spin-valley states.

4 Second-Order Transverse Mode in Triangular Heterostructure Microcavity

FIG. 18 shows simulated real-space intensity distribution for the second-order transverse mode, which corresponds to the weak side peak shown in FIG. 7B. This resonant mode also originates from the spin-valley modes, as confirmed by its zoomed-in electric field distribution (inset). In addition to the presence of lobes, this second-order transverse mode only possesses one third of the Q-factor of the fundamental spin-valley resonant mode in simulations.

5 Laser Rate Equation Analysis

To analyze the threshold behavior of the Rashba monolayer laser, the inventors adopted the following coupled rate equations to describe the dynamics of the carrier density N and the photon density P under different optical pump powers R (2, 6):

$$\begin{cases} \dfrac{dN}{dt} = \dfrac{\eta R}{E_{ph}V_a} - \dfrac{(1-\beta_0)N}{\tau_{sp}} - \dfrac{F\beta_0 N}{\tau_{sp}} - gP \\ \dfrac{dP}{dt} = -\gamma P + \Gamma F\beta_0\dfrac{N}{\tau_{sp}} + \Gamma gP \end{cases}. \qquad \text{(EQ. 4)}$$

Here, t is the time, $\eta$ is the fraction of pump power absorbed by the $WS_2$ monolayer on nanostructures, $E_{ph}$ is the energy of a single pump photon, $V_a$ is the active gain volume of the $WS_2$ monolayer, F is the Purcell factor, $\beta_0$ is the spontaneous emission factor in the absence of the Purcell effect ($\beta=F\beta_0/[1+(F-1)\beta_0]$ when the Purcell effect is considered), $\tau_{sp}$ is the spontaneous emission lifetime, $\gamma=1/\tau_p$ is the cavity photon loss rate ($\tau_p$, photon lifetime), Γ is the confinement factor, and $g=g_0(N-N_{tr})$ is the material gain in which $g_0$ is the gain coefficient and $N_{tr}$ is the transparency carrier density (for simplicity (2, 3), $N_{tr}$ is set to be zero due to its verified negligible influence on the light-light curve fitting and threshold analysis). Values of these parameters in the rate equations can be found in Table 1, below, and calculations or measurements of several parameters ($\gamma$, $\eta$, F, Γ, and $\tau_{sp}$) are provided in the following subsections.

The coupled rate equations were solved under the steady state condition (dN/dt=0 and dP/dt=0) of continuous pump. To fit the experimental data, two relatively independent parameters are tweaked: $g_0$ controls the position of the fitting curve (with respect to the pump power axis) and β controls the shape of the fitting curve. The optimal fitting is highlighted by the green curve in FIG. 19A, which corresponds to fitting parameter values $g_0=3.25\times10^{-12}$ $m^3/s$ and β=0.1. Based on the optimal fitting, two different methods are adopted to evaluate the lasing threshold (37): the former (latter) defines the pump threshold at the derivative maximum of d[log(P)]/d[log(R)] ($d^2P/dR^2$), as shown by the cyan and orange curves in FIG. 19B, respectively. These two definitions give a different lasing threshold of 560 μW and 445 μW (indicated by dashed vertical lines in FIG. 19B). It will be shown later that the threshold defined at the derivative maximum of d[log(P)]/d[log(R)] is closer to the quantum threshold analysis, and hence it is used as the pump threshold of the Rashba monolayer laser, that is, $R_{th}$=560 μW (or pump fluence of 2.0 $kW/cm^2$).

The quantum threshold condition represents a system state that the stimulated emission starts to overtake the spontaneous emission, and a unity of mean photon numbers ($P_cV_a=1$) exists in the system. Based on the solution of the laser rate equation, the quantum threshold can be deduced to be (EQ. 5)

$$R_{qth} = \frac{E_{ph}}{\tau_p \Gamma \eta}\left[\frac{\overbrace{\frac{F\beta_0 N_c}{\tau_{sp}} + g_0 N_c P_c}^{\text{Lasing mode emission}}}{\underbrace{\frac{(1-\beta_0)N_c}{\tau_{sp}} + \frac{F\beta_0 N_c}{\tau_{sp}} + g_0 N_c P_c}_{\text{Total emission}}}\right]^{-1} = \frac{E_{ph}}{\tau_p \Gamma \eta \beta_{tot}}.$$

The term in the brackets, denoted as the $\beta_{tot}$, describes the fraction of emission that participates in the lasing process when material gain is considered ($\beta_{tot}=\beta$ if $g_0=0$). By substituting parameter values from the optimal fitting, Equation S5 gives a quantum threshold of $R_{qth}$=574 μW (or pump fluence of 2.1 $kW/cm^2$), in good agreement with the preceding threshold defined at the derivative maximum of d[log(P)]/d[log(R)].

Cavity Photon Loss Rate

The cavity photon loss rate was calculated according to $$\gamma = 2\pi/\left(Q\frac{\lambda}{c}\right),$$

in which Q and λ are the measured Q-factor and wavelength of the Rashba monolayer lasing, respectively. As explained in the "lasing measurements" section, the entrance slit width (=400 μm) of the spectrometer was intentionally increased to achieve a higher monolayer lasing collection, which led to an artificial broadening of the narrow peaks as compared to those measured in the "cold cavity" experiments. Hence, the measured linewidth of the spin-valley resonant mode from the "cold cavity" characterizations (FIGS. 7C-E) was used to evaluate the Q-factor (about 6000) of the Rashba monolayer lasing more accurately.

$WS_2$ Monolayer Absorption on Nanostructures

When a $WS_2$ monolayer is incorporated into a heterostructure microcavity, it becomes difficult to collect all the non-absorbed pump beam to evaluate the fraction of absorption, owing to the unavoidable in-plane coupling and out-of-plane diffractions. Hence, only the fraction of pump power absorbed by a $WS_2$ monolayer on a flat $Si_3N_4$ film (FIG. 19C) measured, and the absorption enhancement from nanostructures was calculated by simulations (FIG. 19D). From the measured absorption spectrum shown in FIG. 19C, it is clear to see an exciton absorption peak around 610 nm, and the fraction of absorption at the pump wavelength ($\lambda_p$=445 nm) is about $\eta_0$=8%.

The absorption enhancement is evaluated by the field enhancement of the pump beam as $\alpha=|E_\parallel/E_0|^2$, in which $E_0$ and $E_\parallel$ are amplitudes for the incident pump beam and the resultant in-plane near field of the nanostructures at the monolayer plane (assumed to be 1 nm above the nanostructure surface), respectively. In the simulations, a y-polarized plane wave (λ=445 nm) illuminates a periodic IaS Kagome lattice at a normal angle, and the calculated absorption enhancement in one unit cell is depicted in FIG. 19D. The largest absorption enhancement is approximately two, and an averaged enhancement over the whole unit cell ($\langle\alpha\rangle$=1.3) is used to calculate the fraction of pump power absorbed by the $WS_2$ monolayer above the nanostructures, that is, $\eta=\eta_0\langle\alpha\rangle$=10%.

Purcell Factor

The Purcell factor describes the decay rate enhancement of an emitter due to modification to its surrounding environment, which can be evaluated using the following formula $$F_m = \frac{3Q}{4\pi^2 V_{eff}}\left(\frac{\lambda}{n}\right)^3, \quad \text{(EQ. 6)}$$

in which n is the refractive index of the surrounding environment and $V_{eff}$ is the mode volume of the spin-valley resonant mode expressed as $$V_{eff} = \frac{\int_V \varepsilon(r)|E(r)|^2 dV}{\max\{\varepsilon(r)|E(r)|^2\}}. \quad \text{(EQ. 7)}$$

Here, ε(r) is the dielectric constant distribution of the heterostructure microcavity, |E(r)| is the electric field strength, and max { } refers to the maximum value. In the present Example, the calculated mode volume is about $V_{eff}=135\ (\lambda/n)^3$, based on which Equation 16 gives a maximum achievable Purcell factor of $F_m$=3.3. Considering that the monolayer does not locate at the maximum of the electric field intensity distribution in the z direction, a correction factor $$\left(\left|\frac{E_{WS_2}}{E_{max}}\right|^2 \approx 0.66\right)$$

is multiplied to calculate the Purcell factor more accurately, that is, $F=0.66\ F_m=2.2$.

Confinement Factor

The confinement factor describes the fraction of photons within a cavity that can interact with the gain material to generate stimulated photons. In the present Example, the confinement factor is calculated from 3D FDTD simulations according to $$\Gamma = \frac{\int_{WS_2} \varepsilon_{WS_2} |E_{\parallel}(r)|^2 dV}{\int_{cavity} \varepsilon(r) |E(r)|^2 dV}, \quad \text{(EQ. 8)}$$

in which $\varepsilon_{WS_2}$ is the measured dielectric constant of the $WS_2$ monolayer (21), and $|E_{\parallel}(r)|$ is the in-plane electric field located at the monolayer plane. Due to the extremely fine meshes required to resolve the incorporated monolayer (thickness of 0.618 nm), it becomes very time-consuming to simulate a 3D heterostructure microcavity, and thus only the confinement factor is estimated by simulating one unit cell of a period IaS Kagome lattice (i.e., core of the heterostructure microcavity). The left panel of FIG. 20A depicts the simulated electric field distribution on a x-z cross section, which shows a substantial overlapping between the spin-valley modes and the $WS_2$ monolayer ($\Gamma=1.2\%$). As a reference, the confinement factor is reduced by 42% ($\Gamma=0.7\%$) when the PMMA encapsulation layer is removed, due to a less extended field distribution towards the monolayer side. To further increase the confinement factor, designing sandwich structures by incorporating the $WS_2$ monolayer at the field maximum might be a feasible approach.

Spontaneous Emission Lifetime

The spontaneous emission lifetime of excitons in the $WS_2$ monolayer was measured by a time-correlated single photon counting module (PicoQuant, HydraHarp 400). A pulsed laser beam (wavelength of 405 nm and pulse duration of 55 ps) was used to excite the $WS_2$ monolayer, and the measured time-resolved PL spectrum is depicted in FIG. 20B. The fitted lifetime is about $\tau_{sp}=1.92$ ns, a value comparable to those measured from high-quality exfoliated $WS_2$ flakes (28).

TABLE 1

Definitions and values of the parameters in the laser rate equation

| Parameters | Descriptions | Values |
|---|---|---|
| $\eta$ | Fraction of absorbed pump power | 10% |
| $E_{ph}$ | Energy of a single pump photon | $4.46 \times 10^{-19}$ J |
| $\tau_{sp}$ | Spontaneous emission lifetime | 1.92 ns |
| $\gamma$ | Cavity photon loss rate | $5.08 \times 10^{11}$ $s^{-1}$ |
| $\beta$ | Spontaneous emission factor | 0.1 |
| $\Gamma$ | Confinement factor | 1.2% |
| F | Purcell factor | 2.2 |
| Q | Q-factor | 6000 |
| $V_a$ | Active gain volume | $1.75 \times 10^{-2}$ $\mu m^3$ |
| $g_0$ | Gain coefficient | $3.25 \times 10^{-12}$ $m^3/s$ |

6 Interference in Simulations and Reference Measurements

Coherence is a criterion that distinguishes lasing from spontaneous emission. In the system of the present embodiments, two-beam interference was conducted to characterize both the spatial and temporal coherence of the Rashba monolayer lasing (FIGS. 9C and 9D). This was achieved by filtering two spin-up K spots in momentum space to interfere in real space, and the measured interference fringes agree with the simulated ones from a heterostructure microcavity (FIG. 21A). Note that the reduced visibility (about 0.48) in the measurement (compared to a unity visibility in the fully coherent simulation here) is attributed to the limited experimental SNR and the transfer function of the measurement system, a phenomenon also observed for other coherent light sources (such as (6)). Similar interference fringes can be observed when two spin-down −K spots are filtered in momentum space to interfere (FIG. 21B). However, when one spin-up K spot and one spin-down −K spot are filtered in momentum space to interfere, a nearly uniform intensity distribution (with space-variant local linear polarizations) emerges in real space, and the interference fringes can be observed by choosing any linear polarization bases, such as the y-polarized intensity distribution shown in FIG. 21C. Such a polarization projection results in a twofold decrease of the fringe intensities, and thus this interference scheme is not adopted in the experiment due to the goal of a higher SNR.

As a reference, no interference fringes were measured when two regions outside the ±K spots were filtered in momentum space to interfere (FIG. 21D). The absence of the periodic interference fringes is also confirmed by a zero FFT amplitude ($A_1=0$) for the first-order spatial frequency component (FIG. 21E). This phenomenon is attributed to the fact that only incoherent spontaneous emission exists at background regions outside the ±K spots, as validated by the measured linear light-light curve in FIG. 21F, in contrast to the measured interference fringes and nonlinear light-light curve for the Rashba monolayer lasing (FIGS. 9A-D).

7 Coherent Superposition of Spin-Valley Modes

As revealed in Example 1, the photonic Rashba-type spin splitting of a vectorial Γ-BIC mode results in the simultaneous generation of two spin-valley modes ($|\Psi_{\pm K}\rangle$) with opposite spin polarizations. The two modes show overlapped field but opposite geometric phase distributions [$\pm\phi_g(r)$] in real space (FIG. 6E), which leads to the formation of a "classical qubit mode" due to their coherent superposition with equal amplitudes, that is, $|\Psi_{cqb}\rangle = e^{-i\phi_g(r)}|\Psi_K\rangle + e^{i\phi_g(r)}|\Psi_{-K}\rangle$. To verify the superposition in simulations, a periodic IaS Kagome lattice was excited by in-plane dipole emitters of left-handed circular polarization, right-handed circular polarization, or linear polarization (with an identical emitting energy), and the results are depicted in the left, middle, and right columns of FIG. 22, respectively. Irrespective of the dipole polarizations, the two spin-valley modes are always equally excited to form the "classical qubit mode". Nevertheless, a doubled mode intensity is achieved when linearly polarized dipole emitters (or equivalently, an equal combination of left- and right-handed circularly polarized dipole emitters) are implemented for excitation, due to a matched polarization to the "classical qubit mode". Otherwise, half of the circular dipole emitters' energies are lost due to the polarization projection, and this phenomenon also leads to a valley-controllable performance of the Rashba monolayer laser, by exploiting an imbalanced excitation of ±K' valley excitons under low temperatures.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

REFERENCES

[1] N. Shitrit, I. Yulevich, E. Maguid, D. Ozeri, D. Veksler, V. Kleiner, E. Hasman, Spin-optical metamaterial route to spin-controlled photonics. *Science* 340, 724-726 (2013).

[2] S. Wu, S. Buckley, J. R. Schaibley, L. Feng, J. Yan, D. G. Mandrus, F. Hatami, W. Yao, J. Vučković, A. Majumdar, X. Xu, Monolayer semiconductor nanocavity lasers with ultralow thresholds. *Nature* 520, 69-72 (2015).

[3] Y. Ye, Z. J. Wong, X. Lu, X. Ni, H. Zhu, X. Chen, Y. Wang, X. Zhang, Monolayer excitonic laser. *Nat. Photonics* 9, 733-737 (2015).

[4] T. Stay, A. Faerman, E. Maguid, D. Oren, V. Kleiner, E. Hasman, M. Segev, Quantum entanglement of the spin and orbital angular momentum of photons using metamaterials. *Science* 361, 1101-1104 (2018).

[5] Y. Liu, H. Fang, A. Rasmita, Y. Zhou, J. Li, T. Yu, Q. Xiong, N. Zheludev, J. Liu, W. Gao, Room temperature nanocavity laser with interlayer excitons in 2D heterostructures. *Sci. Adv.* 5, eaav4506 (2019).

[6] E. Y. Paik, L. Zhang, G. W. Burg, R. Gogna, E. Tutuc, H. Deng, Interlayer exciton laser of extended spatial coherence in atomically thin heterostructures. *Nature* 576, 80-84 (2019).

[7] M. Lindemann, G. Xu, T. Pusch, R. Michalzik, M. R. Hofmann, I. Žutić, N. C. Gerhardt, Ultrafast spin-lasers. *Nature* 568, 212-215 (2019).

[8] N. C. Zambon, P. St-Jean, M. Milieevie, A. Lemaitre, A. Harouri, L. L. Gratiet, O. Bleu, D. D. Solnyshkov, G. Malpuech, I. Sagnes, S. Ravets, A. Amo, J. Bloch, Optically controlling the emission chirality of microlasers. *Nat. Photonics* 13, 283 (2019).

[9] E. I. Rashba, Properties of semiconductors with an extremum loop. 1. Cyclotron and combinational resonance in a magnetic field perpendicular to the plane of the loop. *Sov. Phys. Solid State* 2, 1109-1122 (1960).

[10] K. Ishizaka, M. S. Bahramy, H. Murakawa, M. Sakano, T. Shimojima, T. Sonobe, K. Koizumi, S. Shin, H. Miyahara, A. Kimura, K. Miyamoto, T. Okuda, H. Namatame, M. Taniguchi, R. Arita, N. Nagaosa, K. Kobayashi, Y. Murakami, R. Kumai, Y. Kaneko, Y. Onose, Y. Tokura, Giant Rashba-type spin splitting in bulk BiTeI. *Nat. Mater.* 10, 521-526 (2011).

[11] N. Dahan, Y. Gorodetski, K. Frischwasser, V. Kleiner, E. Hasman, Geometric Doppler effect: Spin-split dispersion of thermal radiation. *Phys. Rev. Lett.* 105, 136402 (2010).

[12] M. V. Berry, Quantal phase factors accompanying adiabatic changes. *Proc. R. Soc. London. Ser. A* 392, 45-57 (1984).

[13] Z. Bomzon, G. Biener, V. Kleiner, E. Hasman, Space-variant Pancharatnam-Berry phase optical elements with computer-generated subwavelength gratings. *Opt. Lett.* 27, 1141-1143 (2002).

[14] Y. Gorodetski, S. Nechayev, V. Kleiner, E. Hasman, Plasmonic Aharonov-Bohm effect: Optical spin as the magnetic flux parameter. *Phys. Rev. B* 82, 125433 (2010).

[15] J. Martin-Regalado, F. Prati, M. San Miguel, N. B. Abraham, Polarization properties of vertical-cavity surface-emitting lasers. IEEE J. Quantum Electron. 33, 765-783 (1997).

[16] D. Xiao, G.-B. Liu, W. Feng, X. Xu, W. Yao, Coupled spin and valley physics in monolayers of $MoS_2$ and other group-VI dichalcogenides. *Phys. Rev. Lett.* 108, 196802 (2012).

[17] S.-H. Gong, F. Alpeggiani, B. Sciacca, E. C. Garnett, L. Kuipers, Nanoscale chiral valley-photon interface through optical spin-orbit coupling. *Science* 359, 443-447 (2018).

[18] L. Sun, C.-Y. Wang, A. Krasnok, J. Choi, J. Shi, J. S. Gomez-Diaz, A. Zepeda, S. Gwo, C.-K. Shih, A. Alù, X. Li, Separation of valley excitons in a $MoS_2$ monolayer using a subwavelength asymmetric groove array. *Nat. Photonics* 13, 180-184 (2019).

[19] K. Rong, B. Wang, A. Reuven, E. Maguid, B. Cohn, V. Kleiner, S. Katznelson, E. Koren, E. Hasman, Photonic Rashba effect from quantum emitters mediated by a Berry-phase defective photonic crystal. *Nat. Nanotechnol.* 15, 927-933 (2020).

[20] A. Kodigala, T. Lepetit, Q. Gu, B. Bahari, Y. Fainman, B. Kanté, Lasing action from photonic bound states in continuum. *Nature* 541, 196-199 (2017).

[21] X. Ge, M. Minkov, S. Fan, X. Li, W. Zhou, Laterally confined photonic crystal surface emitting laser incorporating monolayer tungsten disulfide. *npj 2D Mater. Appl.* 3, 16 (2019).

[22] J. V. Neumann, E. Wigner, Uber merkwürdige diskrete Eigenwerte. *Phys. Zeitschr.* 30, 465-467 (1929).

[23] S. Fan, J. D. Joannopoulos, Analysis of guided resonances in photonic crystal slabs. *Phys. Rev. B* 65, 235112 (2002).

[24] B. Zhen, C. W. Hsu, L. Lu, A. D. Stone, M. Soljačić, Topological nature of optical bound states in the continuum. *Phys. Rev. Lett.* 113, 257401 (2014).

[25] K. Koshelev, S. Lepeshov, M. Liu, A. Bogdanov, Y. Kivshar, Asymmetric metasurfaces with high-Q resonances governed by bound states in the continuum. *Phys. Rev. Lett.* 121, 193903 (2018).

[26] W. Liu, B. Wang, Y. Zhang, J. Wang, M. Zhao, F. Guan, X. Liu, L. Shi, J. Zi, Circularly polarized states spawning from bound states in the continuum. *Phys. Rev. Lett.* 123, 116104 (2019).

[27] X. Yin, J. Jin, M. Soljačić, C. Peng, B. Zhen, Observation of topologically enabled unidirectional guided resonances. *Nature* 580, 467-471 (2020).

[28] A. Cohen, A. Patsha, P. K. Mohapatra, M. Kazes, K. Ranganathan, L. Houben, D. Oron, A. Ismach, Growth-etch metal-organic chemical vapor deposition approach of $WS_2$ atomic layers. *ACS Nano* 15, 526-538 (2021).

[29] W. Schweika, M. Valldor, P. Lemmens, Approaching the ground state of the Kagomé antiferromagnet. *Phys. Rev. Lett.* 98, 067201 (2007).

[30] T. Ma, G. Shvets, All-Si valley-Hall photonic topological insulator. *New J. Phys.* 18, 025012 (2016).

[31] X.-D. Chen, F.-L. Zhao, M. Chen, J.-W. Dong, Valley-contrasting physics in all-dielectric photonic crystals: Orbital angular momentum and topological propagation. *Phys. Rev. B* 96, 020202 (2017).

[32] F. Lohof, A. Steinhoff, M. Florian, M. Lorke, D. Erben, F. Jahnke, C. Gies, Prospects and limitations of transition metal dichalcogenide laser gain materials. *Nano Lett.* 19, 210-217 (2019).

[33] R. Noguchi, K. Kuroda, K. Yaji, K. Kobayashi, M Sakano, A. Harasawa, T. Kondo, F. Komori, S. Shin, Direct mapping of spin and orbital entangled wave functions under interband spin-orbit coupling of giant Rashba spin-split surface states. *Phys. Rev. B* 95, 041111 (2017).

[34] M. Tokman, Y. Wang, A. Belyanin, Valley entanglement of excitons in monolayers of transition-metal dichalcogenides. *Phys. Rev. B* 92, 075409 (2015).

[35] P. K. Jha, N. Shitrit, X. Ren, Y. Wang, X. Zhang, Spontaneous exciton valley coherence in transition metal dichalcogenide monolayers interfaced with an anisotropic metasurface. *Phys. Rev. Lett.* 121, 116102 (2018).

[36] K. Frischwasser, I. Yulevich, V. Kleiner, E. Hasman, Rashba-like spin degeneracy breaking in coupled thermal antenna lattices. *Opt. Express* 19, 23475 (2011).

[37] C. Z. Ning, What is laser threshold? *IEEE J. Sel. Top. Quantum Electron.* 19, 1503604-1503604 (2013).

What is claimed is:

1. A surface-emitting light source system for generating coherent light having two spin modes, comprising a two-dimensional material exhibiting a direct band gap, and being coupled to a planar heterostructure cavity having an inversion asymmetric core region at least partially surrounded by an inversion symmetric cladding region.

2. The system according to claim 1, wherein said two-dimensional material is coupled to both said core and said cladding regions.

3. The system according to claim 1, wherein said core region and said cladding region have identical atomic lattice structure, and wherein at least said one of said regions comprises structural elements arranged to induce a respective symmetry property.

4. The system according to claim 3, wherein said inversion asymmetric core region comprises anisotropic nanoholes serving as said structural elements, and wherein an orientation of said nanoholes is selected to induce inversion symmetry breaking in said core region.

5. The system according to claim 1, wherein said inversion asymmetric core region comprises anisotropic nanoholes, and wherein an orientation of said nanoholes is selected to induce inversion symmetry breaking in said core region.

6. The system according to claim 1, wherein said heterostructure cavity has a shape of a polygon.

7. The system according to claim 1, wherein said heterostructure cavity is made of a material exhibiting symmetry-protected photonic bound states in the continuum.

8. The system according to claim 1, wherein said heterostructure cavity comprises silicon nitride.

9. The system according to claim 1, wherein said heterostructure cavity has a Kagome lattice.

10. The system according to claim 1, wherein said two-dimensional material is a monolayer of a transition metal dichalcogenide (TMD).

11. The system according to claim 10, wherein said TMD comprises at least one of molybdenum disulfide, tungsten disulfide, molybdenum diselenide, tungsten diselenide, and molybdenum ditelluride.

12. A communication system comprising the system according to claim 1.

13. A quantum teleportation system comprising the system according to claim 1.

14. A quantum cryptography system comprising the system according to claim 1.

15. A quantum computer comprising the system according to claim 1.

16. A material inspection system, comprising the system according to claim 1.

17. A method of generating coherent light having two spin modes, comprising directing to the system according to claim 1 an optical pump beam having a central wavelength within an absorption spectrum of said two-dimensional material, there by generating said coherent light.

18. The method according to claim 17, comprising filtering out one of said spin modes.

19. The method according to claim 17, comprising polarizing said an optical pump beam prior to said directing.

* * * * *